(12) United States Patent
Tanaka et al.

(10) Patent No.: US 11,127,771 B2
(45) Date of Patent: Sep. 21, 2021

(54) SOLID-STATE IMAGING DEVICE, METHOD OF MANUFACTURING THE SAME, AND ELECTRONIC APPARATUS

(71) Applicant: SONY CORPORATION, Tokyo (JP)

(72) Inventors: Yusuke Tanaka, Kanagawa (JP); Toshifumi Wakano, Kanagawa (JP); Keiji Tatani, Kanagawa (JP); Takashi Nagano, Kanagawa (JP); Hayato Iwamoto, Kanagawa (JP); Keiichi Nakazawa, Kumamoto (JP); Tomoyuki Hirano, Kanagawa (JP); Shinpei Yamaguchi, Tokyo (JP); Shunsuke Maruyama, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/169,735

(22) Filed: Oct. 24, 2018

(65) Prior Publication Data
US 2019/0057990 A1 Feb. 21, 2019

Related U.S. Application Data

(63) Continuation of application No. 16/121,418, filed on Sep. 4, 2018, which is a continuation of application
(Continued)

(30) Foreign Application Priority Data

Mar. 11, 2013 (JP) .................... 2013-048404
Jul. 31, 2013 (JP) .................... 2013-159565

(51) Int. Cl.
*H01L 27/148* (2006.01)
*H01L 27/146* (2006.01)

(52) U.S. Cl.
CPC .... *H01L 27/14612* (2013.01); *H01L 27/1461* (2013.01); *H01L 27/1464* (2013.01);
(Continued)

(58) Field of Classification Search
CPC ........... H01L 27/1461; H01L 27/14612; H01L 27/14614; H01L 27/14621;
(Continued)

(56) References Cited

U.S. PATENT DOCUMENTS 3,617,753 A * 11/1971 Kato .................... H01J 29/453
257/443
4,438,455 A * 3/1984 Tabei .................... H01L 27/144
257/E27.127
(Continued)

*Primary Examiner* — Jay C Kim
(74) *Attorney, Agent, or Firm* — Sheridan Ross P.C.

(57) ABSTRACT

Solid-state imaging devices, methods of producing a solid-state imaging device, and electronic apparatuses are provided. More particularly, a solid-state image device includes a silicon substrate, and at least a first photodiode formed in the silicon substrate. The device also includes an epitaxial layer with a first surface adjacent a surface of the silicon substrate, and a transfer transistor with a gate electrode that extends from the at least a first photodiode to a second surface of the epitaxial layer opposite the first surface. In further embodiments, a solid-state imaging device with a plurality of pixels formed in a second semiconductor substrate wherein the pixels are symmetrical with respect to a center point is provided. A floating diffusion is formed in an epitaxial layer, and a plurality of transfer gate electrodes that are each electrically connected to the floating diffusion by one of the transfer gate electrodes is provided.

11 Claims, 47 Drawing Sheets

Related U.S. Application Data

No. 14/772,196, filed as application No. PCT/JP2014/001142 on Mar. 3, 2014, now abandoned.

(52) U.S. Cl.
CPC .. *H01L 27/14614* (2013.01); *H01L 27/14638* (2013.01); *H01L 27/14643* (2013.01); *H01L 27/14689* (2013.01); H01L 27/14621 (2013.01); H01L 27/14627 (2013.01); H01L 27/14641 (2013.01); H01L 27/14647 (2013.01)

(58) Field of Classification Search
CPC ......... H01L 27/14627; H01L 27/14638; H01L 27/1464; H01L 27/14643; H01L 27/14647; H01L 27/14689; H01L 27/14641

See application file for complete search history.

(56) References Cited

U.S. PATENT DOCUMENTS

| | | | | |
|---|---|---|---|---|
| 6,380,572 B1* | | 4/2002 | Pain | H01L 27/14609 257/290 |
| 6,504,194 B1* | | 1/2003 | Miida | H01L 27/14603 257/292 |
| 6,521,920 B2* | | 2/2003 | Abe | H01L 27/14601 257/223 |
| 7,154,137 B2* | | 12/2006 | Nozaki | H01L 27/14632 257/292 |
| 7,160,753 B2* | | 1/2007 | Williams, Jr. | H01L 21/76254 257/E21.568 |
| 7,217,983 B2* | | 5/2007 | Suzuki | H01L 27/14609 257/226 |
| 7,411,233 B2* | | 8/2008 | Chao | H04N 5/3575 257/292 |
| 7,515,187 B2* | | 4/2009 | Suzuki | H01L 27/14634 348/296 |
| 7,572,571 B2* | | 8/2009 | Moon | G03F 7/091 430/290 |
| 7,619,267 B2* | | 11/2009 | Araki | H01L 27/14603 257/233 |
| 7,652,705 B2* | | 1/2010 | Suzuki | H04N 5/335 257/292 |
| 7,812,874 B2* | | 10/2010 | Iwabuchi | H01L 27/14603 348/294 |
| 7,838,956 B2* | | 11/2010 | McCarten | H01L 27/1463 257/447 |
| 7,859,027 B2* | | 12/2010 | Uya | H01L 27/14609 257/228 |
| 7,928,477 B2* | | 4/2011 | Kobayashi | H01L 27/14603 257/225 |
| 8,030,720 B2* | | 10/2011 | Mabuchi | H01L 27/14636 257/431 |
| 8,031,250 B2* | | 10/2011 | Yamashita | H04N 5/361 348/308 |
| 8,039,914 B2* | | 10/2011 | Akiyama | H01L 27/14603 257/432 |
| 8,089,543 B2* | | 1/2012 | Lida | H04N 5/3741 348/308 |
| 8,183,603 B2* | | 5/2012 | Yamaguchi | H01L 27/14685 257/223 |
| 8,223,233 B2* | | 7/2012 | Ota | H04N 5/3559 348/294 |
| 8,368,784 B2* | | 2/2013 | Yamaguchi | H01L 27/14632 348/272 |
| 8,450,728 B2* | | 5/2013 | Yamaguchi | H01L 27/14603 257/40 |
| 8,471,939 B2* | | 6/2013 | Tivarus | H01L 27/14641 348/294 |
| 8,482,646 B2* | | 7/2013 | Watanabe | H01L 27/14609 250/200 |
| 8,493,487 B2* | | 7/2013 | Takada | H01L 27/14603 348/308 |
| 8,525,909 B2* | | 9/2013 | Matsumoto | H01L 27/14643 348/308 |
| 8,564,701 B2* | | 10/2013 | Watanabe | H01L 27/14603 348/294 |
| 8,634,007 B2* | | 1/2014 | Endo | H01L 27/1464 348/294 |
| 8,686,479 B2* | | 4/2014 | Hynecek | H01L 27/14609 257/222 |
| 8,698,934 B2* | | 4/2014 | Hagiwara | H01L 27/14618 348/294 |
| 8,704,927 B2* | | 4/2014 | Mabuchi | H01L 27/14609 348/308 |
| 8,779,544 B2* | | 7/2014 | Yamashita | H01L 27/14603 257/447 |
| 8,836,833 B2* | | 9/2014 | Yamashita | H01L 27/14609 348/294 |
| 8,854,517 B2* | | 10/2014 | Honda | H01L 27/14634 348/308 |
| 8,907,262 B2* | | 12/2014 | Yamaguchi | H01L 27/14689 250/208.1 |
| 8,912,578 B2* | | 12/2014 | Endo | H01L 27/1465 257/225 |
| 8,946,783 B2* | | 2/2015 | Ahn | H01L 27/14818 257/222 |
| 9,006,566 B2* | | 4/2015 | Ihama | H01L 27/14621 136/263 |
| 9,018,688 B2* | | 4/2015 | Yamaguchi | H01L 27/1464 257/292 |
| 9,171,799 B2* | | 10/2015 | Naruse | H01L 23/5226 |
| 9,373,657 B2* | | 6/2016 | Kao | H01L 27/14634 |
| 9,479,717 B2* | | 10/2016 | Hynecek | H04N 5/363 |
| 9,543,356 B2* | | 1/2017 | Gambino | H01L 27/14609 |
| 9,659,991 B2* | | 5/2017 | Kumano | H01L 27/14629 |
| 9,911,772 B2* | | 3/2018 | Togashi | H01L 27/14621 |
| 2007/0210395 A1* | | 9/2007 | Maruyama | H01L 31/022466 257/431 |
| 2009/0166787 A1* | | 7/2009 | Park | H01L 27/14632 257/458 |
| 2009/0303371 A1* | | 12/2009 | Watanabe | H01L 27/14603 348/311 |
| 2010/0187401 A1* | | 7/2010 | Kawahito | H01L 27/14609 250/208.1 |
| 2011/0032405 A1* | | 2/2011 | Nozaki | H01L 27/14603 348/308 |
| 2011/0156104 A1* | | 6/2011 | Yamaguchi | H01L 27/14603 257/222 |
| 2011/0216212 A1* | | 9/2011 | Watanabe | H04N 5/2353 348/222.1 |
| 2011/0234830 A1* | | 9/2011 | Kiyota | H01L 27/14609 348/222.1 |
| 2012/0104465 A1* | | 5/2012 | Kim | H01L 27/14603 257/225 |
| 2013/0009321 A1* | | 1/2013 | Kagawa | H01L 23/53266 257/774 |

* cited by examiner

SOLID-STATE IMAGING DEVICE, METHOD OF MANUFACTURING THE SAME, AND ELECTRONIC APPARATUS

CROSS REFERENCE TO RELATED APPLICATIONS

This application is a continuation of U.S. patent application Ser. No. 16/121,418, filed Sep. 4, 2018, which is a continuation of U.S. patent application Ser. No. 14/772,196, filed Sep. 2, 2015, which claims benefit of PCT Application No. PCT/JP2014/001142 having an international filing date of Mar. 3, 2014, which designated the United States, which PCT application claimed the benefit of Japanese Patent Application No. 2013-159565 filed Jul. 31, 2013, and Japanese Patent Application No. 2013-048404, filed Mar. 11, 2013, the disclosures of which are incorporated herein by reference in their entirety.

TECHNICAL FIELD

The present disclosure relates to a solid-state imaging device and a method of manufacturing the same, and an electronic apparatus. In particular, the present disclosure relates to a solid-state imaging device capable of further improving the amount of saturation charge and sensitivity characteristics, a method of manufacturing the same, and an electronic apparatus.

CROSS REFERENCE TO RELATED APPLICATIONS

This application claims the benefit of Japanese Priority Patent Application JP 2013-159565 filed Jul. 31, 2013 and Japanese Priority Patent Application JP 2013-048404 filed Mar. 11, 2013, the entire contents of which are incorporated herein by reference.

BACKGROUND ART

In the related art, solid-state imaging devices, such as a Charge Coupled Device (CCD) or Complementary Metal Oxide Semiconductor (CMOS) image sensor, are used in electronic apparatuses including an image capture function, such as a digital still camera or a digital video camera.

Generally, in a CMOS image sensor, a technology sharing pixels is often employed in order to maximize the photodiode aperture ratio accompanying increased miniaturization of the pixel size. In this pixel sharing technology, a transistor is shared among a plurality of pixels, and the area of the photodiode is secured by minimizing the area occupied by the elements other than the photodiode in the pixel portion. Then, it is possible to improve, for example, the amount of saturation signal and the sensitivity characteristics of the photodiode by using the pixel sharing technology.

For example, in PTL 1, PTL 2, PTL 3 and PTL 4, the layouts of various pixel portions in a CMOS image sensor in which the pixel sharing technology is applied are disclosed.

CITATION LIST

Patent Literature

PTL 1: Japanese Unexamined Patent Application Publication No. 2010-147965

PTL 2: Japanese Unexamined Patent Application Publication No. 2010-212288

PTL 3: Japanese Unexamined Patent Application Publication No. 2007-115994

PTL 4: Japanese Unexamined Patent Application Publication No. 2011-049446

SUMMARY OF INVENTION

Technical Problem

In a CMOS image sensor of the related art, the transistors necessary for driving the photodiodes and the pixels are formed on the same plane as the silicon substrate, and the sensor is constrained in terms of area in order to secure the characteristics of the lower limits thereof. For example, if the photodiode area is expanded in order to improve the amount of saturation charge and the sensitivity characteristics of the photodiode, because the region of the transistors accompanying this is reduced, random noise caused by the transistors worsens, and the gain of the circuit lowers. On the other hand, when the area of the transistors is secured, the amount of saturation charge and the sensitivity characteristics of the photodiode are lowered. Accordingly, there is demand for improving the amount of saturation signal and the sensitivity characteristics of the photodiode without reducing the area of the transistors.

It is desirable to be able to further improve the amount of saturation charge and the sensitivity characteristics.

Solution to Problem

According to an embodiment of the present disclosure, there is provided a solid-state imaging device with a silicon substrate. At least a first photodiode is formed in the silicon substrate. An epitaxial layer, with a first surface adjacent to a surface of the silicon substrate, and a transfer transistor, with a gate electrode that extends from the at least a first photodiode to a second surface of the epitaxial layer opposite the first surface are also included.

In accordance with further embodiments, the solid state imaging device includes a floating diffusion that is formed in the epitaxial layer and that is in electrical contact with the gate electrode of the transfer transistor.

A plurality of pixel transistors formed on the epitaxial layer can also be included. The plurality of pixel transistors can overlay at least a portion of the silicon substrate in which the at least a first photodiode is formed.

The solid-state imaging device can further include a second photodiode that is formed in the epitaxial layer. The second photodiode can be in electrical contact with the gate electrode of the transfer transistor.

A plurality of photodiodes can be formed in the epitaxial layer. The first photodiode and the photodiodes formed in the epitaxial layer can be in electrical contact with the gate electrode of the transfer transistor. In addition, a plurality of pinning layers can be provided, and the plurality of photodiodes formed in the epitaxial layer can be laminated in a depth direction with the plurality of pinning layers. Moreover, an area of at least one of the plurality of photodiodes formed in the epitaxial layer can have an area in a plane parallel to the first surface of the epitaxial layer that is different than at least one or the other of the plurality of photodiodes formed in the epitaxial layer. The photodiodes formed in the epitaxial layer can overlay at least a portion of the photodiodes formed in the silicon substrate. A floating diffusion can also be included, with at least a portion of the floating diffusion overlaying at least a portion of the first photodiode. The solid-state imaging device can further include a plurality of pixel transistors that are formed on the epitaxial layer and that overlay at least a portion of the first photodiode.

In accordance with further embodiments of the present disclosure, a solid-state imaging device is provided. The solid-state imaging device includes a plurality of pixels, wherein each pixel in the plurality of pixels is formed in a semiconductor substrate, and wherein the pixels are symmetrical with respect to a center point. The solid-state imaging device also includes an epitaxial layer on the semiconductor substrate, and a floating diffusion formed in the epitaxial layer. A plurality of transfer gate electrodes are also provided, with each of the pixels electrically connected to the floating diffusion by one of the transfer gate electrodes.

In accordance with at least some embodiments of the solid-state imaging device, the plurality of pixels are arranged symmetrically about the floating diffusion. The solid-state imaging device can also include a plurality of pixel transistors formed in the epitaxial layer. The plurality of transfer gate electrodes can be arranged symmetrically about the floating diffusion.

In accordance with still further embodiments of the present disclosure, a method of producing a solid-state imaging device is provided. The method includes forming a photodiode in a silicon substrate, and forming an epitaxial layer on the silicon substrate. The method further includes forming an excavated portion by excavating from a surface of the epitaxial layer to the silicon substrate, wherein the excavated portion reaches a p-well surrounding n type regions of the photodiode. In addition, the method includes forming a gate electrode by forming a gate oxide film on an inside surface of the excavated portion.

In accordance with other embodiments, an electronic apparatus is provided that includes an optical system. In addition, an image capture element that includes a solid-state imaging device that receives light from the optical system is provided. A solid-state imaging device of the apparatus includes an on-chip lens, an antireflection film, and a silicon substrate, wherein the antireflection film is connected to the first surface of the silicon substrate, and wherein the on-chip lens is separated from the first surface of the silicon substrate by at least the antireflection film. At least a first photodiode is formed in the silicon substrate. An epitaxial layer with a first surface adjacent a surface of the silicon substrate is also provided. The solid-state imaging device further includes a transfer transistor, wherein a gate electrode of the transfer transistor extends from at least a first photodiode to a second surface of the epitaxial layer opposite the first surface. The apparatus additionally includes a signal processing circuit that receives a signal from the image capture element.

In accordance with still other embodiments of the present disclosure, an electronic apparatus is provided. The apparatus includes an optical system, and an image capture element including a solid-state imaging device that receives light from the optical system. The solid-state imaging device includes a plurality of pixels formed in a semi-conductor substrate, wherein the pixels are symmetrical with respect to a center point. The solid-state imaging device also includes an epitaxial layer on the semiconductor substrate, and a floating diffusion formed in the epitaxial layer. A plurality of transfer gate electrodes is included, with each of the pixels electrically connected to the floating diffusion by one of the transfer gate electrodes. The apparatus further includes a signal processing circuit that receives a signal from the image capture element.

Advantageous Effects of Invention

According to the embodiments of the present disclosure, it is possible to further improve the amount of saturation charge and the sensitivity characteristics.

Additional features and advantages of embodiments of the present disclosure will become more readily apparent from the following description, particularly when taken together with the accompanying drawings.

DESCRIPTION OF EMBODIMENTS

Below, specific embodiments to which the present technology is applied will be described in detail with reference to the diagrams.

Figure 1:
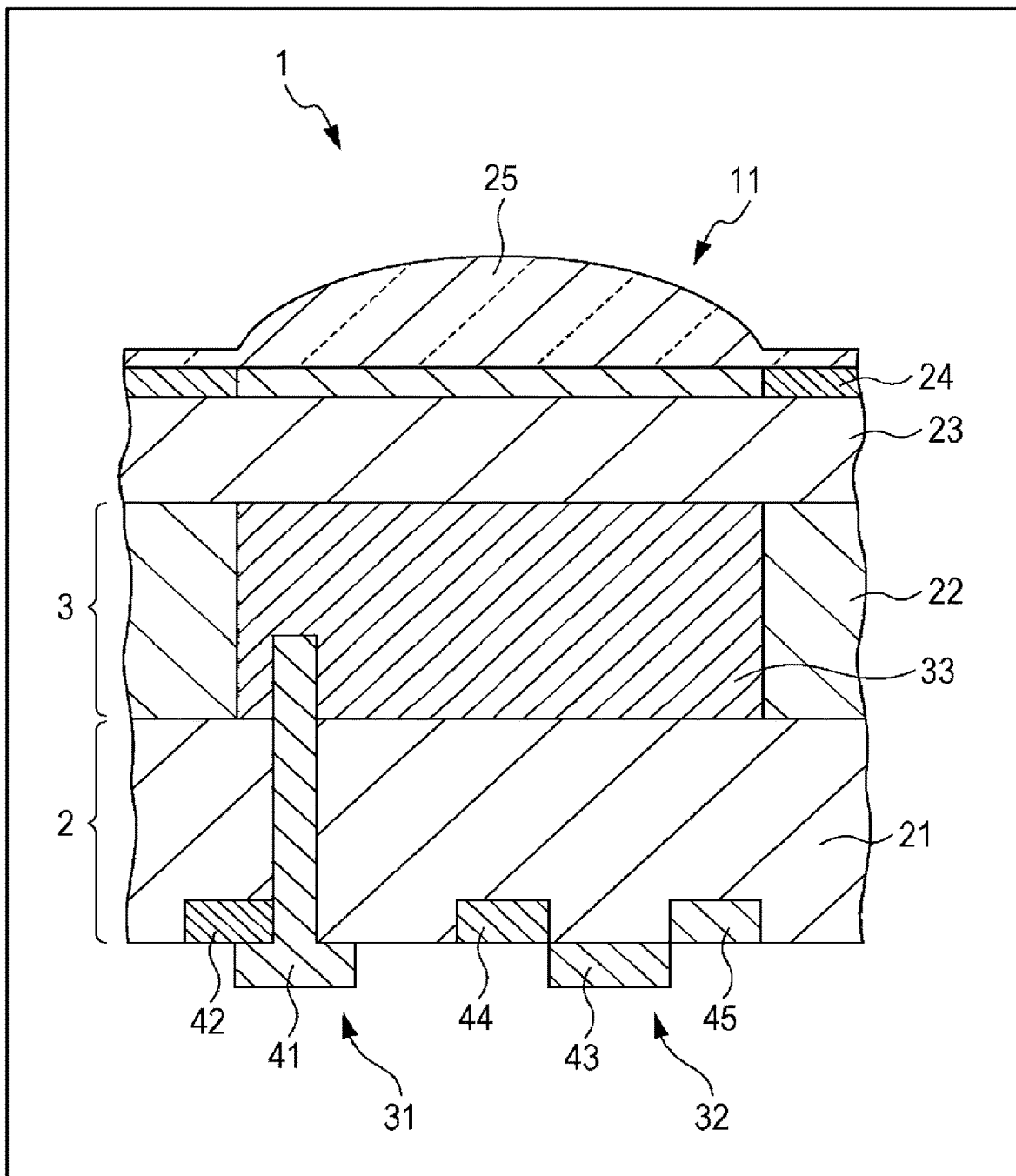
FIG. 1 is a cross-sectional view showing a configuration example of a first embodiment of a pixel having a solid-state imaging device to which the present technology is applied.

FIG. 1 is a cross-sectional view showing a configuration example of a first embodiment of a pixel having a solid-state imaging device to which the present technology is applied. Moreover, in FIG. 1, the upper side of FIG. 1 is set as the rear face side of the solid-state imaging device 1, and the lower side of FIG. 1 is set as the front face side of the solid-state imaging device 1.

As shown in FIG. 1, the solid-state imaging device 1 is formed such that the pixel transistor region 2 and photodiode region 3 are separated in the depth direction (vertical direction in FIG. 1) of the solid-state imaging device 1.

In other words, the solid-state imaging device 1 is configured by layering, in order from the lower side of FIG. 1, a P-type epitaxial layer 21, a silicon substrate 22, an anti-reflection film 23, a color filter layer 24 and an on-chip lens 25. Then, in the solid-state imaging device 1, a pixel transistor 32 is provided on the P-type epitaxial layer 21 for each pixel 11, and a photodiode 33 is provided on the silicon substrate 22. In addition, in the pixel 11, a transfer transistor 31 is provided for transferring a charge from the photodiode 33.

Here, in the pixel transistor 32, transistors other than the transfer transistor 31 are included among the predetermined number of transistors necessary for driving the pixel 11. For example, in a 4-transistor-type configuration, the pixel transistor 32 is an amplification transistor, selection transistor and a reset transistor; in a 3-transistor-type configuration, the pixel transistor 32 is an amplification transistor and a reset transistor. Moreover, in FIG. 1, any One of this predetermined number of transistors is represented and depicted as the pixel transistor 32.

The gate electrode 41 configuring the transfer transistor 31 is formed by being embedded so as to penetrate the P-type epitaxial layer 21 so as to reach from the surface (surface facing upwards in FIG. 1) of the P-type epitaxial layer 21 to the photodiode 33. An N-type region 42 formed on front face side of the P-type epitaxial layer 21 so as to neighbor the gate electrode 41 functions as an FD (floating diffusion) portion. That is, the N-type region 42 is connected to the gate electrode of the amplification transistor via a wiring not shown in the drawings, and a charge transferred from the photodiode 33 via the transfer transistor 31 is accumulated and the accumulated charge applied to the gate electrode of the amplification transistor.

The pixel transistor 32 is configured from the N-type regions 44 and 45 formed on the front face side of the P-type epitaxial layer 21 so as to neighbor the gate electrode 43 laminated on the surface of the P-type epitaxial layer 21 and both sides of the gate electrode 43. Among the N-type regions 44 and 45, one functions as a source of the pixel transistor 32 and the other functions as a drain of the pixel transistor 32. Moreover, the element separation in the P-type epitaxial layer 21 is performed by impurity injection.

The photodiode 33 is formed on the silicon substrate 22, and performs photoelectric conversion by receiving light irradiated toward the rear face (surface facing upper side of FIG. 1) of the solid-state imaging device 1, and generates and accumulates a charge according to the amount of light.

The on-chip lens 25 collects light irradiated to the photodiode 33 for each pixel 11, and the color filter layer 24 is transparent to light in a wavelength region of a specific color (for example, three colors of red, blue and green) for each pixel 11. In addition, the anti-reflection film 23 prevents light passing through the on-chip lens 25 and the color filter layer 24 from reflecting.

In this way, the solid-state imaging device 1 is configured such that the pixel transistor 32 is formed on the P-type epitaxial layer 21 which is a pixel transistor region 2, and a photodiode 33 is formed on the silicon substrate 22 which is the photodiode region 3.

Accordingly, in the solid-state imaging device 1, for example, it is possible to avoid a structure in which the regions forming the pixel transistor 32 are eroded in a portion of the photodiode 33 (refer to FIGS. 3A and 3B described later), and it is possible to avoid decreasing the region of the photodiode 33. That is, by setting the structure of the pixel 11, it is possible to enlarge the area of the photodiode 33 greater than in the related art, and possible to avoid lowering of the amount of saturation charge and the sensitivity characteristics of the photodiode 33, and to further improve these characteristics.

In addition, in the solid-state imaging device 1, it is possible to avoid the generation of differences in the characteristics between the pixels by arranging the transistors asymmetrically, along with being possible to enlarge the area of the transfer transistor 31 and pixel transistor 32.

Here, description will be made by comparison with the structure of a pixel of the related art, with reference to FIG. 2A to FIG. 3B.

Figure 2A:
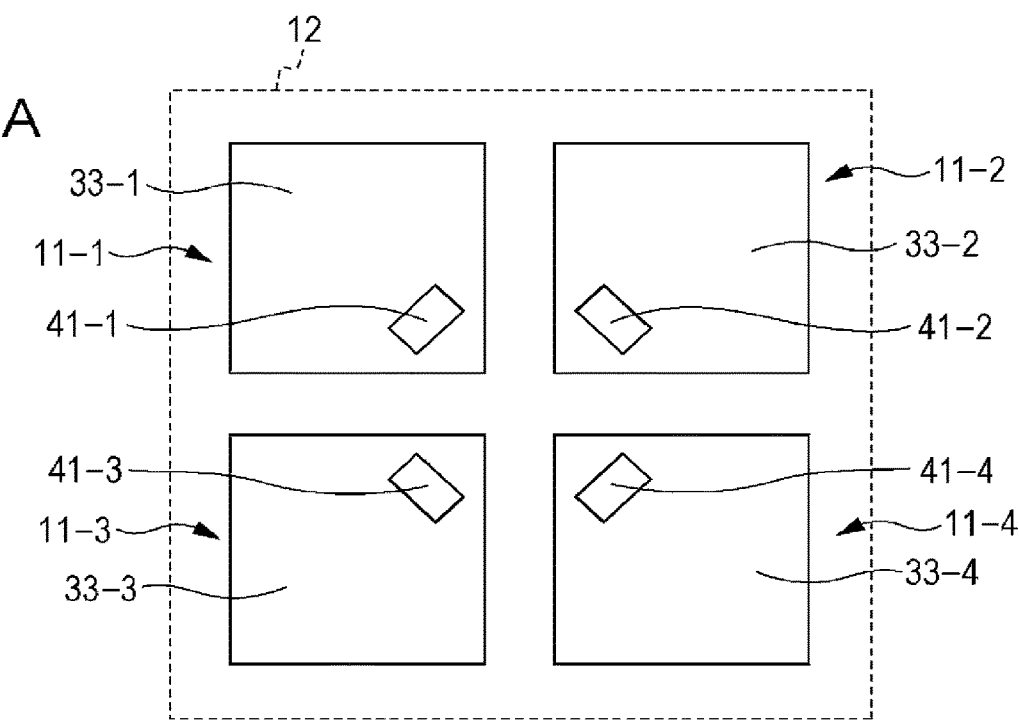
FIG. 2A is a plan view showing a structure of a pixel in which a 4-pixel shared structure is employed.
Figure 2B:
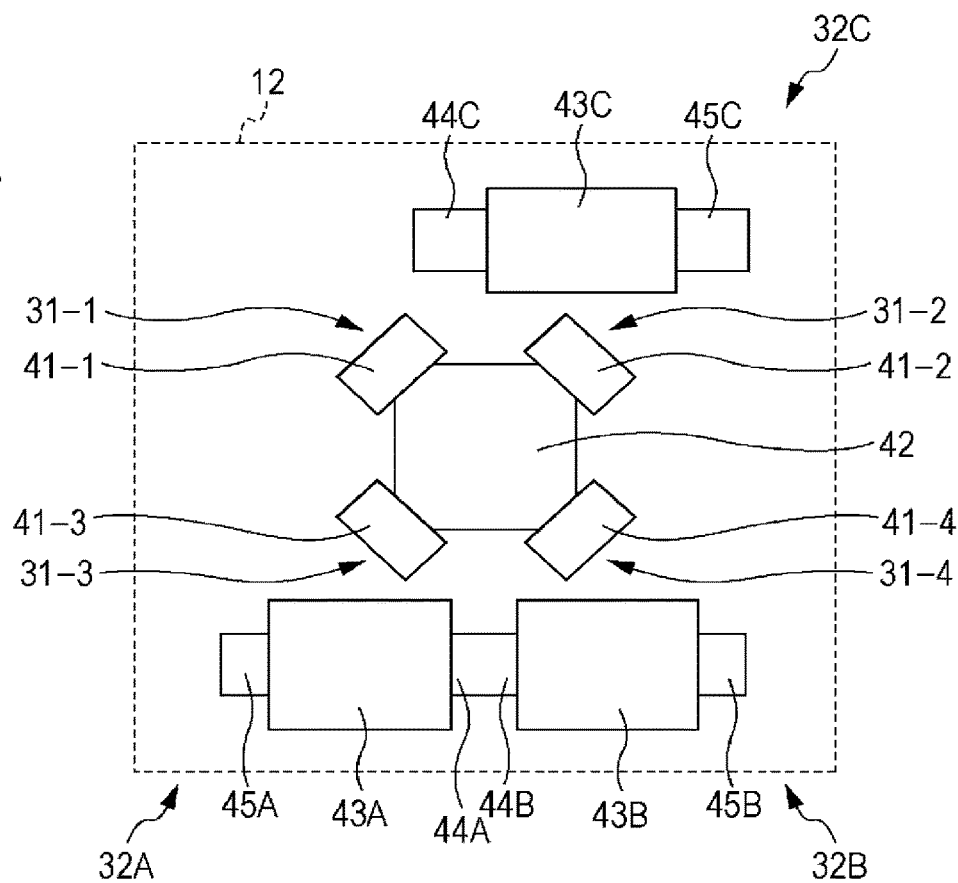
FIG. 2B is a plan view showing a structure of a pixel in which a 4-pixel shared structure is employed.

In FIGS. 2A and 2B, the structure of a pixel 11 to which a 4-pixel shared structure is employed is shown; a planar layout in the photodiode region 3 is shown in FIG. 2A, and a planar layout in the pixel transistor region 2 is shown in FIG. 2B. In addition, in FIGS. 3A and 3B, the structure of a pixel 11' of the related art is shown; a cross-sectional layout of a pixel 11' is shown in FIG. 3A, and a planar layout of a pixel 11' is shown in FIG. 3B.

Figure 3A:
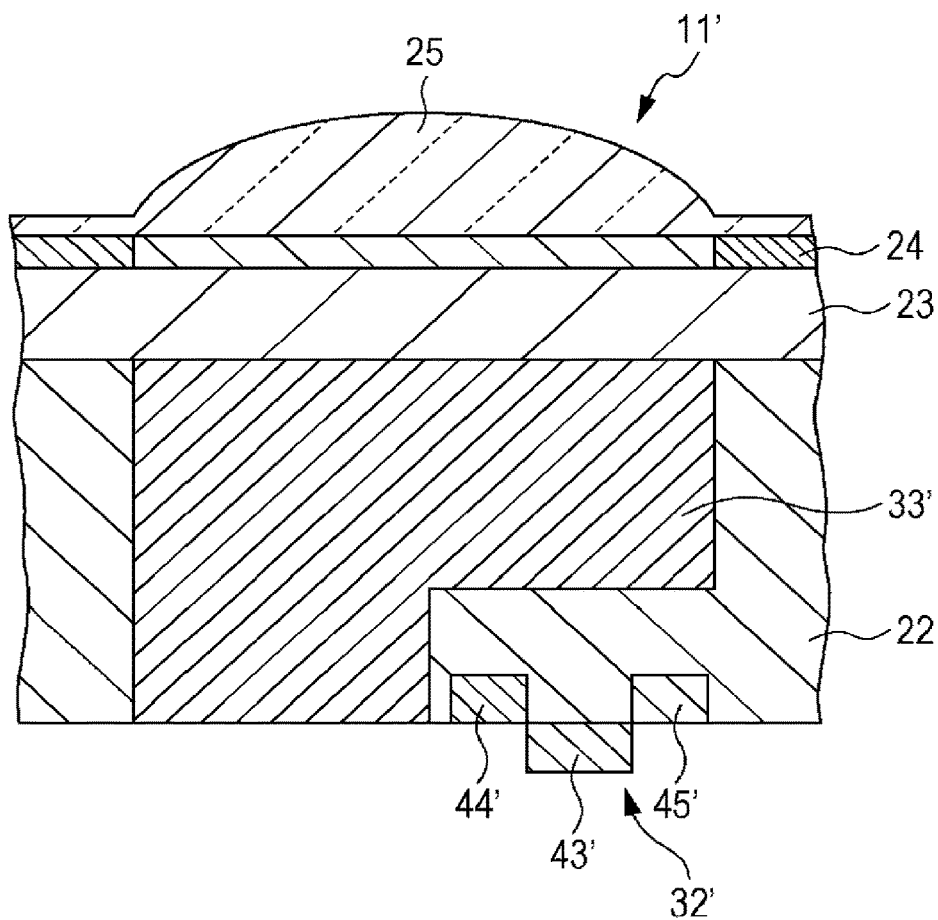
FIG. 3A is a plan view showing a structure of a pixel of the related art.

As shown in FIG. 3A, in a pixel 11' a photodiode 33' and a pixel transistor 32' are formed in the same region, that is, both are formed on the silicon substrate 22. Therefore, in the pixel 11', there is a structure in which the region forming the pixel transistor 32 is eroded at a portion of the photodiode 33'.

In contrast, in the pixel 11, it is possible to enlarge the area of the photodiode 33 greater than the configuration of the pixel 11' by forming the photodiode 33 and the pixel transistor 32 in different regions. In so doing, it is possible to improve the amount of saturation charge and the sensitivity characteristics of the photodiode 33.

Figure 3B:
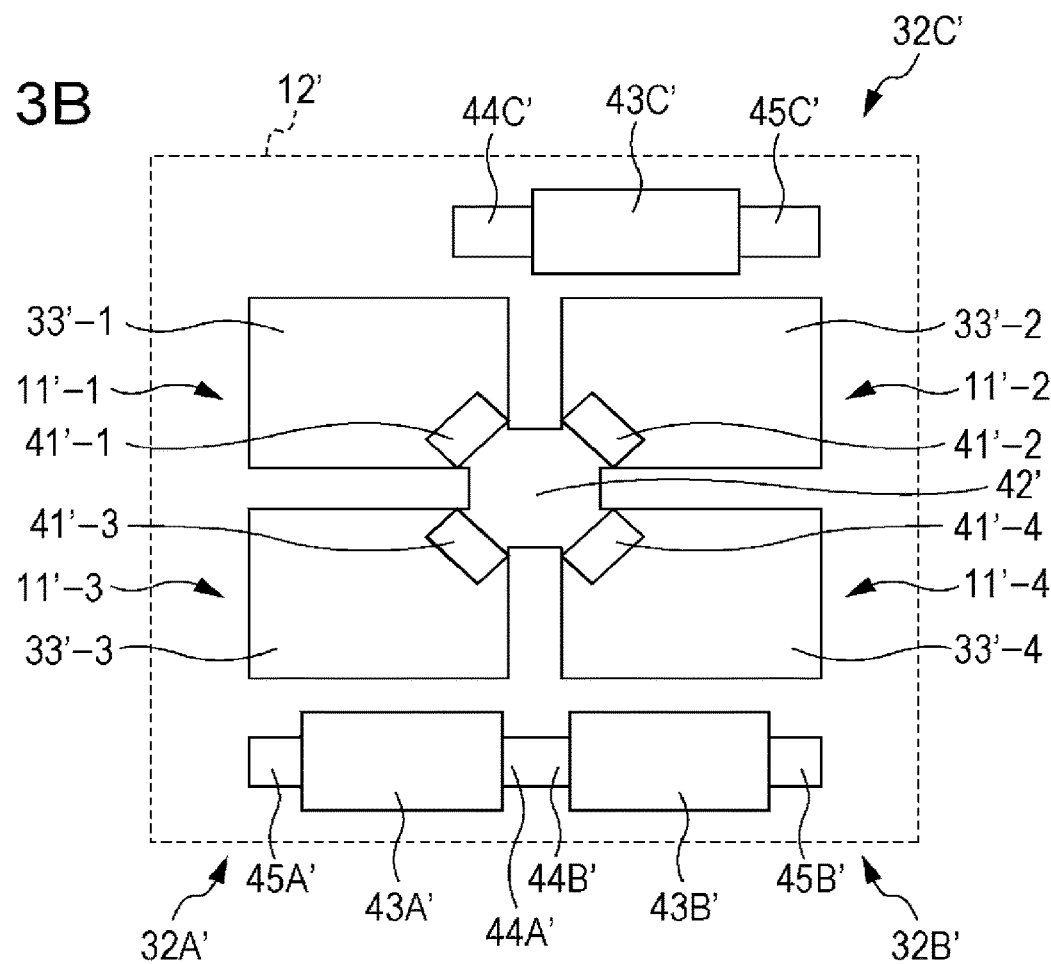
FIG. 3B is a cross-sectional view showing a structure of a pixel of the related art.

In addition, as shown in FIG. 3B, in a shared pixel 12' in which a shared structure using four pixels 11'-1 to 11'-4 is employed, the arrangement of a pixel transistor 32A', a pixel transistor 32B' and pixel transistor 32C' becomes asymmetrical.

Furthermore the pixel transistor 32A', pixel transistor 32B' and pixel transistor 32C' become asymmetrical through differing in their respective uses, and also through differing in the areas thereof. For example, since pixel transistor 32A' and pixel transistor 32B which separate and come into contact have a symmetrical layout, the characteristics of pixel 11'-3 and pixel 11'-4 are substantially the same. However, in the pixel 11'-2 and the pixel 11'-4, since the areas of the pixel transistor 32C' and pixel transistor 32B' which separate and conic into contact are different, influence of reflection due to the gate or potential modulation due to the gate voltage is different, and characteristic differences occur. In addition, the pixel 11' is not influenced due to not neighboring the pixel transistors, and the characteristics of the pixel 11'-2, pixel 11'-3 and pixel 11'-4 become different.

In contrast, as shown in FIG. 2A, in the shared pixel 12 in which a shared structure using four pixels 11-1 to 11-4 is employed, because the pixels 11-1 to 11-4 may be arranged completely symmetrically, it is possible to avoid the occurrence of a difference in the characteristics there between. In so doing, it is possible to improve the characteristics of the pixels 11-1 to 11-4.

Figure 29:
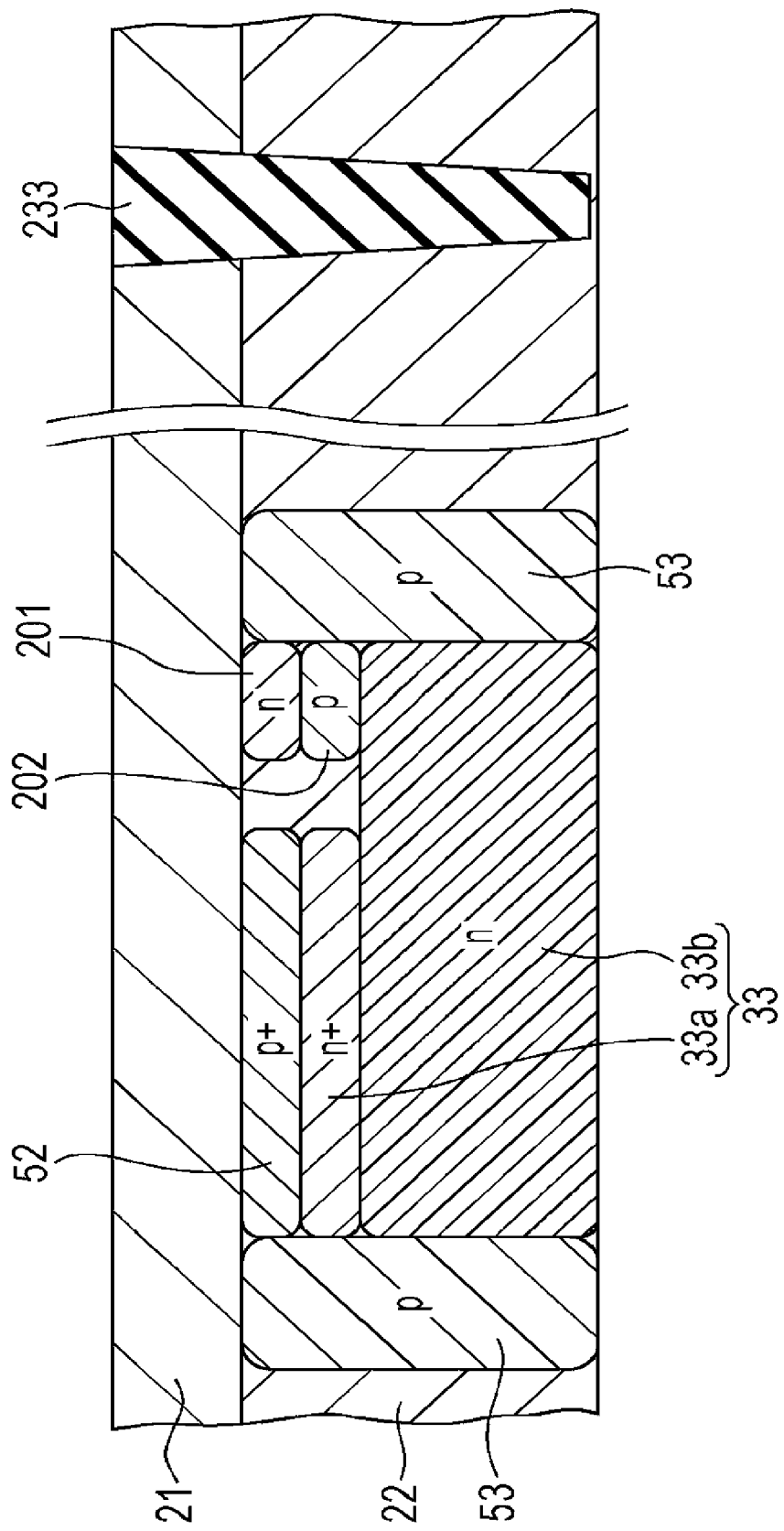
FIG. 29 is a cross-sectional view describing a twenty-fifth step.

In addition, as shown in FIG. 29, in the pixel 11, it is possible to secure an area enabling arranging the pixel transistor 32A, pixel transistor 32B and pixel transistor 32C to be wide, and it is possible to sufficiently secure the ratio between the channel width (W) and the channel length (L). In so doing, it is possible to suppress the occurrence of random noise caused by the pixel transistor 32, and possible to improve the characteristics of the pixels 11-1 to 11-4.

Next, the configuration of the pixel 11 which is a first embodiment will be described in detail with reference to FIG. 4. Moreover, in FIG. 4, the upper side of FIG. 4 is set as the front face side of the solid-state imaging device 1 and the lower side of FIG. 4 is set as the rear face side of the solid-state imaging device 1.

Figure 4:
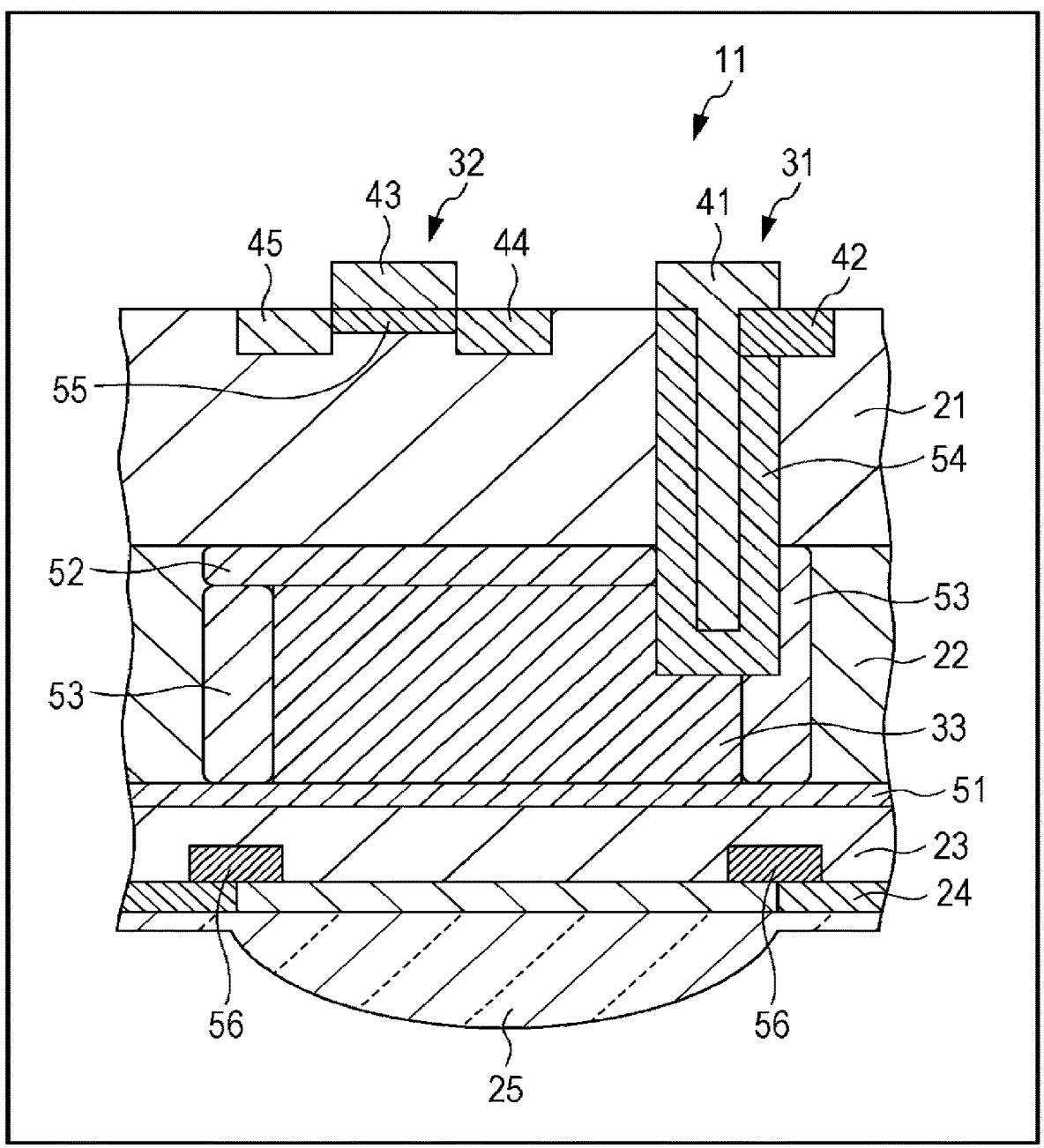
FIG. 4 is a cross-sectional view showing a configuration example of a first embodiment of a pixel.

In FIG. 4, a part of the photodiode 33 which is not shown in the drawings is an N-type region, a rear face pinning layer 51 is formed on the rear face side with respect to the photodiode 33, and a front face pinning layer 52 is formed on the front face side with respect to the photodiode 33. That is, the rear face pinning layer 51 is formed between the silicon substrate 22 and the anti-reflection film 23 so as to contact the rear surface of the photodiode 33 which is an N-type region. In addition, the front face pinning layer 52 is formed on the silicon substrate 22 so as to contact the front face of the photodiode 33 which is an N-type region. Furthermore, a P-well 53 is formed on the silicon substrate 22 so as to surround the side face of the photodiode 33.

In addition, the gate electrode 41 of the transfer transistor 31 is embedded in the P-type epitaxial layer 21 and the silicon substrate 22, and a channel region 54 suppressing the flow of charge from the photodiode 33 is formed so as to surround the embedded part of the gate electrode 41. In addition, a channel region 55 suppressing the flow of charge between the N-type regions 44 and 45 is formed so as to cover the bottom face of the gate electrode 43 of the pixel transistor 32. In addition, a light blocking metal 56 for preventing the incidence of the light from the oblique direction is formed on the anti-reflection film 23.

In this way, in the pixel 11, a pixel transistor 32 is formed on the P-type epitaxial layer 21 and the photodiode 33 and the pixel transistor 32 are formed in different regions in the depth direction, along with the photodiode 33 being formed on the silicon substrate 22. Then, in the pixel 11, a transfer transistor 31 formed such that the gate electrode 41 is embedded is used in the transfer of charge from the photodiode 33.

Accordingly, in the pixel 11, it is possible to improve the amount of saturation charge and the sensitivity characteristics of the photodiode 33 by forming the photodiode 33 and the pixel transistor 32 in different regions, as described above.

Figure 5:
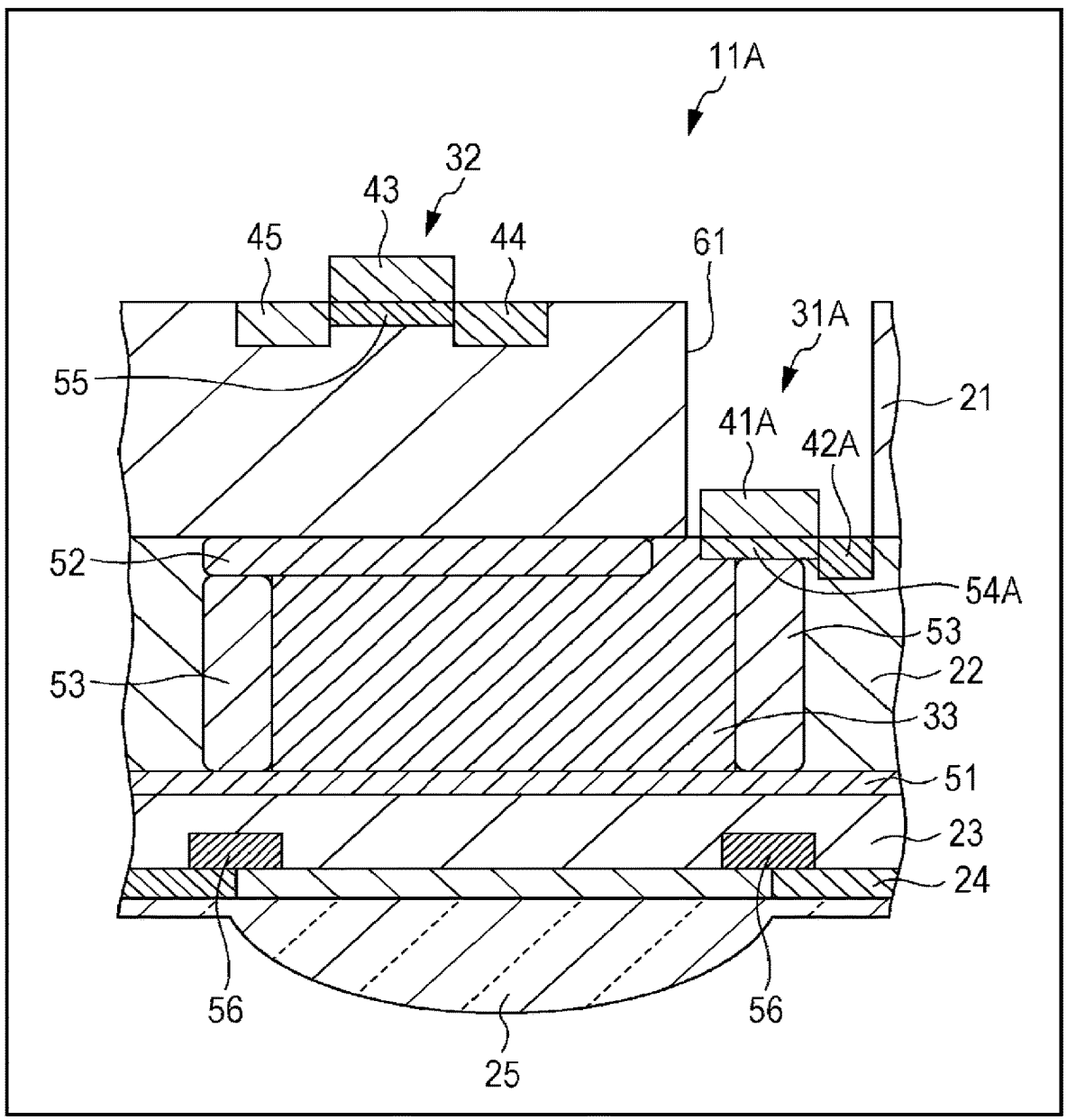
FIG. 5 is a cross-sectional view showing a configuration example of a second embodiment of a pixel.

Next, a cross-sectional view showing a configuration example of a second embodiment of a pixel 11 is shown in FIG. 5. Moreover, in each embodiment below, configurations shared with the pixel 11 in FIG. 4 are given the same reference numbers, and detailed description thereof will not be made.

For example, as shown in FIG. 5, the pixel 11A has a configuration shared with the pixel 11 in FIG. 4 on the point of a photodiode 33 being formed on a silicon substrate 22 and the pixel transistor 32 being formed on the P-type epitaxial layer 21. However, the pixel 11A has a configuration differing from the pixel 11 in FIG. 4 on the point of a transfer transistor 31A being formed by forming an excavated portion 61 in the P-type epitaxial layer 21.

That is, in the pixel 11A, the transfer transistor 31A formed in the excavated portion 61 is used in transferring the charge of the photodiode 33, in contrast to the embedded-type transfer transistor 31 being used in the pixel 11 in FIG. 4.

The transfer transistor 31A is configured having a gate electrode 41A formed so as to be laminated on the bottom face of the excavated portion 61, that is, the surface of the silicon substrate 22, formed by excavating the P-type epitaxial layer 21 until the silicon substrate 22 is exposed. In addition, a channel region 54A is formed on the silicon substrate 22 so as to cover the bottom face of the gate electrode 41A. In addition, the N-type region 42A functioning as an FD portion is formed at a position on the surface of the silicon substrate 22 which is the opposite side with respect to the photodiode 33 so as to neighbor the gate electrode 41A.

In this way, also in the pixel 11A, similarly to the pixel 11 in FIG. 4, it is possible to improve the amount of saturation charge and the sensitivity characteristics of the photodiode 33 by forming the photodiode 33 and the pixel transistor 32 in different regions.

In addition, in the pixel 11A, it is possible to improve the transfer characteristics of the charge by shortening the transfer path from the photodiode 33 to the N-type region 42A (ED portion).

Figure 6:
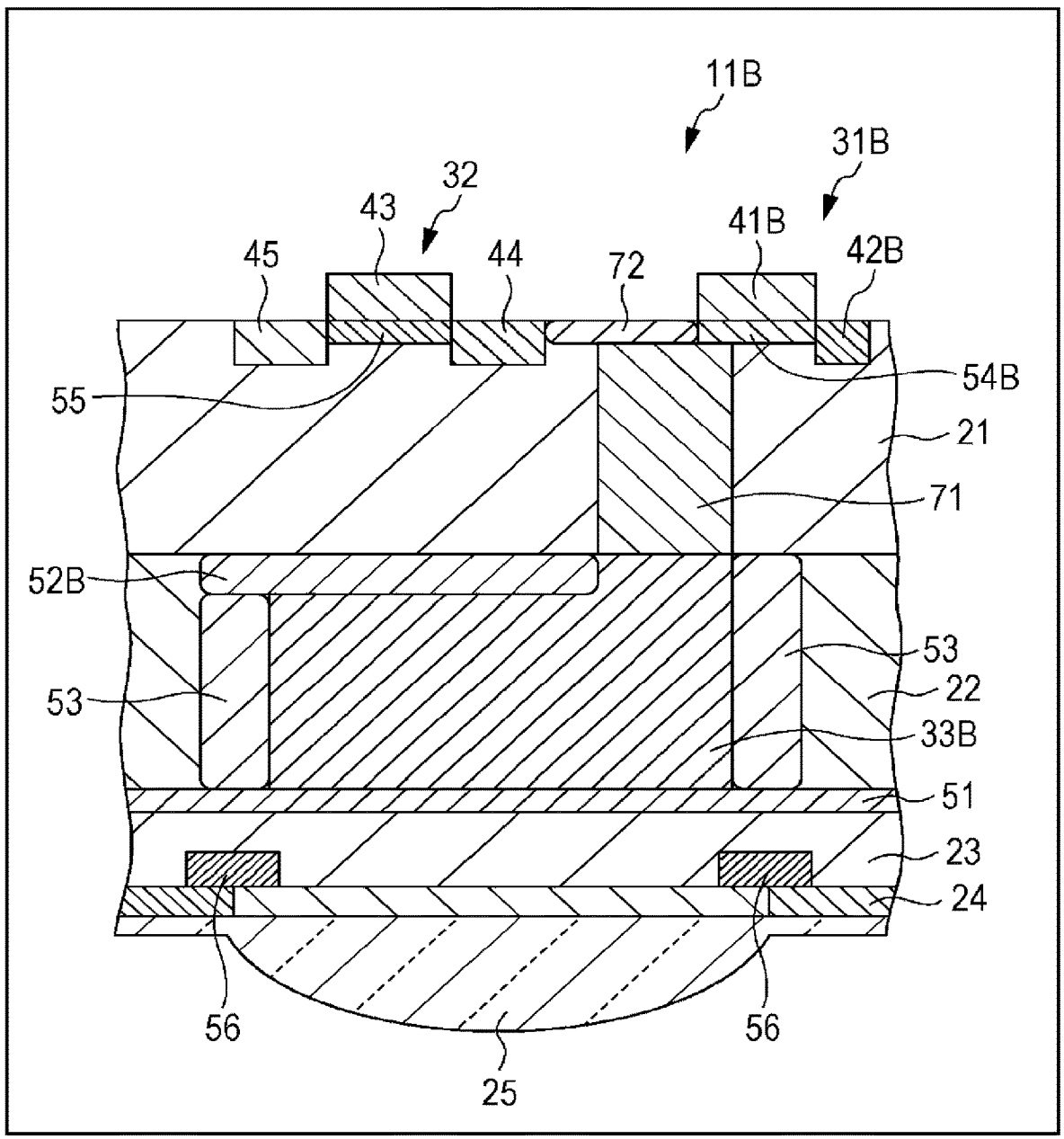
FIG. 6 is a cross-sectional view showing a configuration example of a third embodiment of a pixel.

Next, a cross-sectional view showing a configuration example of a third embodiment of the pixel 11 is shown in FIG. 6.

For example, as shown in FIG. 6, the pixel 11B has a configuration shared with the pixel 11 in FIG. 4 on the point of a photodiode 33B being formed on a silicon substrate 22 and the pixel transistor 32 being formed on the P-type epitaxial layer 21. However, the pixel 11B has a configuration differing from the pixel 11 in FIG. 4 on the point of a transfer transistor 31B being filmed on the surface of the P-type epitaxial layer 21 along with the N-type diffusion layer 71 being formed on the P-type epitaxial layer 21 so as to be connected to the photodiode 33B.

That is, in the pixel 11 in FIG. 4, the charge of the photodiode 33 is transferred using an embedded-type transfer transistor 31. In contrast, in the pixel 11B, the charge is accumulated in the N-type diffusion layer 71 and the photodiode 33B, and the charge of the photodiode 33B is transferred via the N-type diffusion layer 71.

In the pixel 11B, a photodiode 33B and a surface pinning layer 52B are formed such that a portion of the photodiode 33B is exposed in the surface of the silicon substrate 22. Then, the N-type diffusion layer 71 is formed so as to extend in the depth direction of the P-type epitaxial layer 21 and connect to a portion of the photodiode 33B exposed in the surface of the silicon substrate 22. Then, a surface pinning layer 72 is formed on the P-type epitaxial layer 21 that is the front face side of the N-type diffusion layer 71 so as to contact the N-type diffusion layer 71.

The transfer transistor 31B is configured having a gate electrode 41B formed so as to be laminated on the surface of the P-type epitaxial layer 21, and a channel region 549 is formed on the P-type epitaxial layer 21 so as to cover the bottom face of the gate electrode 41B. In addition, the N-type region 42B which functions as an FD portion is is formed at a position on the surface of the P-type epitaxial layer 21 which is the opposite side with respect to the N-type diffusion layer 71 so as to neighbor the gate electrode 41B.

In this way, also in the pixel 119, similarly to the pixel 11 in FIG. 4, it is possible to improve the amount of saturation charge and the sensitivity characteristics of the photodiode 33 by forming the photodiode 33 and the pixel transistor 32 in different regions.

In addition, in the pixel 11B, a PN junction due to the N-type diffusion layer 71 and the surface pinning layer 72 is formed, and the N-type diffusion layer 71 is able to accumulate a charge by performing photoelectric conversion, similarly to the photodiode 33B. In other words, because the total volume of the photodiode performing photo-electric conversion increases, the pixel 11B is more able to increase the amount of saturation charge than the pixel 11 in FIG. 4. In addition, the N-type diffusion layer 71 is able to perform photoelectric conversion of light in the wavelength region of the color red because of being formed in a deep region from the direction in which light is incident on the pixel 11B, and the pixel 11B is able to achieve increases in sensitivity to red light.

Further, the pixel 11B is able to shorten the transfer path from the N-type diffusion layer 71 to the N-type region 42B (FD portion) via the transfer transistor 31B and able to improve the transfer characteristics of the charge.

Figure 7:
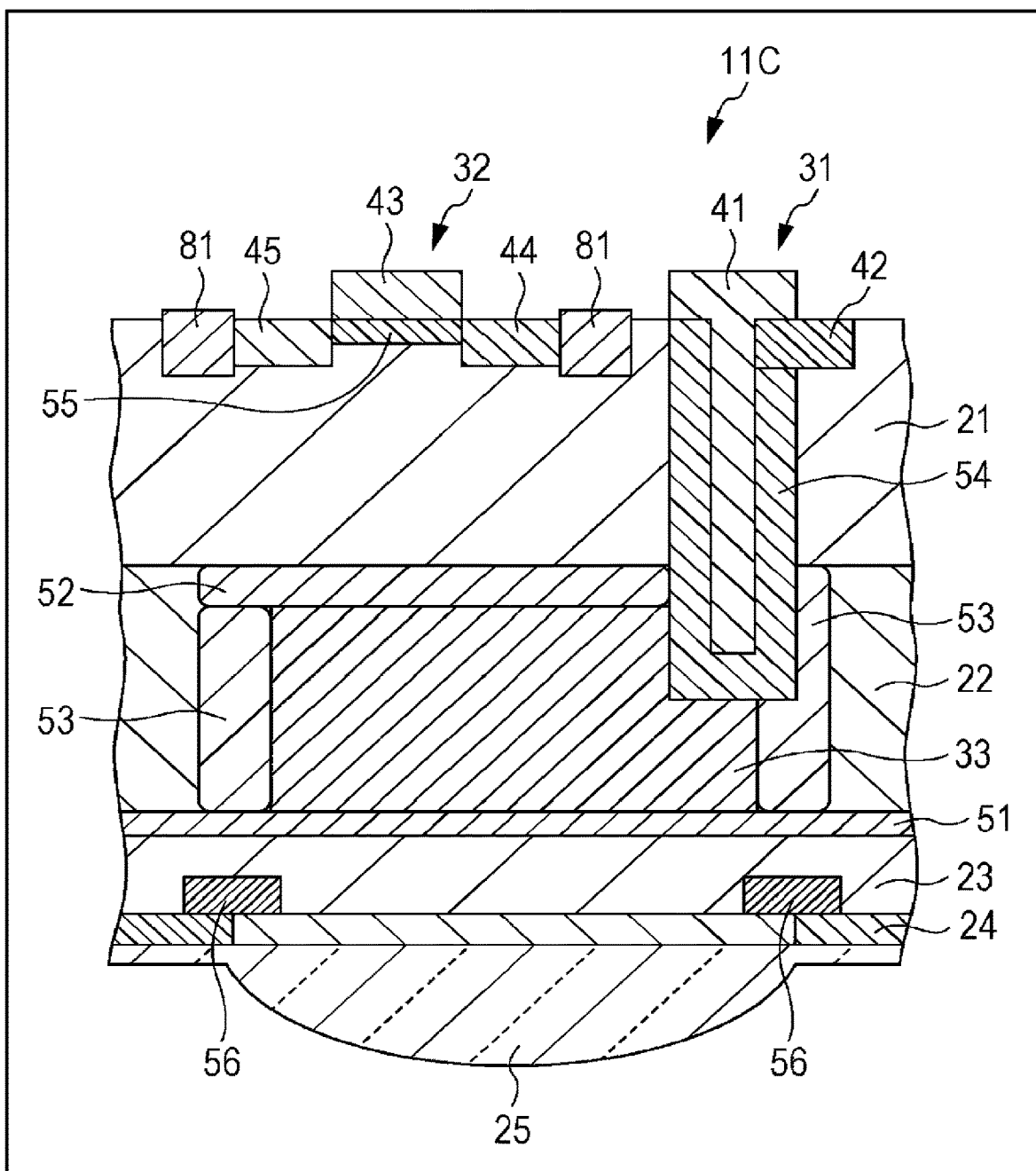
FIG. 7 is a cross-sectional view showing a configuration example of a fourth embodiment of a pixel.

Next, a cross-sectional view showing a configuration example of a fourth embodiment of a pixel 11 is shown in FIG. 7.

For example, as shown in FIG. 7, the pixel 11C has a configuration shared with the pixel 11 in FIG. 4 on the point of a photodiode 33B being formed on a silicon substrate 22 and the pixel transistor 32 being formed on the P-type epitaxial layer 21. However, the pixel 11C has a configuration differing from the pixel 11 in FIG. 4 on the point of an element separation portion 81 being formed on the surface of the P-type epitaxial layer 21.

That is, in the pixel 11C, an element separation portion 81 configured by an oxide film is formed in order to separate the pixel transistor 32 and the N-type region 42B in the P-type epitaxial layer 21. In this way, it is possible to use an oxide film other than an impurity diffusion layer in element separation in the P-type epitaxial layer 21.

Also in the pixel 11C configured in this way, similarly to the pixel 11 in FIG. 4, it is possible to improve the amount of saturation charge and the sensitivity characteristics of the photodiode 33 by forming the photodiode 33 and the pixel transistor 32 in different regions.

Figure 8:
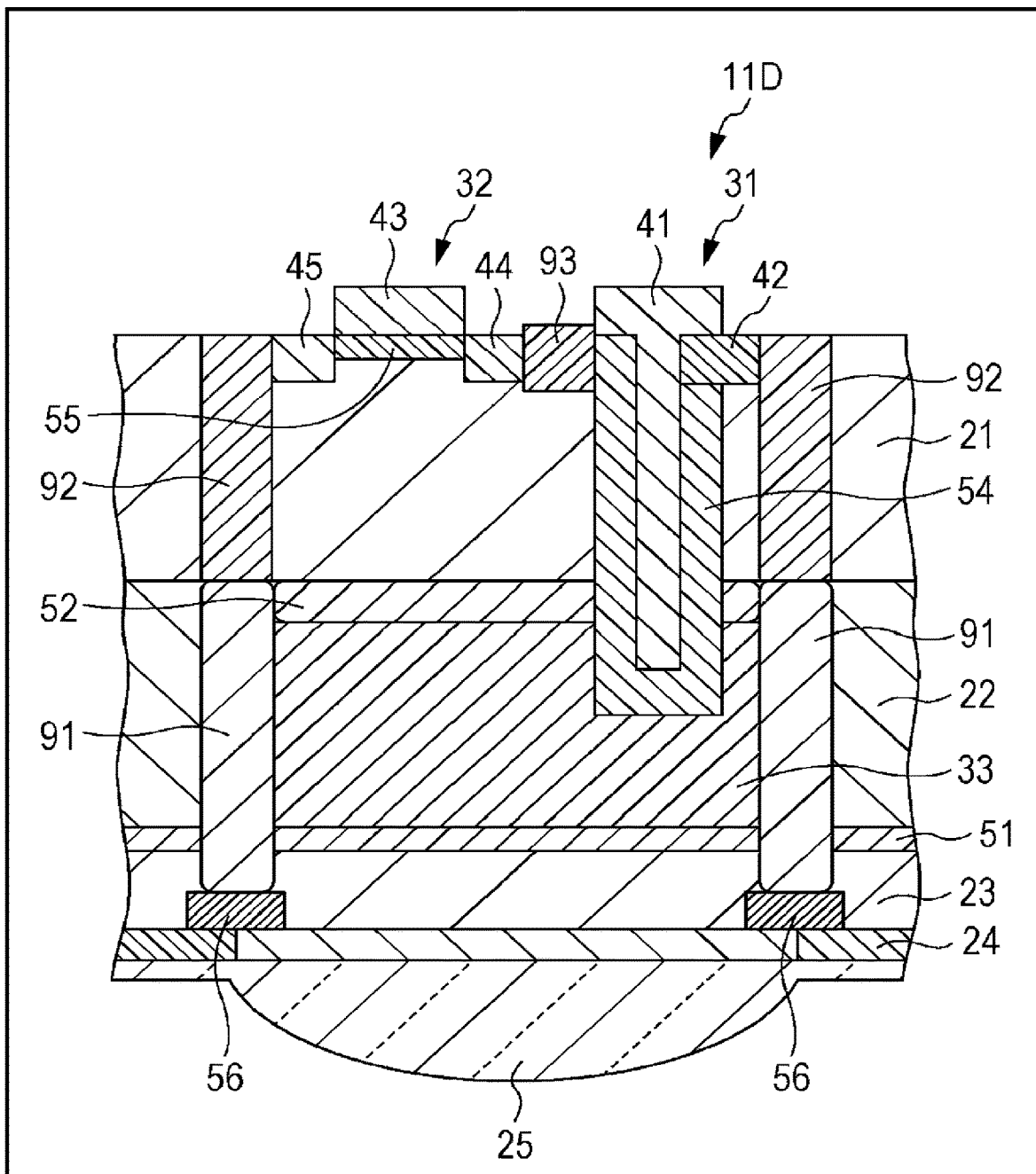
FIG. 8 is a cross-sectional view showing a configuration example of a fifth embodiment of a pixel.

Next, a cross-sectional view showing a configuration example of a fifth embodiment of a pixel 11 is shown in FIG. 8.

For example, as shown in FIG. 8, the pixel 11D has a configuration shared with the pixel 11 in FIG. 4 on the point of a photodiode 33 being formed on a silicon substrate 22 and the pixel transistor 32 being formed on the P-type epitaxial layer 21. However, the pixel 11D has a configuration differing from the pixel 11 of FIG. 4 on the point of an embedded oxide film 91 being formed so as to surround the side face of the photodiode 33, and an oxide film 92 being formed on the P-type epitaxial layer 21 so as to connect to the embedded oxide film 91. In addition, in the pixel 11D, an oxide film 93 for performing element separation is formed between the pixel transistor 32 and the transfer transistor 31.

Also in the pixel 11D configured in this way, similarly to the pixel 11 in FIG. 4, it is possible to improve the amount of saturation charge and the sensitivity characteristics of the photodiode 33 by forming the photodiode 33 and the pixel transistor 32 in different regions.

In addition, in the pixel 11D, it is possible to suppress mixed colors and blooming in the interior of the silicon substrate 22 by embedding the embedded oxide film 91 from the rear face side. Further, in the pixel 11D, it is possible to completely separate the pixel 11D from neighboring pixels by setting a structure in which the embedded oxide film 91 formed on the silicon substrate 22 and the oxide film 92 formed on the P-type epitaxial layer 21 are connected to each other.

In addition, in the pixel 11D, as shown in FIG. 8, the embedded oxide film 91 is formed so as to connect to the light blocking metal 56. In so doing, for example, it is possible to prevent light concentrated by the on-chip lens 25 from leaking to the neighboring pixels 11D. Accordingly, in the pixel 11D, it is possible for the light concentrated by the on-chip lens 25 to be reliably received by the photodiode 33, and possible to improve the sensitivity of the photodiode 33.

Moreover, in the pixel 11D, a metal, such as the same material as the light blocking metal 56, for example, tungsten, may be embedded in the silicon substrate 22 so as to surround the side face of the photodiode 33, instead of the embedded oxide film 91.

Figure 9:
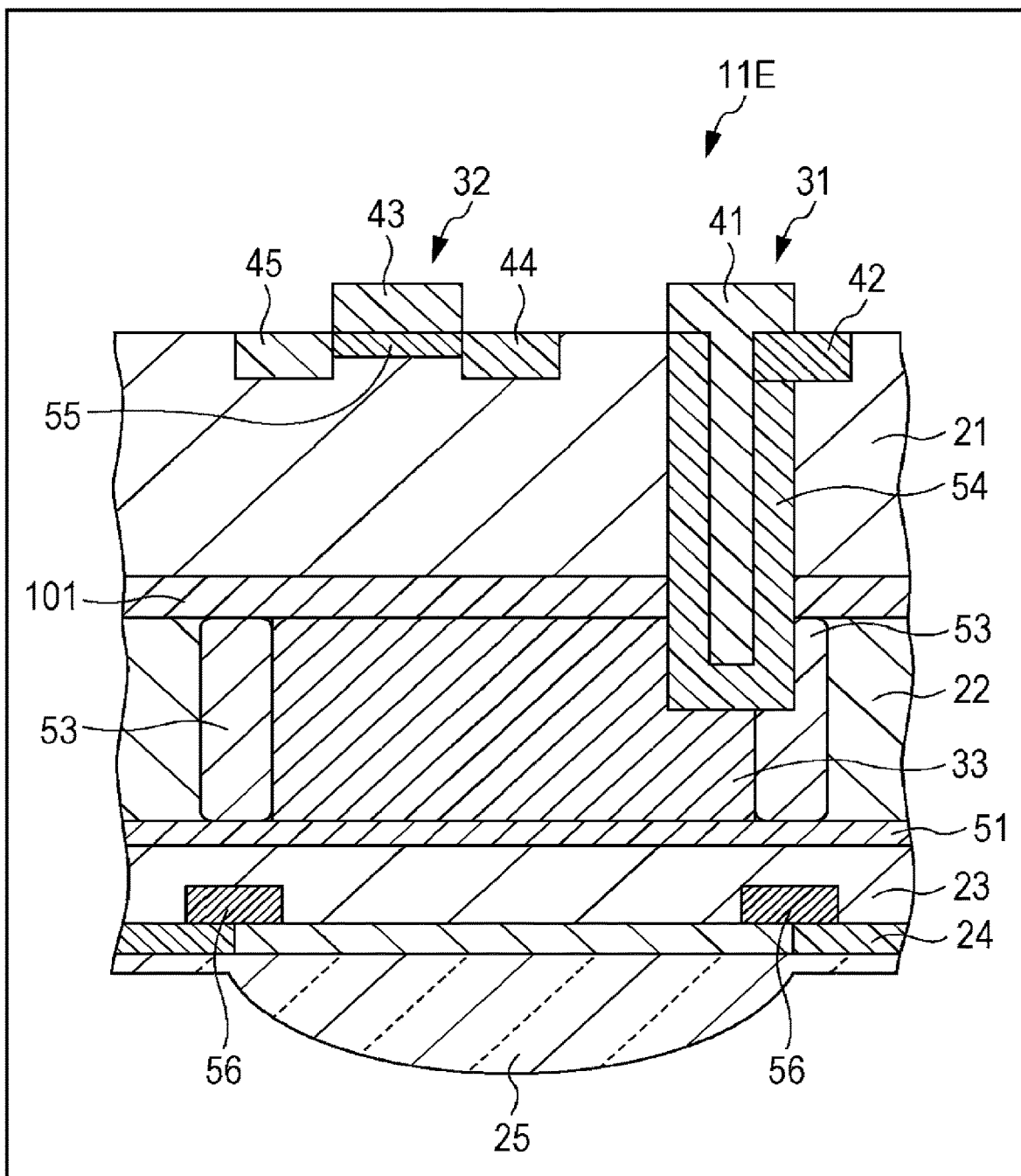
FIG. 9 is a cross-sectional view showing a configuration example of a sixth embodiment of a pixel.

Next, a cross-sectional view showing a configuration example of a sixth embodiment of a pixel 11 is shown in FIG. 9.

For example, as shown in FIG. 9, the pixel 11E has a configuration shared with the pixel 11 in FIG. 4 on the point of a photodiode 33 being formed on a silicon substrate 22 and the pixel transistor 32 being formed on the P-type epitaxial layer 21. However, the pixel 11E has a configuration differing from the pixel 11 in FIG. 4 on the point of a concentrated P-type epitaxial layer 101 being formed so as to be arranged between P-type epitaxial layer 21 and the silicon substrate 22.

That is, in the pixel 11E, instead of forming the surface pinning layer 52 of the pixel 11 in FIG. 4, a concentrated P-type epitaxial layer 101 is formed by performing doping (in situ doped epitaxial deposition) when performing epitaxial growth with respect to the surface of the silicon substrate 22.

For example, heating conditions of approximately 1000 degrees are necessary in order to perform good quality epitaxial growth. Here, in a case in which epitaxial growth is started after the surface pinning layer 52 is formed by performing impurity injection in the silicon substrate 22, it is assumed that impurities in the vicinity of the interface diffuse due to heating during epitaxial growth. In this case, because creating a PN junction in the vicinity of the interface with a sharp profile becomes difficult, the capacitance of the PN junction decreases, and the amount of saturation charge decreases.

In contrast, it is possible to form a P-type epitaxial layer 21 while maintaining a pre-determined sharp profile by forming a concentrated P-type epitaxial layer 101 as in the pixel 11E. Accordingly, in the pixel 11E, it is possible to avoid reduction in the amount of saturation charge.

Figure 10:
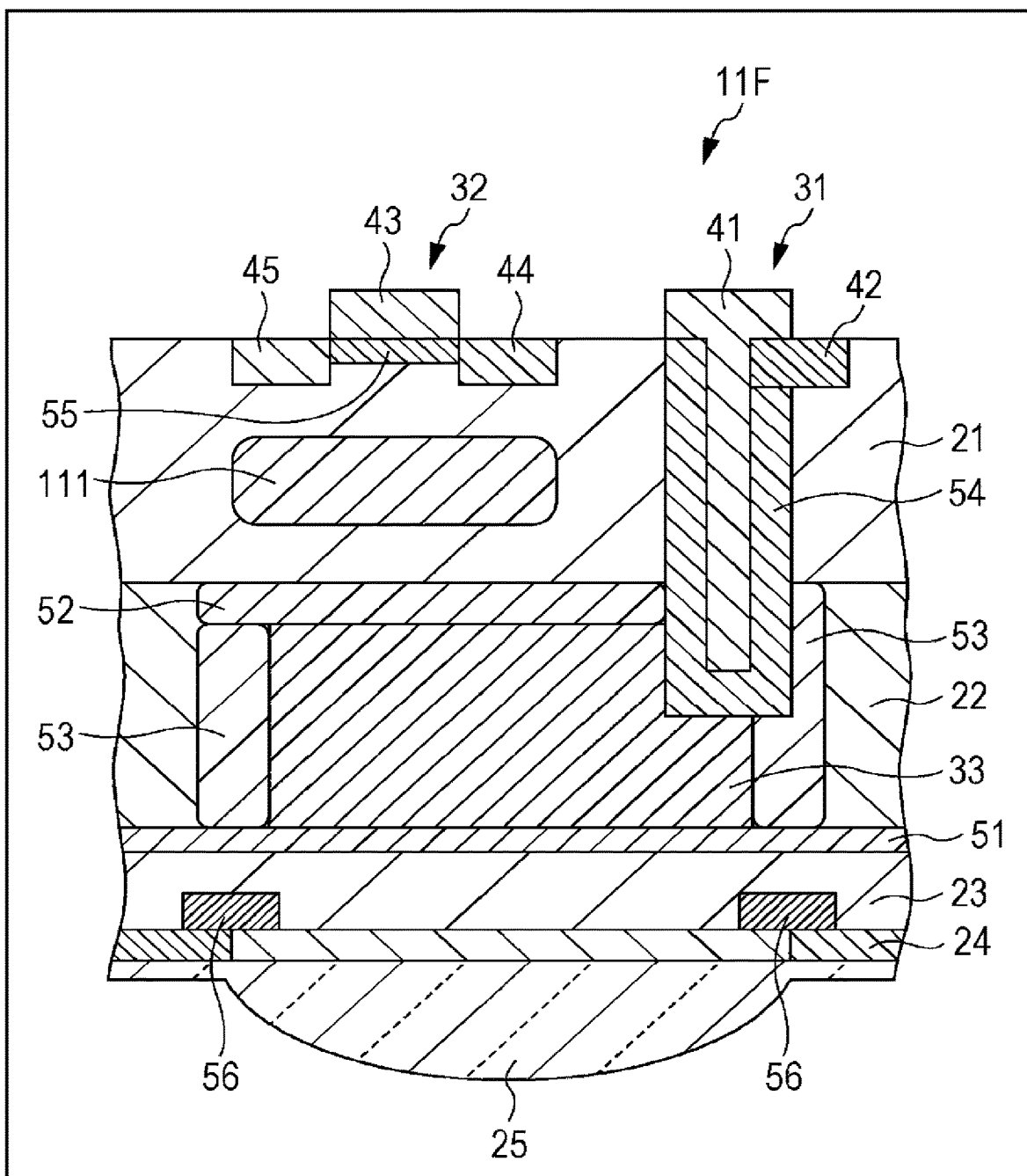
FIG. 10 is a cross-sectional view showing a configuration example of a seventh embodiment of a pixel.

Next, a cross-sectional view showing a configuration example of a seventh embodiment of a pixel 11 is shown in FIG. 10.

For example, as shown in FIG. 10, the pixel 11F has a configuration shared with the pixel 11 in FIG. 4 on the point of a photodiode 33 being formed on a silicon substrate 22 and the pixel transistor 32 being formed on the P-type epitaxial layer 21. However, the pixel 11F has a configuration differing from the pixel 11 in FIG. 4 on the point of, in the P-type epitaxial layer 21, a well 111 which is an impurity region with a higher P-type impurity concentration than the P-type epitaxial layer 21 being formed between the pixel transistor 32 and the photodiode 33.

That is, in the pixel 11F, for example, even in a case in which the impurity concentration of the P-type epitaxial layer 21 is low, it is possible to reliably perform separation of the photodiode 33 and the pixel transistor 32 by forming the well 111. In so doing, for example, it is possible to shorten the distance between the photodiode 33 and the pixel transistor 32, that is, make the thickness of the P-type epitaxial layer 21 thinner, and achieve thinning of the solid-state imaging device 1.

Moreover, if the impurity concentration of the P-type epitaxial layer 21 is high and the concentration enables separation of the photodiode 33 and the pixel transistor 32, formation of the well 111 becomes unnecessary. In addition, the thickness of the P-type epitaxial layer 21 is unrestricted if it is in a region in which the characteristics of the photodiode 33 of the silicon substrate 22 and the pixel transistor 32 of the P-type epitaxial layer 21 do not interfere.

Next, an example of a method of manufacturing a solid-state imaging device 1 having the pixel 11 will be described with reference to FIG. 11 to FIG. 22.

Figure 11:
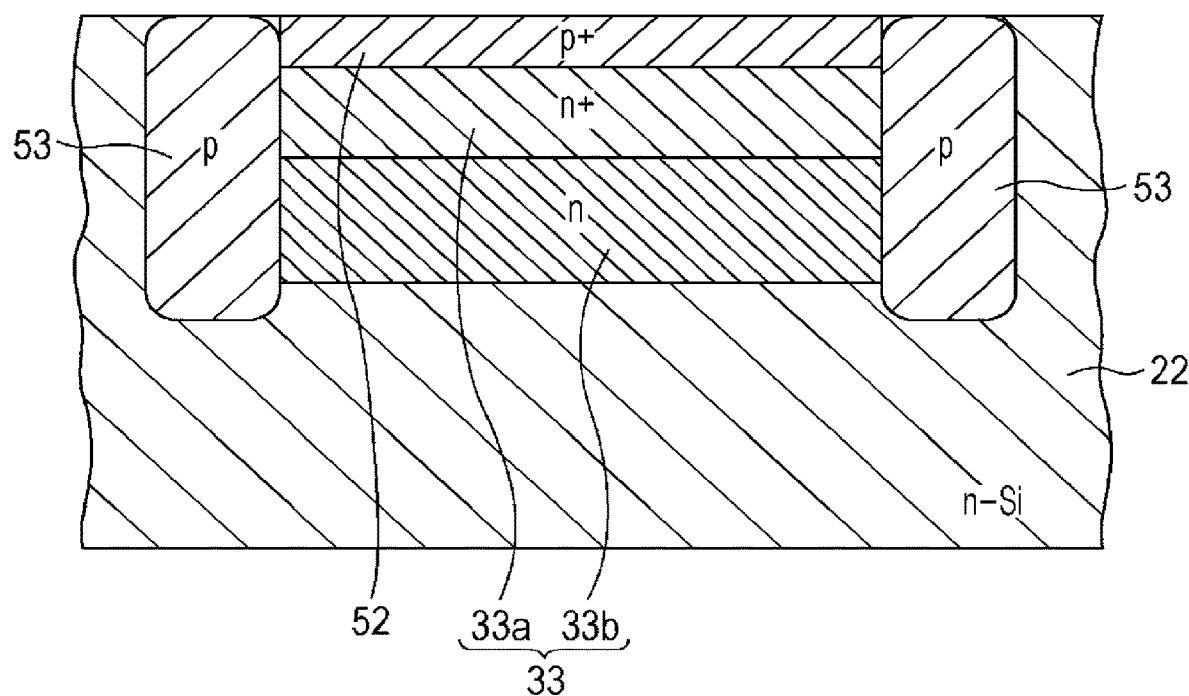
FIG. 11 is a cross-sectional view describing a first step.

As shown in FIG. 11, in a first step, a photodiode 33 is formed with respect to an n-type silicon substrate 22 (n-Si). In other words, an N-type region 33b (n) is formed inside the silicon substrate 22 by injecting n-type impurities in the silicon substrate 22, and an N-type region 33a (n+) with a higher impurity concentration than the N-type region 33b is formed further to the front face side than the N-type region 33b. Then, a photodiode 33 is formed by forming a surface pinning layer 52 (p+) on the surface of the silicon substrate 22 by injecting concentrated p-type impurities in the silicon substrate 22. In addition, a P-well 53 (p) which is a separation layer is formed so as to surround the N-type regions 33a and 33b, along with the side face of the surface pinning layer 52, by injecting p-type impurities in the silicon substrate 22.

Figure 12:
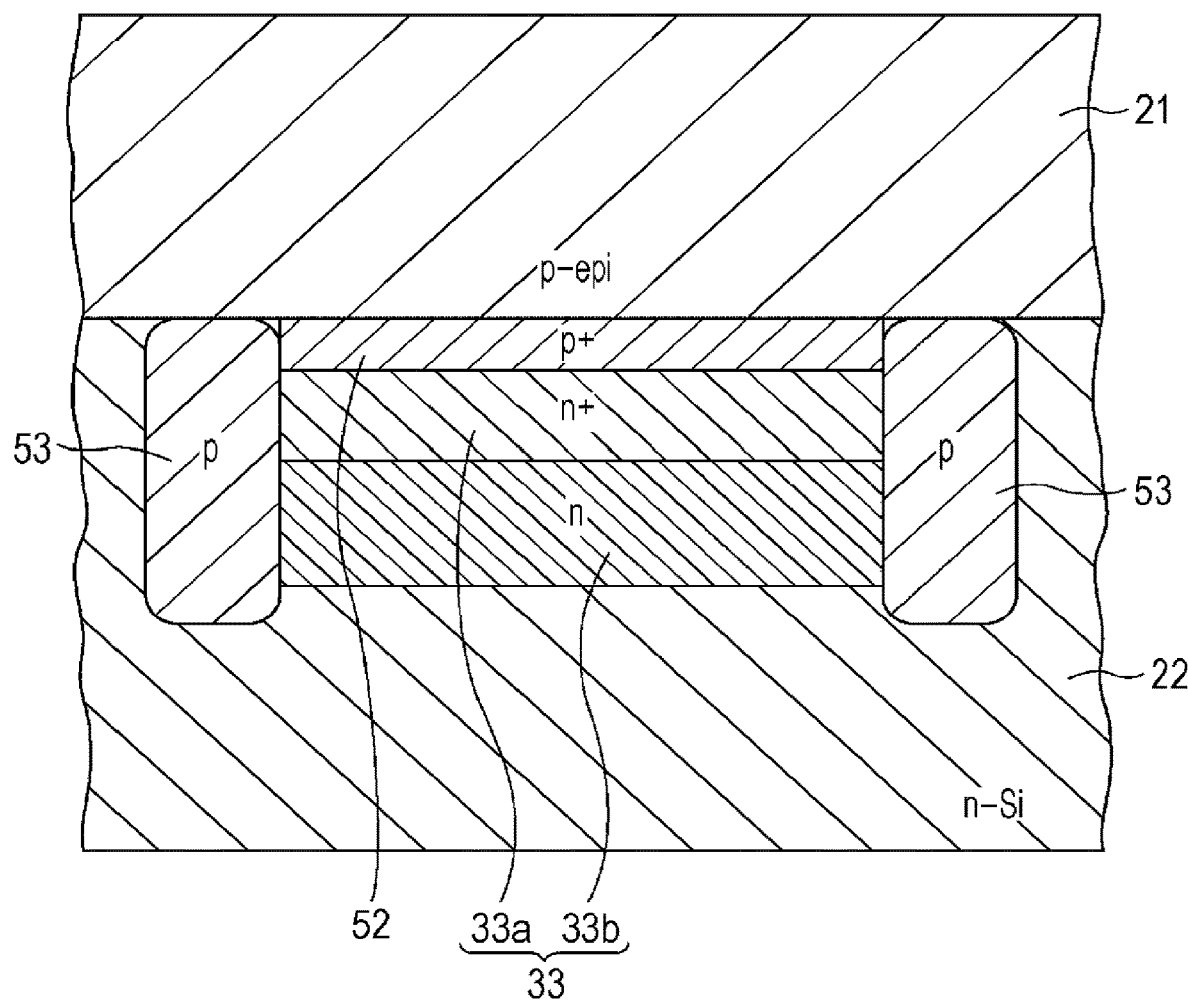
FIG. 12 is a cross-sectional view describing a second step.

As shown in FIG. 12, in the second step, a P-type epitaxial layer 21 (p-epi) is formed by performing epitaxial growth in which a thin film of a single crystal in which the crystal orientation is aligned on the silicon substrate 22 is grown.

Figure 13:
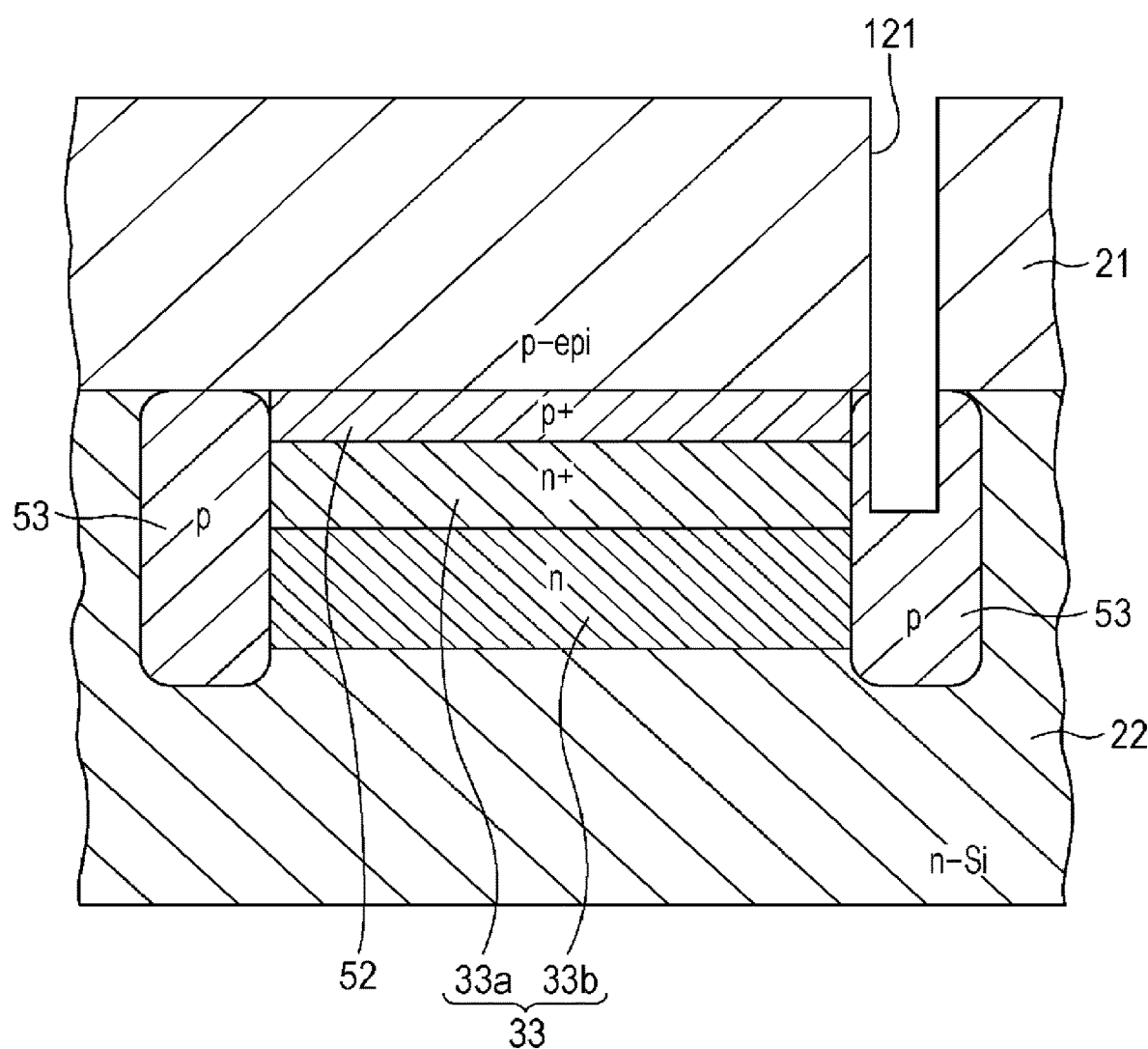
FIG. 13 is a cross-sectional view describing a third step.

As shown in FIG. 13, in the third step, in order to form an embedded-type gate electrode 41 (FIG. 4), an excavated portion 121 is formed by excavating from the surface of the P-type epitaxial layer 21 to the silicon substrate 22. Here, the excavated portion 121 is excavated such that the channel region 54 formed on the side face of the gate electrode 41 reaches the P-well 53 at a position so as to contact the photodiode 33.

Figure 14:
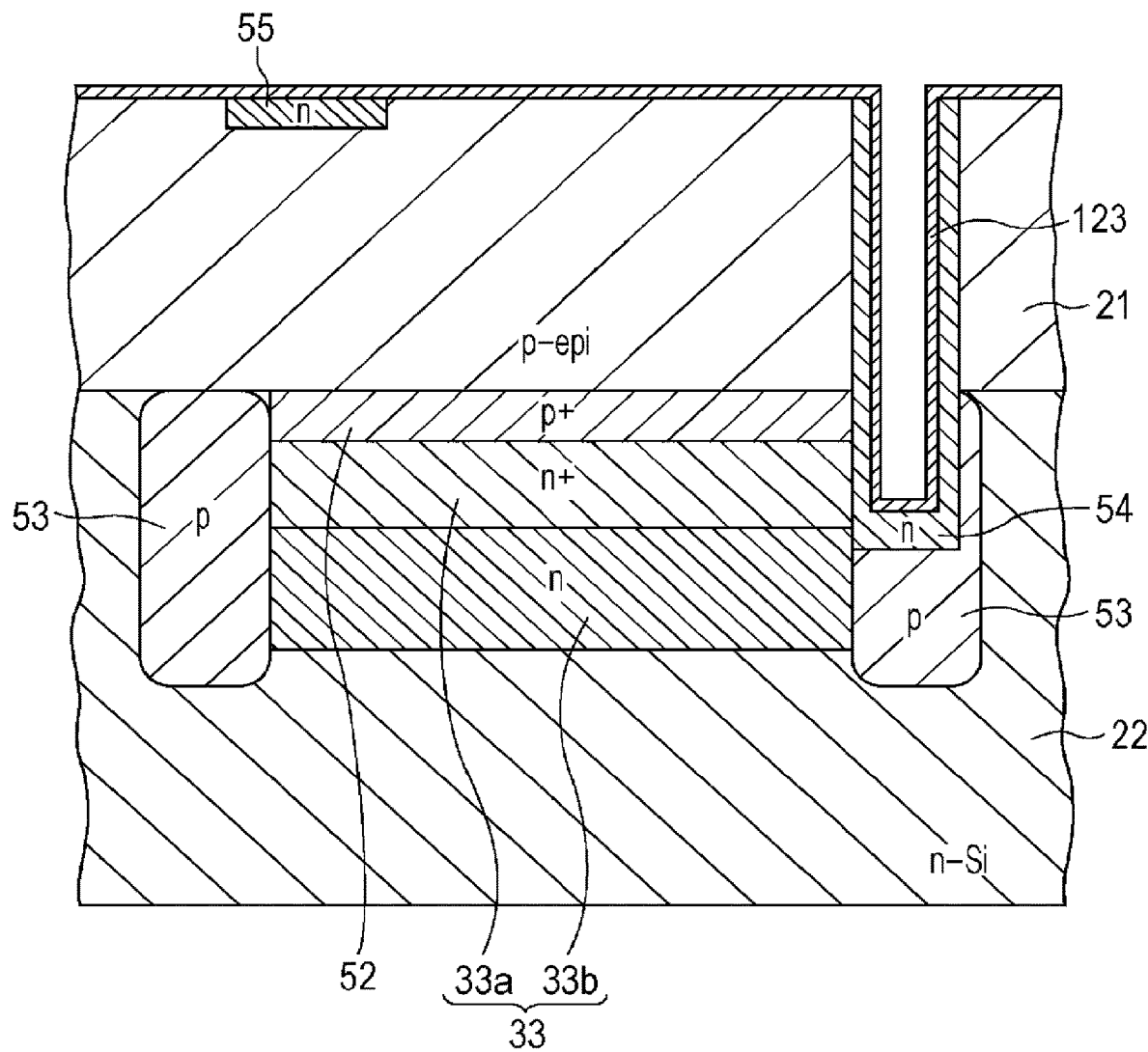
FIG. 14 is a cross-sectional view describing a fourth step.

As shown in FIG. 14, in the fourth step, the channel region 54 and the channel region 55 is formed by injecting n-type impurities in the P-type epitaxial layer 21. Then, a gate oxide film 123 is formed on the surface of the P-type epitaxial layer 21 and on the inside surface of the excavated portion 121.

Figure 15:
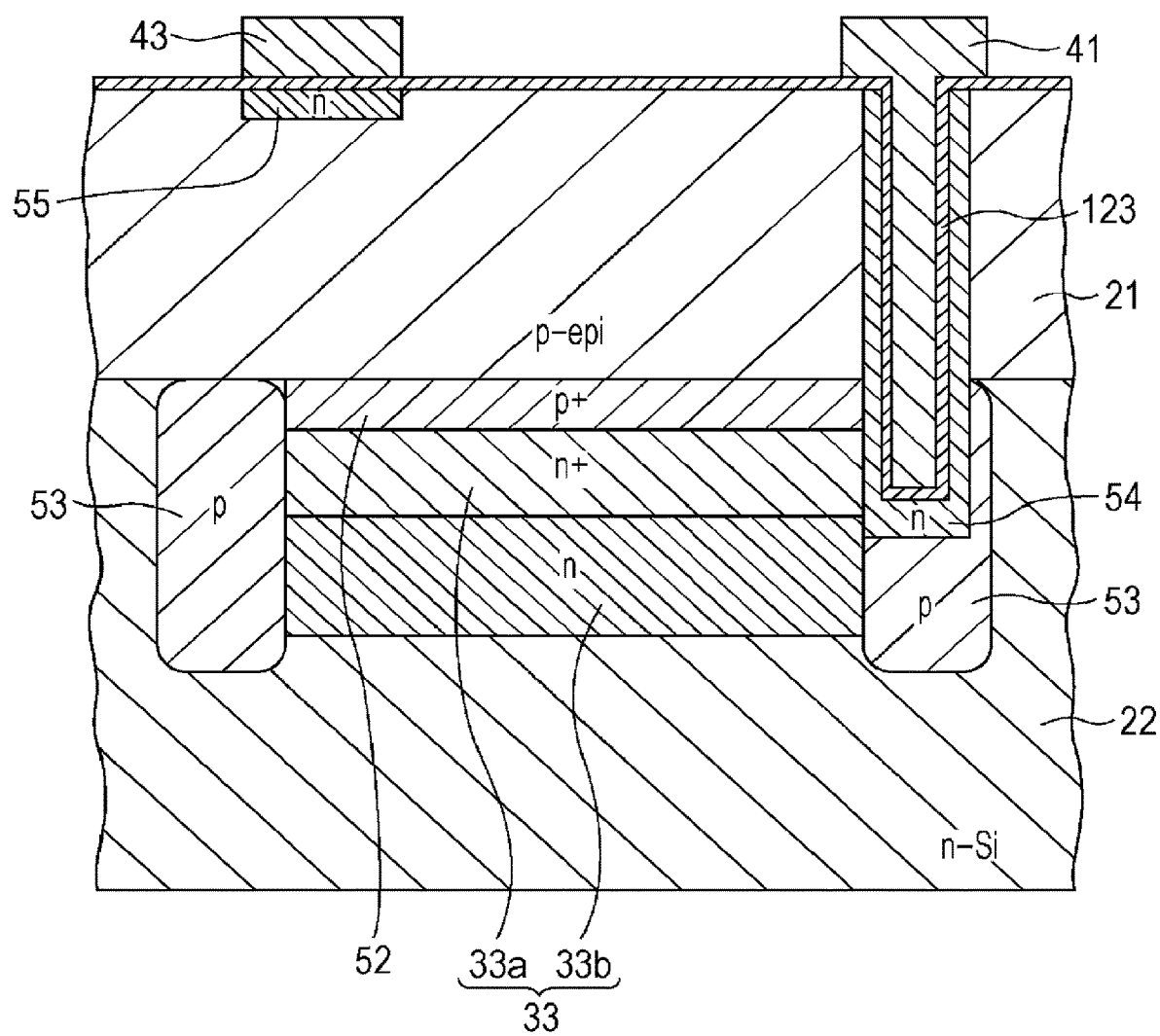
FIG. 15 is a cross-sectional view describing a fifth step.

As shown in FIG. 15, in the fifth step, a gate electrode 41 configuring the transfer transistor 31 and a gate electrode 43 configuring the pixel transistor 32 are formed.

Figure 16:
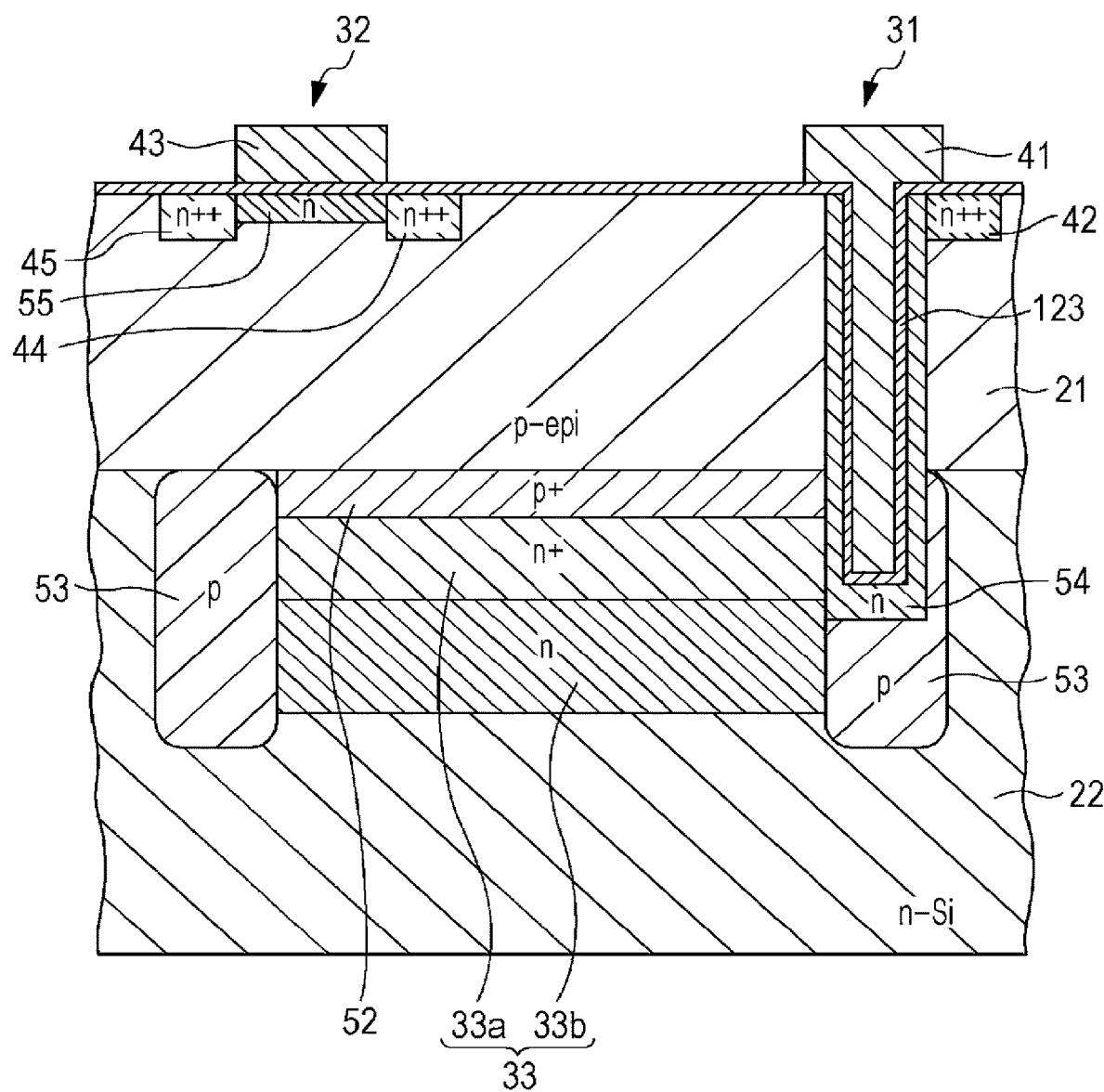
FIG. 16 is a cross-sectional view describing a sixth step.

As shown in FIG. 16, in the sixth step, an N-type region 42 (n++) functioning as an FD portion is formed by injecting concentrated n-type impurities in a location neighboring the gate electrode 41 of the P-type epitaxial layer 21. At the same time, a pixel transistor 32 is formed by forming N-type regions 44 and 45 (n++) by concentrated injecting n-type impurities in locations on both sides neighboring the gate electrode 43 of the P-type epitaxial layer 21.

Figure 17:
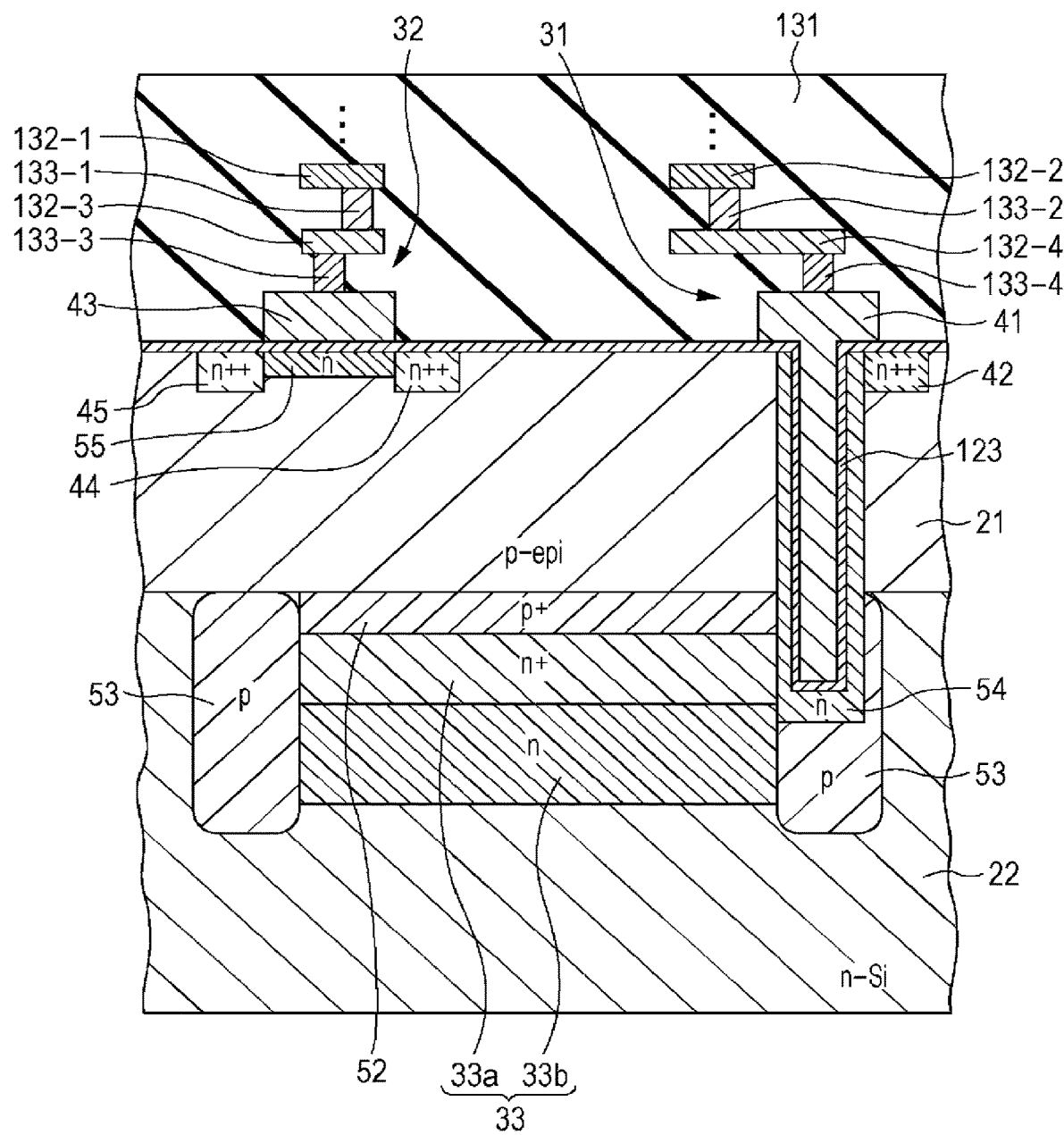
FIG. 17 is a cross-sectional view describing a seventh step.

As shown in FIG. 17, in the seventh step, a wiring layer 131 is formed on the P-type epitaxial layer 21. On the wiring layer 131, for example, wirings 132-1 to 132-4 arranged in multiple layers are formed, as shown in the drawing. Then, contact portions 133-1 to 133-4 are formed so as to respectively connect to the gate electrode 43 and gate electrode 41, along with the wirings 132-1 to 132-4. Moreover, up to this step, the front face of the silicon substrate 22 is faced upward, and the processing is performed with respect to the front face side of the silicon substrate 22.

Figure 18:
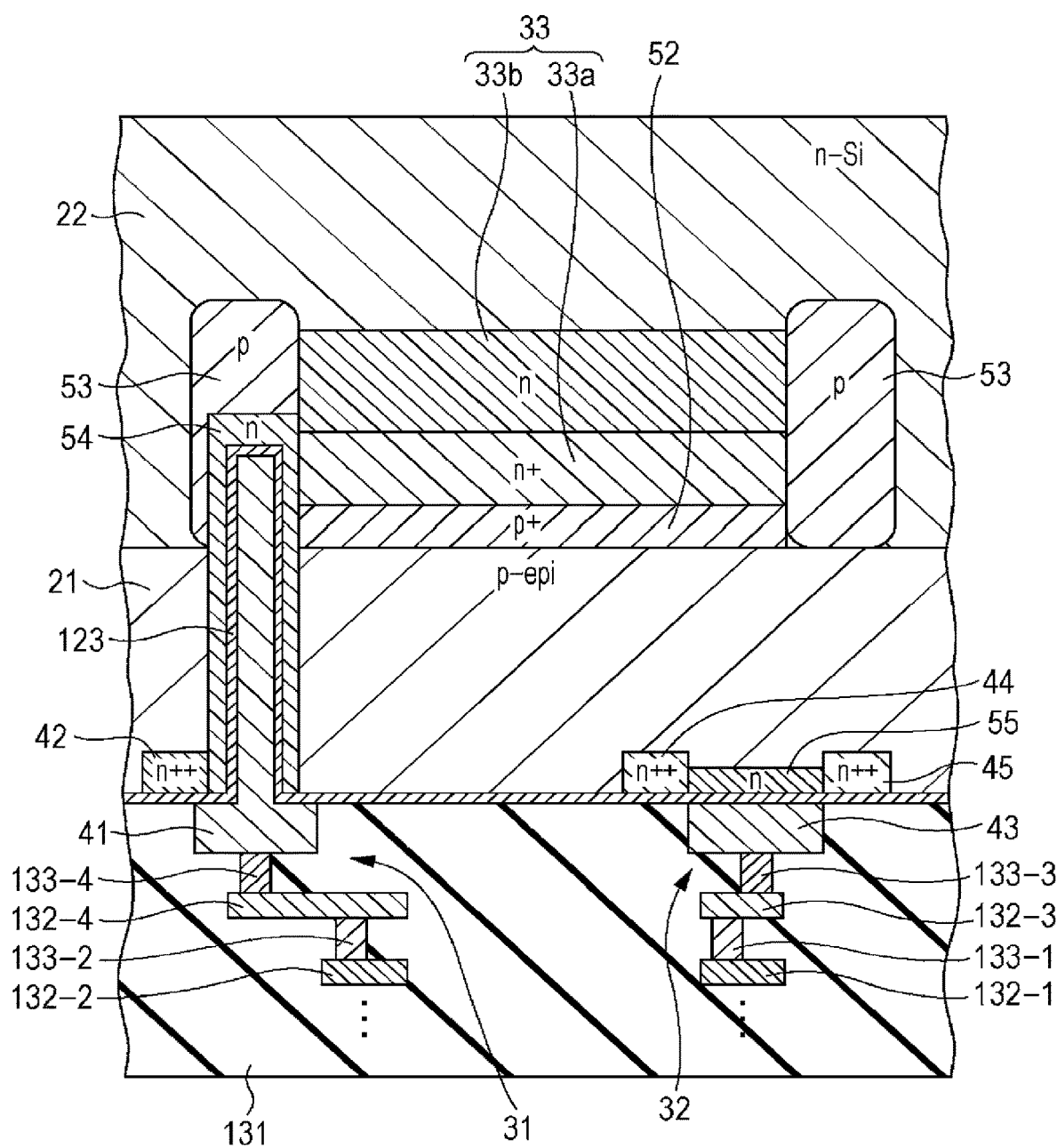
FIG. 18 is a cross-sectional view describing an eighth step.

As shown in FIG. 18, in the eighth step, the silicon substrate 22 is reversed, the rear face of the silicon substrate 22 is faced upward, and thereafter, processing is begun with respect to the rear face side of the silicon substrate 22.

Figure 19:
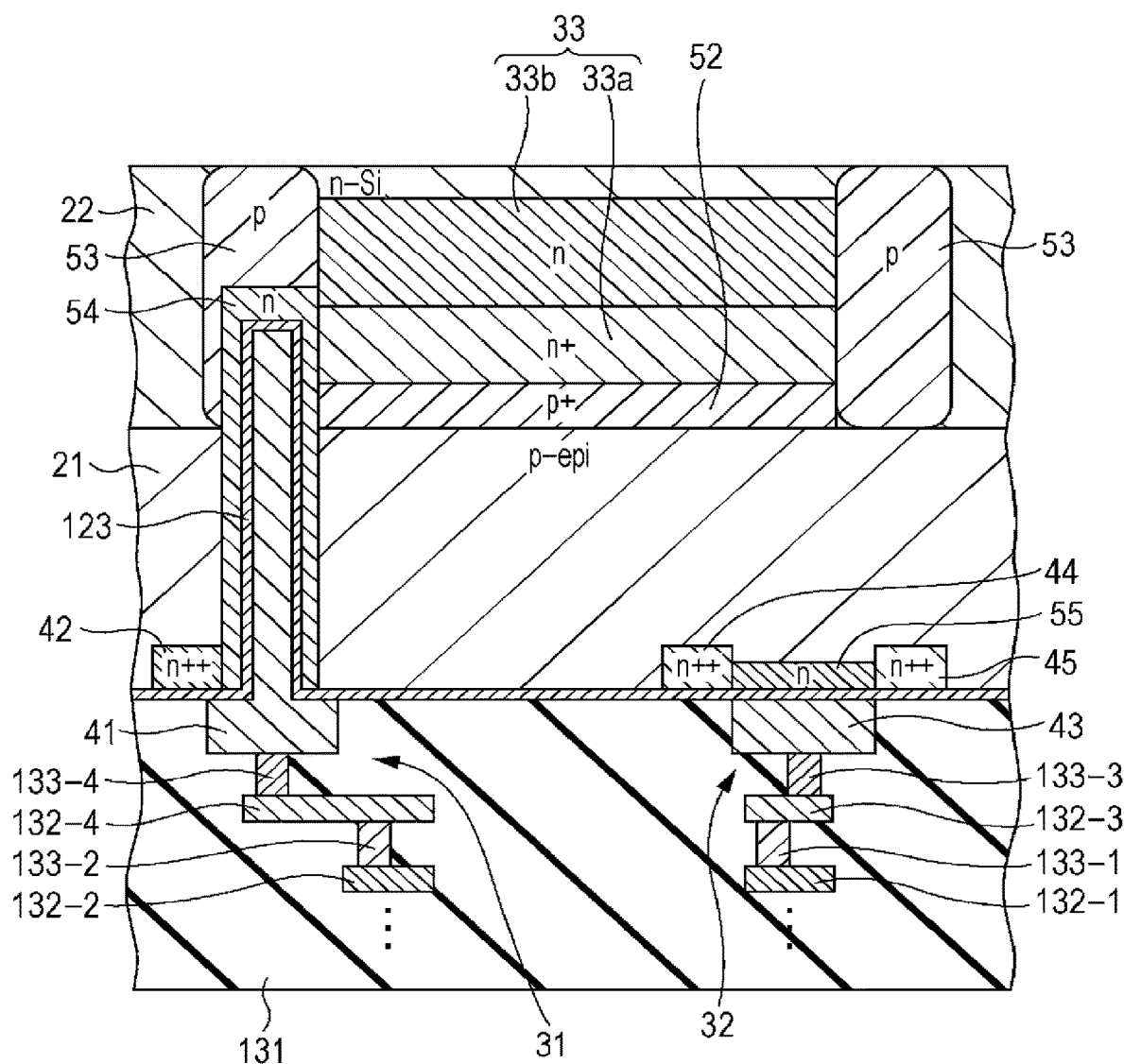
FIG. 19 is a cross-sectional view describing a ninth step.

As shown in FIG. 19, in the ninth step, etching of the silicon substrate 22 is performed from the rear face side to the photodiode 33.

Figure 20:
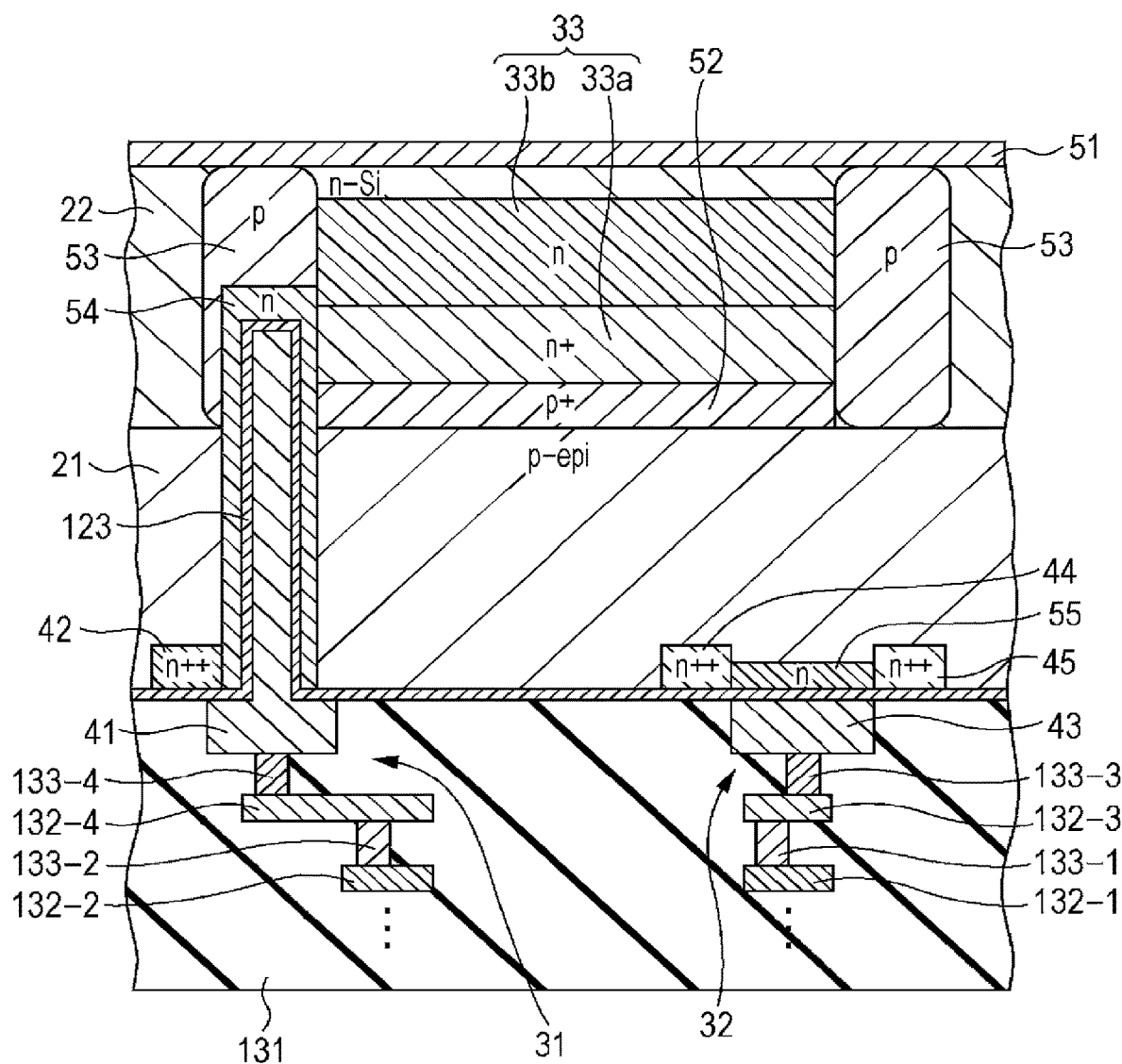
FIG. 20 is a cross-sectional view describing a tenth step.

As shown in FIG. 20, in the tenth step, a rear face pinning layer 51 is formed with respect to the silicon substrate 22.

Figure 21:
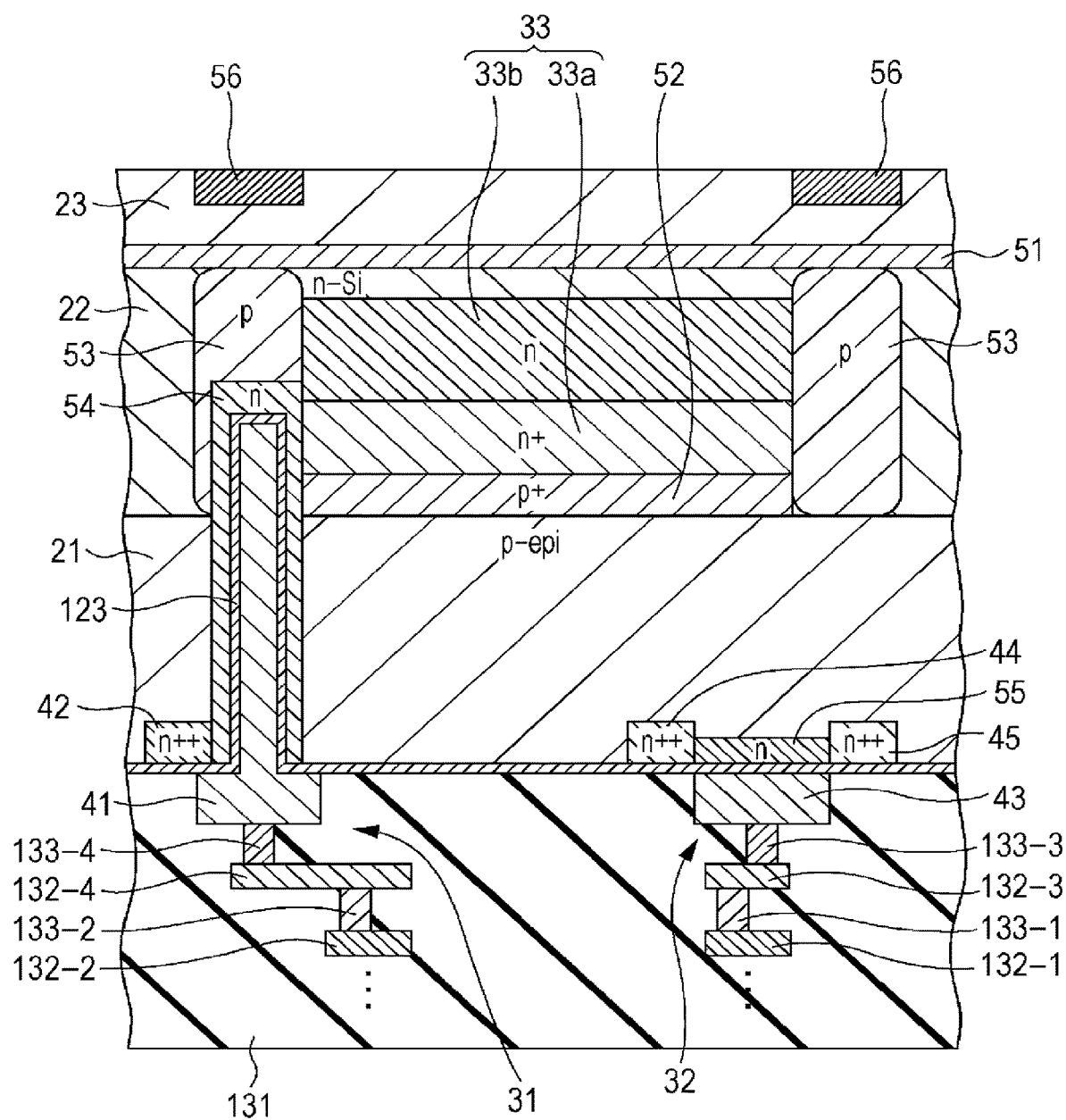
FIG. 21 is a cross-sectional view describing an eleventh step.

As shown in FIG. 21, in the eleventh step, an anti-reflection film 23 is formed on the rear face pinning layer 51, and a light blocking metal 56 is formed so as to be embedded in the anti-reflection film 23 between the pixel 11 and neighboring pixels.

Figure 22:
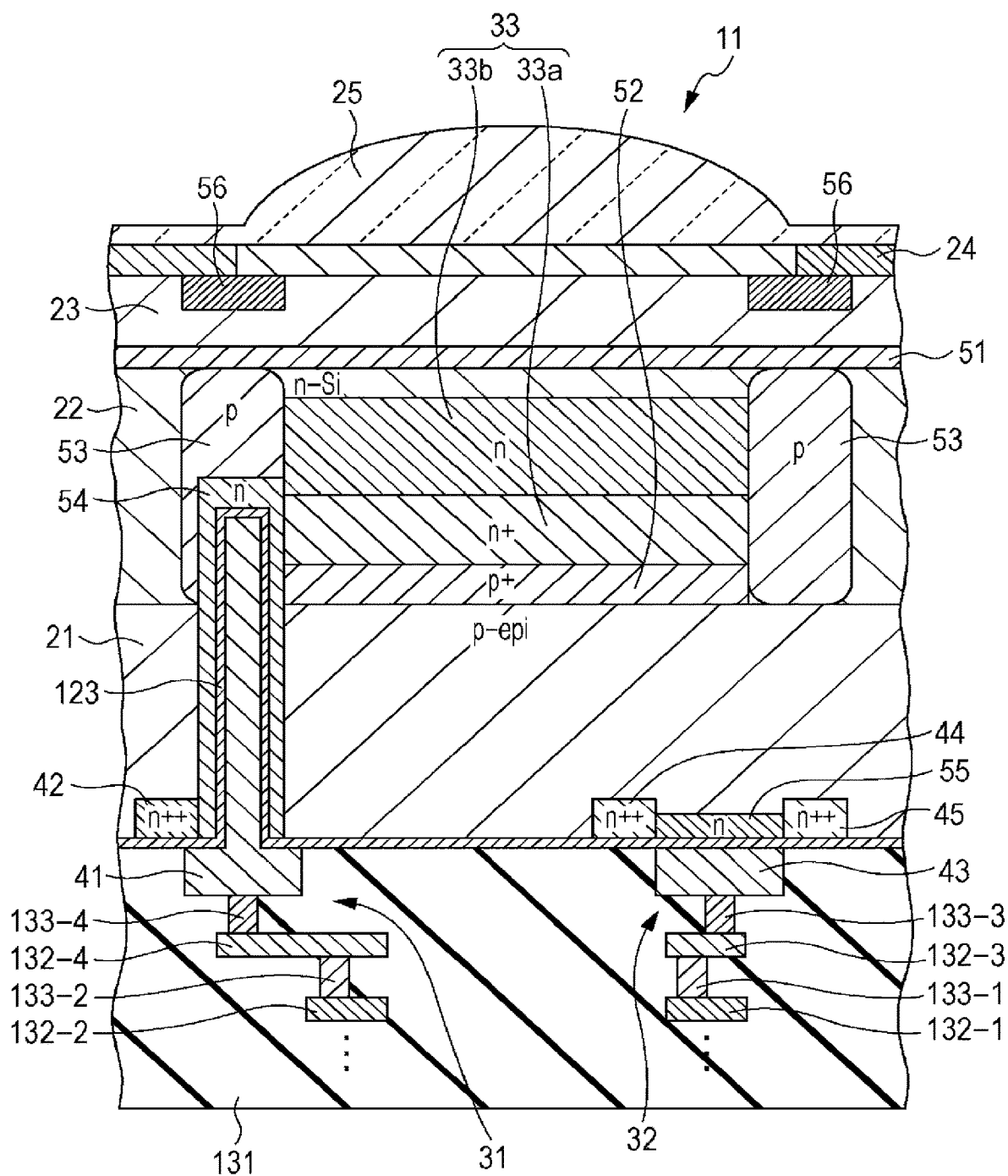
FIG. 22 is a cross-sectional view describing a twelfth step.

As shown in FIG. 22, in the twelfth step, a color filter layer 24 is laminated on the anti-reflection film 23, and an on-chip lens 25 is laminated on the color filter layer 24.

The pixel 11 is formed through the steps as described above.

For the pixel 11, it is possible to improve the amount of saturation charge and the sensitivity characteristics of the photodiode 33 by forming the photodiode 33 and the pixel transistor 32 in different regions through such a method of manufacturing.

Further, for the pixel 11, because the P-type epitaxial layer 21 is formed so as to be laminated with respect to the silicon substrate 22 after the photodiode 33 is formed on the silicon substrate 22, it is possible to form the photodiode 33 such that the gradient of the potential becomes sharp. In so doing, it is possible to further improve the amount of saturation charge and the sensitivity characteristics of the photodiode 33.

Figure 23:
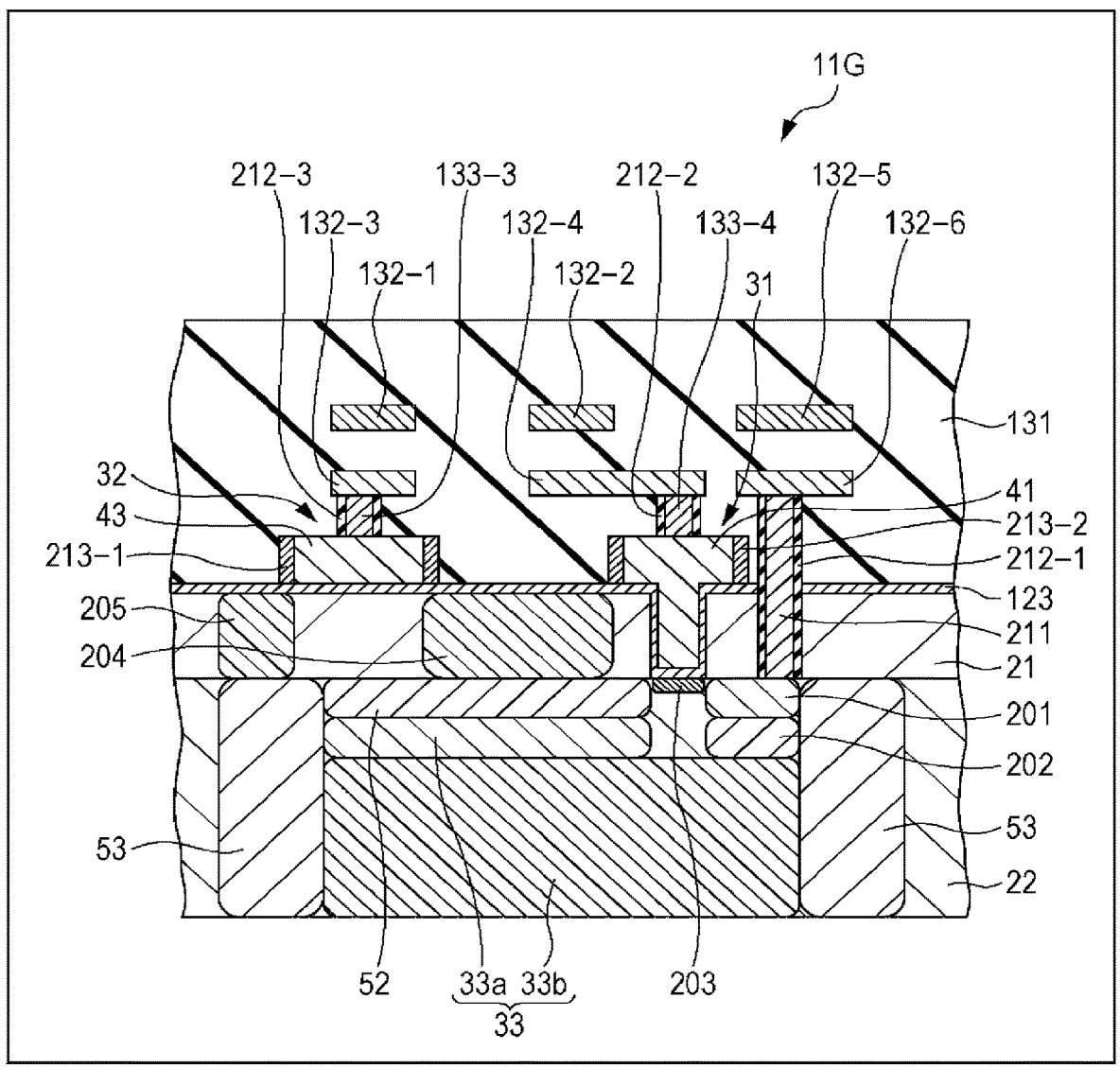
FIG. 23 is a cross-sectional view showing a configuration example of an eighth embodiment of a pixel.

Next, a cross-sectional view showing a configuration example of an eighth embodiment of a pixel 11 is shown in FIG. 23.

For example, as shown in FIG. 23, the pixel 11G has a configuration shared with the pixel 11 in FIG. 4 on the point of a photodiode 33 being formed on a silicon substrate 22 and the pixel transistor 32 being formed on the P-type epitaxial layer 21. However, the pixel 11G has a configuration differing from the pixel 11 in FIG. 4 on the point of an N-type region 201 functioning as an FD portion being formed on the silicon substrate 22, and charge being transferred from the photodiode 33 to the N-type region 201 with only the bottom face of the embedded-type transfer transistor 31.

That is, in the pixel 11G, the bottom face of the gate electrode 41 configuring the transfer transistor 31 is formed so as to contact the silicon substrate 22 via an oxide film 123, and a channel region 203 is formed on the silicon substrate 22 which is a region corresponding to the bottom face of the gate electrode 41. Then, the N-type region 201 is formed on the silicon substrate 22 which is a position separated from the photodiode 33 via the channel region 203. In addition, a P-type region 202 is formed between the N-type region 201 and the N-type region 33b in order to separate the N-type region 201 and the N-type region 331.

In addition, in the pixel 11G, a contact portion 211 is formed by a conductor embedded in the P-type epitaxial layer 21 so as to connect to the N-type region 201 by penetrating the P-type epitaxial layer 21, and the contact portion 211 is connected to the wiring 132-6 of the wiring layer 131.

In addition, on the side face of the contact portion 211, for example, an insulating film 212-1 formed from an oxide film is formed, and the capacitance is reduced. Similarly, an insulating film 212-2 is formed on the side face of the contact portion 133-4 connecting the gate electrode 41 and the wiring 132-4, and an insulating film 212-3 is formed on the side face of the contact portion 133-3 connecting the gate electrode 43 and the wiring 132-3. In addition, a sidewall 213-1 is formed on the side face of the gate electrode 43, and a sidewall 213-2 is formed on the side face of the gate electrode 41. In addition, in the pixel 11G, separation portions 204 and 205 for separating the pixel transistor 32 are formed on the P-type epitaxial layer 21.

The pixel 11G employing such a structure, similarly to the rear face illumination-type CMOS image sensor of the related art, is able to transfer charge from the photodiode 33 to the N-type region 201 (PD portion). In so doing, it is possible to make the potential of the photodiode 33 sufficiently deep, and to ensure the amount of saturation charge. In other words, as in the pixel 11G, even employing a configuration forming the photodiode 33 and the pixel transistor 32 in different regions in the depth direction, it is possible to set the potential of the photodiode 33 to the same depth as a rear face illumination-type CMOS image sensor of the related art. In so doing, in a configuration in which the photodiode 33 and the pixel transistor 32 are formed in different regions in the depth direction, it is possible to avoid lowering the amount of saturation charge per unit area. Further, by setting a configuration forming the photodiode 33 and the pixel transistor 32 in different regions in the depth direction, for example, it is possible to increase the area of an amplification transistor, and possible to reduce noise more than in the structure of a rear face illumination-type CMOS image sensor of the related art.

Moreover, it is possible to set the impurity concentration in the P-type epitaxial layer 21 to be sufficiently higher than in the silicon substrate 22, and possible for a channel to be formed only on the bottom face portion by setting a threshold voltage Vth of the sidewall portion of the gate electrode 41 configuring the transfer transistor 31 to be high with respect to the bottom face.

Next, an example of a method of manufacturing the solid-state imaging device 1 having the pixel 11G will be described with reference to FIG. 24 to FIG. 44.

Figure 24:
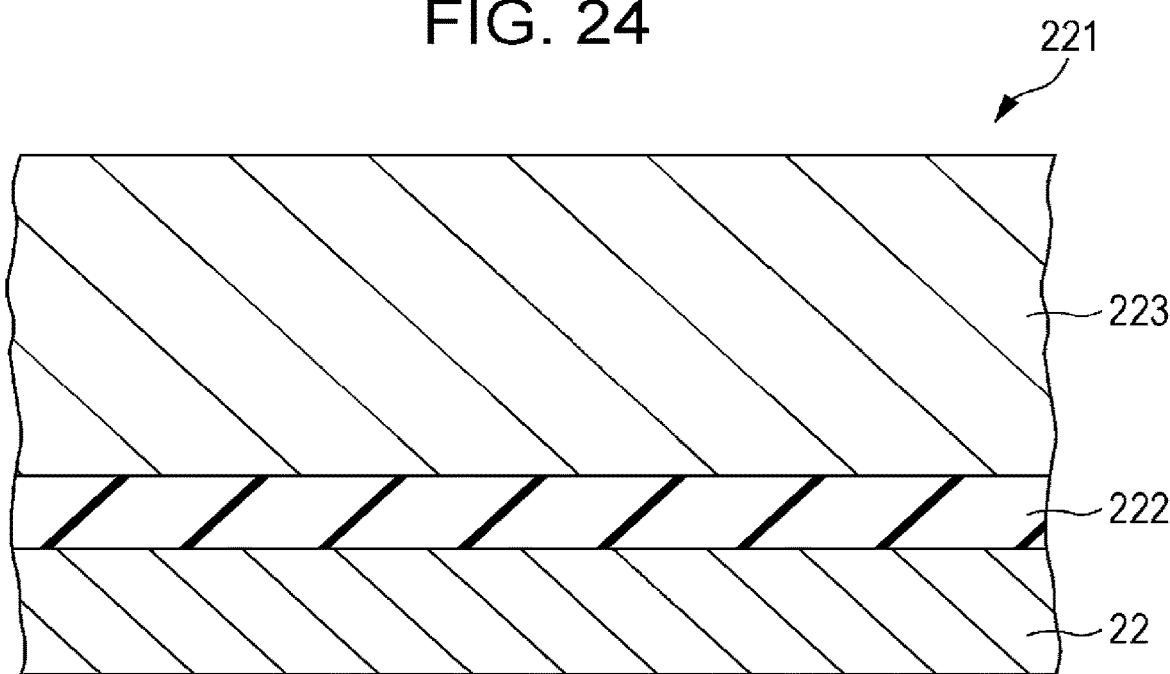
FIG. 24 is a diagram showing an SOI substrate used in a structure of a solid-state imaging device.

In this example, as shown in FIG. 24, in the method of manufacturing of the solid-state imaging device 1, an SOI substrate 221 on which a BOX layer (silicon dioxide insulating film) 222 and an SOI layer (single crystal silicon film) 223 are laminated on a silicon substrate 22 is used.

Figure 25:
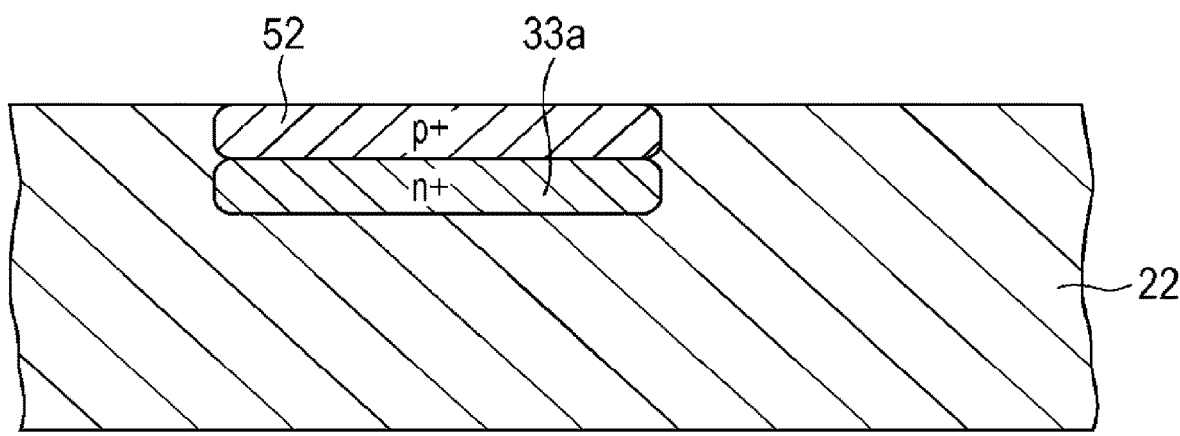
FIG. 25 is a cross-sectional view describing a twenty-first step.

As shown in FIG. 25, in the twenty-first step, a surface pinning layer 52 (p+) formed by injecting p-type impurities with respect to the silicon substrate 22, and an N-type region 33a (n+) is formed by injecting n-type impurities. In so doing, a PN junction formed from the surface pinning layer 52 and the N-type region 33a is formed.

Figure 26:
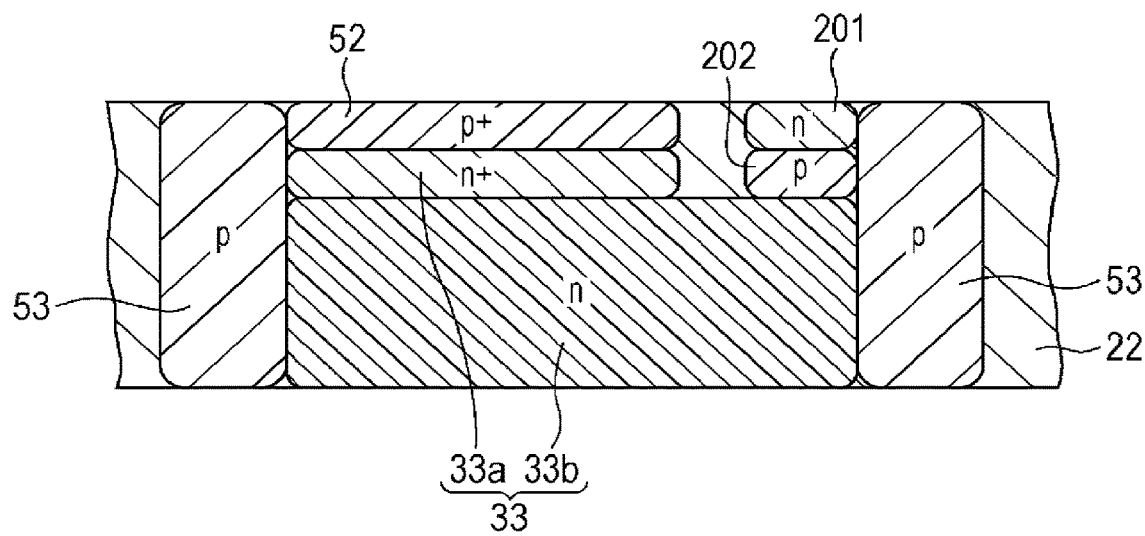
FIG. 26 is a cross-sectional view describing a twenty-second step.

As shown in FIG. 26, in the twenty-second step, a photodiode 33 is formed by forming the N-type region 33b (a) by injecting n-type impurities with respect to the silicon substrate 22. In addition, concentrated n-type impurities are injected and an N-type region 201 (n) functioning as an FD portion is formed. Then, a P-type region 202 (p) is formed between the N-type region 33b and the N-type region 201 so as to connect to a P-well 53, along with forming the 53 (p) so as to surround the side face of the photodiode 33, by injecting p-type impurities.

Figure 27:
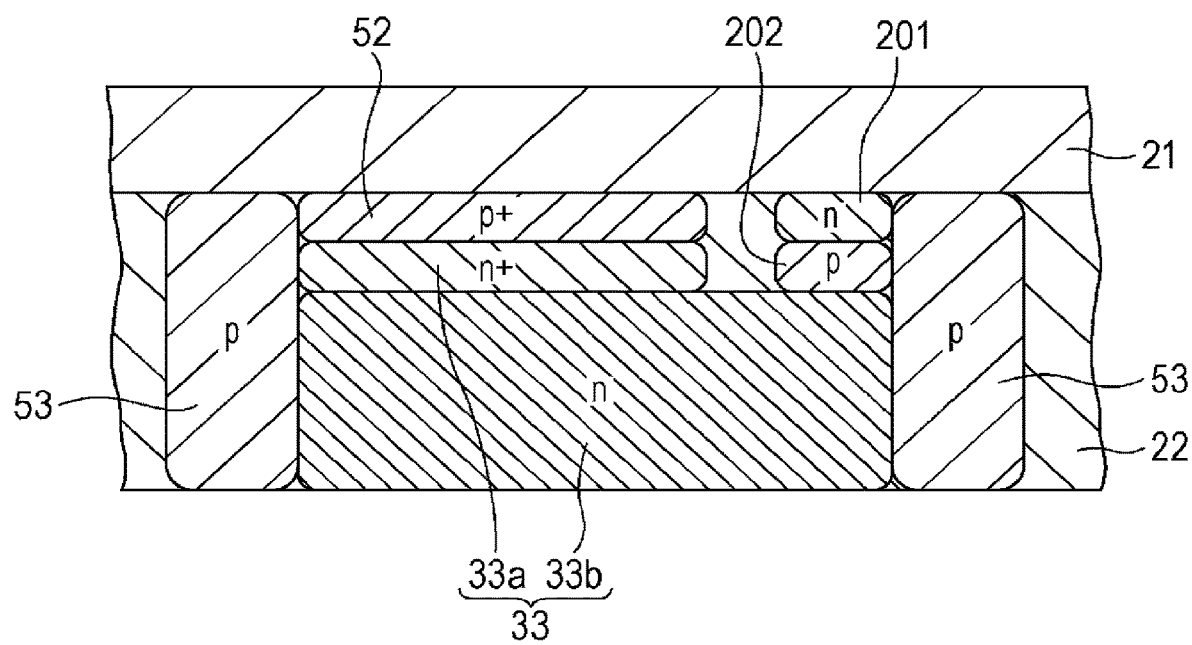
FIG. 27 is a cross-sectional view describing a twenty-third step.

As shown in FIG. 27, in the twenty-third step, a P-type epitaxial layer 21 which becomes a pixel transistor region 2 (refer to FIG. 1) is formed by performing doping during epitaxial growth (In situ doped epitaxial deposition) with respect to the surface of the silicon substrate 22.

Here, a mark is formed for use as a target when the front and rear are matched in the lithography step in processing of the rear face side.

Figure 28:
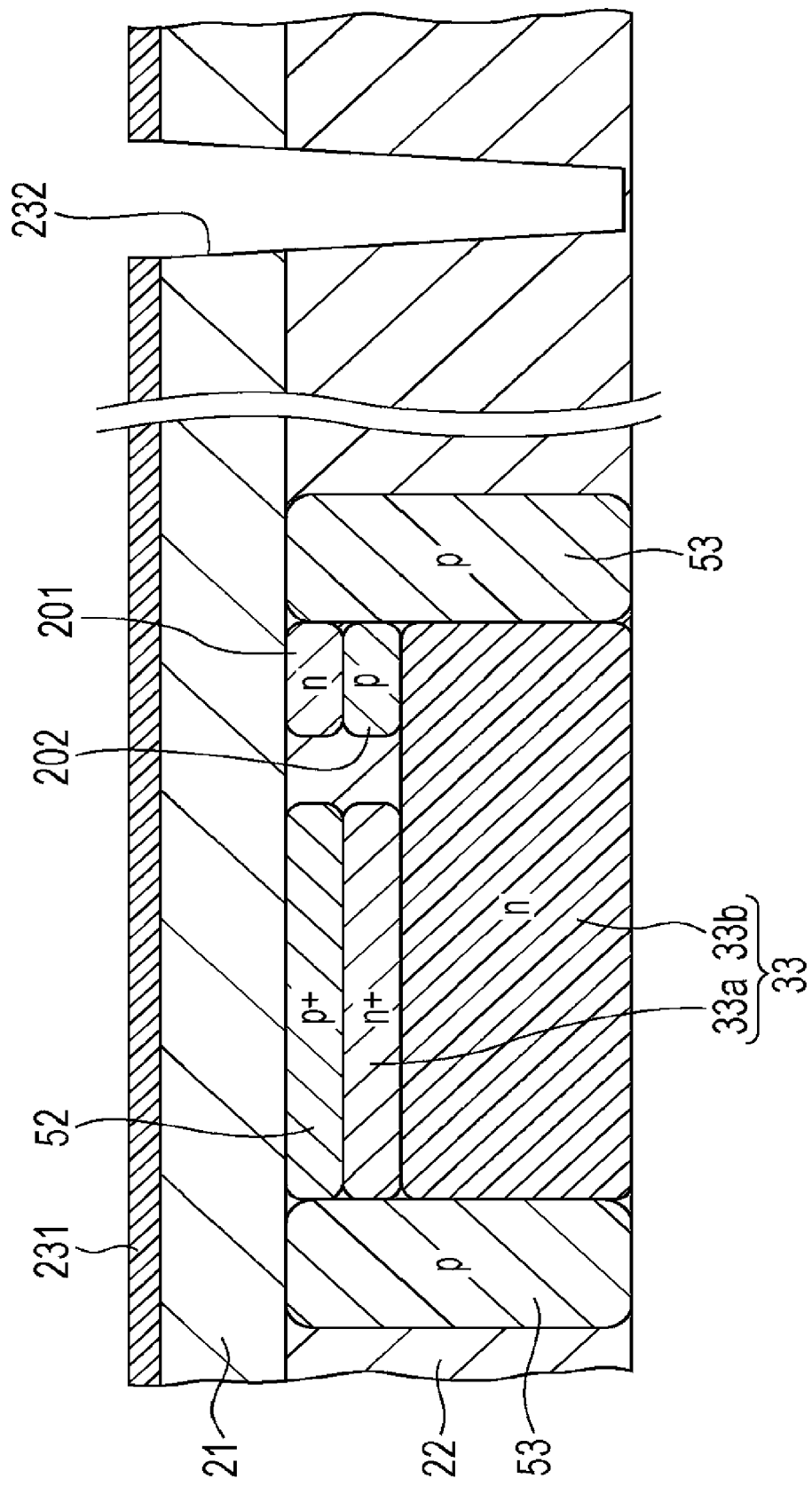
FIG. 28 is a cross-sectional view describing a twenty-fourth step.

As shown in FIG. 28, in the twenty-fourth step, a trench 232 is formed in a region different from the region in which the pixel 11G is formed, for example, a location separating chips, or the like. The trench 232 is formed by forming a mask 231 at locations other than those forming the trench 232 and performing etching.

As shown in FIG. 29, in the twenty-fifth step, for example, an insulator 233, such as silicon nitride (SiN), is embedded in the trench 232 and flattening is performed along with removing the mask 231, thereby forming a mark.

Figure 30:
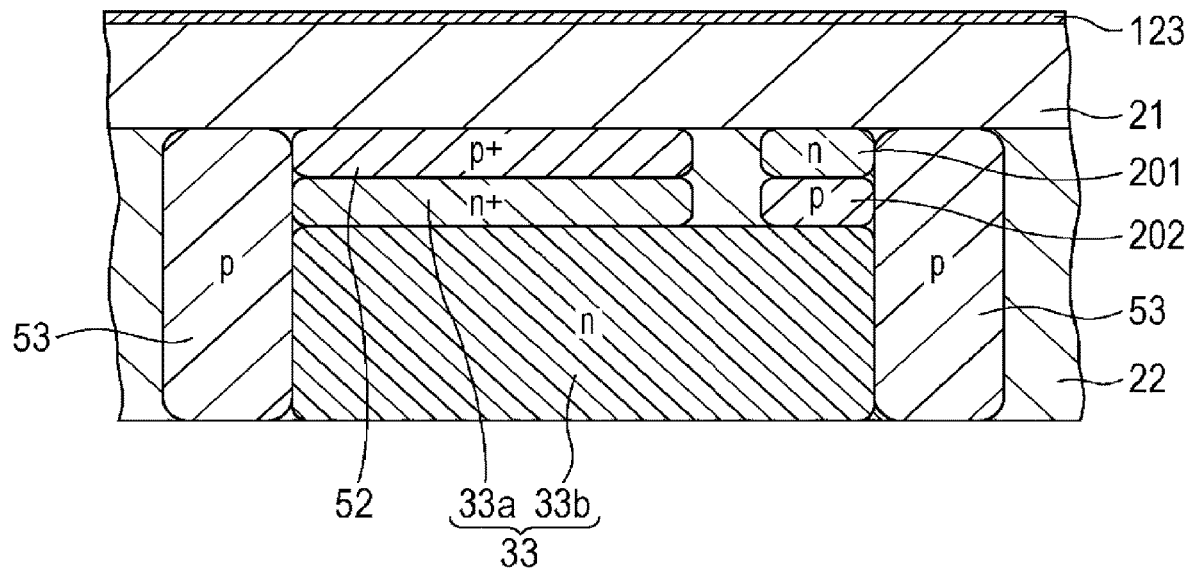
FIG. 30 is a cross-sectional view describing a twenty-sixth step.

As shown in FIG. 30, in the twenty-sixth step, impurity injection for forming the well and Channel is performed with respect to the P-type epitaxial layer 21. Moreover, since doping is performed during epitaxial growth when forming the P-type epitaxial layer 21, performing impurity injection for forming the well may not be necessary. In addition, an oxide film 123 is formed on the P-type epitaxial layer 21.

Figure 31:
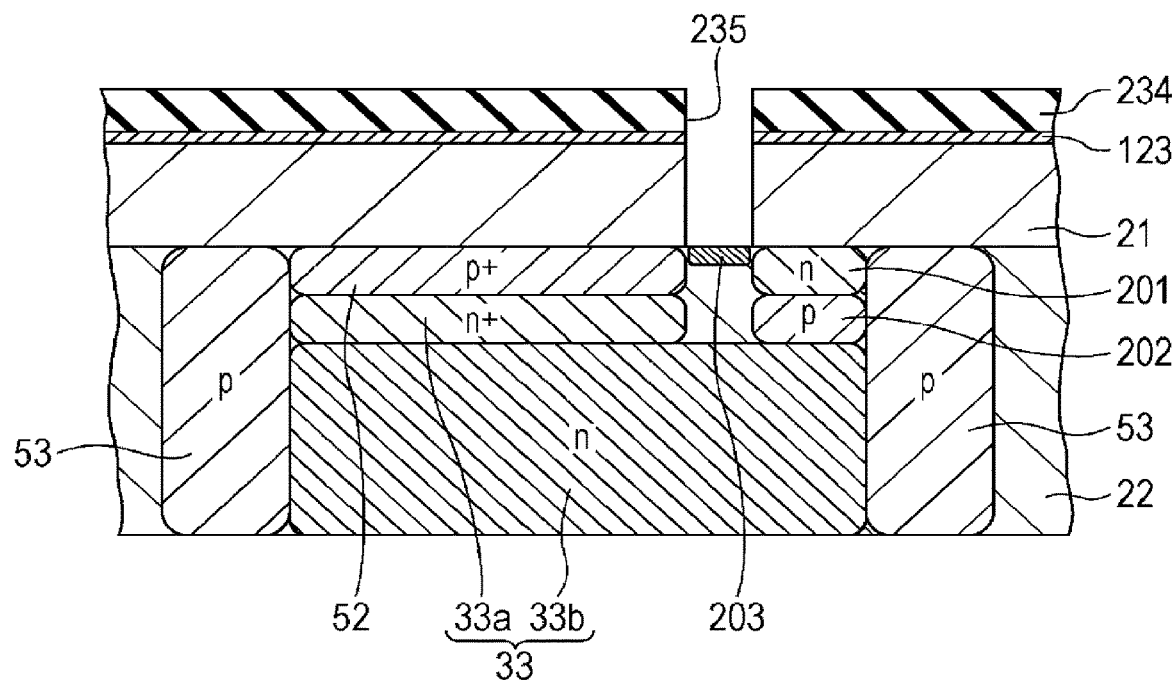
FIG. 31 is a cross-sectional view describing a twenty-seventh step.

As shown in FIG. 31, in the twenty-seventh step, a trench 235 for forming an embedded-type gate electrode 41 is formed. The trench 235 is formed by, for example, creating a hard mask 234, such as silicon nitride (SiN) on locations other than those forming the trench 235, and performing etching. Here, it is desirable to form a trench 235 so as to overlap the N-type region 201 in order to suppress the influence of alignment shift of the pattern of the trench 235 and the pattern of the N-type region 201.

In addition, after the trench 235 is formed, a channel region 203 is formed by injecting n-type impurities in the bottom face of the trench 235. By forming the channel region 203, a threshold voltage Vth applied to the gate electrode 41 when transferring charge by the transfer transistor 31 is set to be adjustable. In addition, by forming the channel region 203 in this step, self-aligning of the gate electrode 41 and the channel region 203 of the transfer transistor 31 becomes possible.

Figure 32:
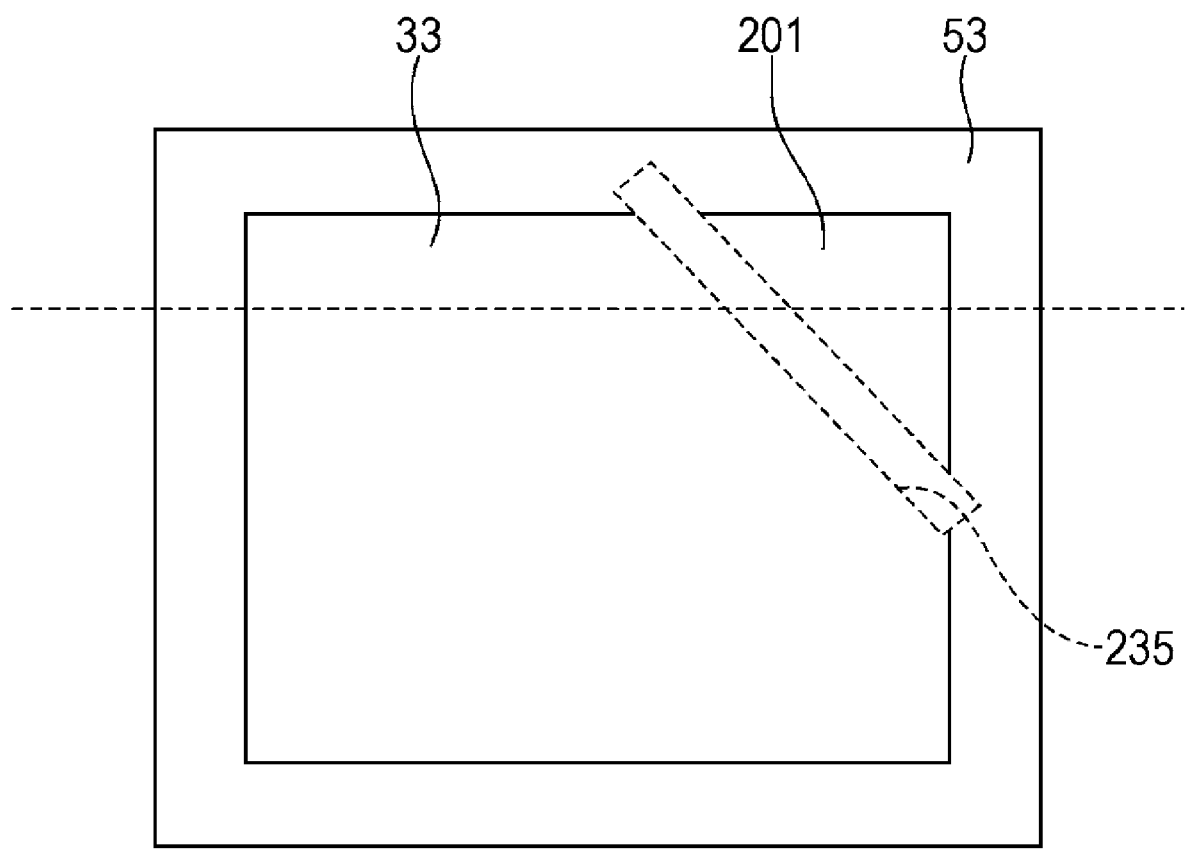
FIG. 32 is a plan view describing a twenty-seventh step.

In addition, a planar layout of the pixel 11G when the twenty-seventh step is performed is shown in FIG. 32. As shown in FIG. 32, a P-well 53 is formed at the periphery of the photodiode 33 and the N-type region 201, and a trench 235 is formed so as to separate the photodiode 33 and the N-type region 201. In other words, the trench 235 is formed such that both ends of the trench 235 extend to the P-well 53 when viewed planarly.

Figure 33:
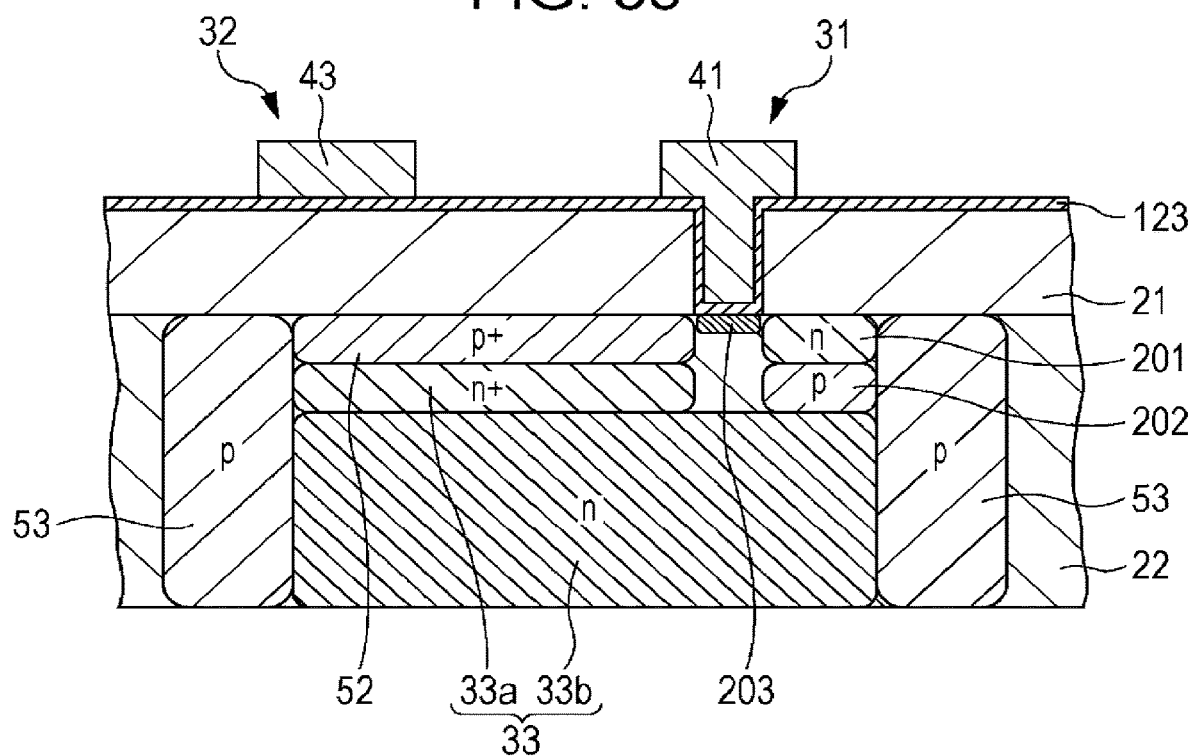
FIG. 33 is a cross-sectional view describing a twenty-eighth step.

As shown in FIG. 33, in the twenty-eighth step, a gate oxide film 123 is formed on the surface of the P-type epitaxial layer 21 and the inside surface of the trench 235. Then, the gate electrode 43 and gate electrode 41 are formed, and the pixel transistor 32 and the transfer transistor 31 are formed by performing gate working. For example, for the gate electrode 43 and gate electrode 41, the use of a material made to be conductive, such as of amorphous silicon doped in-situ with phosphorous, is suitable even without performing impurity injection. This is because, in a case in which impurity injection is performed, it is difficult to inject impurities to the deep parts of the trench 235.

Figure 34:
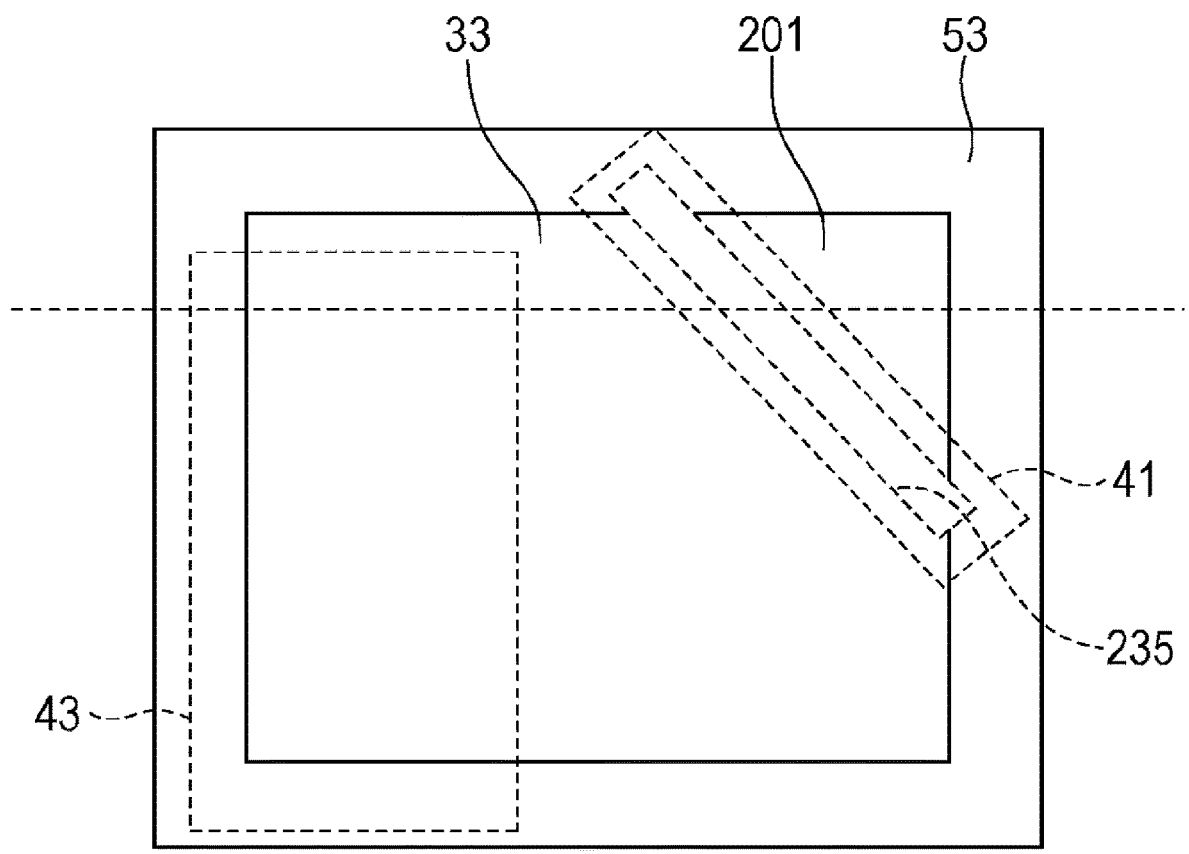
FIG. 34 is a plan view describing a twenty-eighth step.

In addition, a planar layout of the pixel 11G when the twenty-eighth step is performed is shown in FIG. 34. As shown in FIG. 34, a P-well 53 is formed at the periphery of the photodiode 33 and the N-type region 201, and a trench 235 is formed so as to separate the photodiode 33 and the N-type region 201. In other words, the trench 235 is formed such that both ends of the trench 235 extend to the P-well 53 when viewed planarly. In addition, in the pixel 11G, the gate electrode 43 (here, the gate electrode of the amplification transistor is shown in the drawing as the gate electrode 43) and the photodiode 33 are arranged so as to overlap when viewed planarly.

Figure 35:
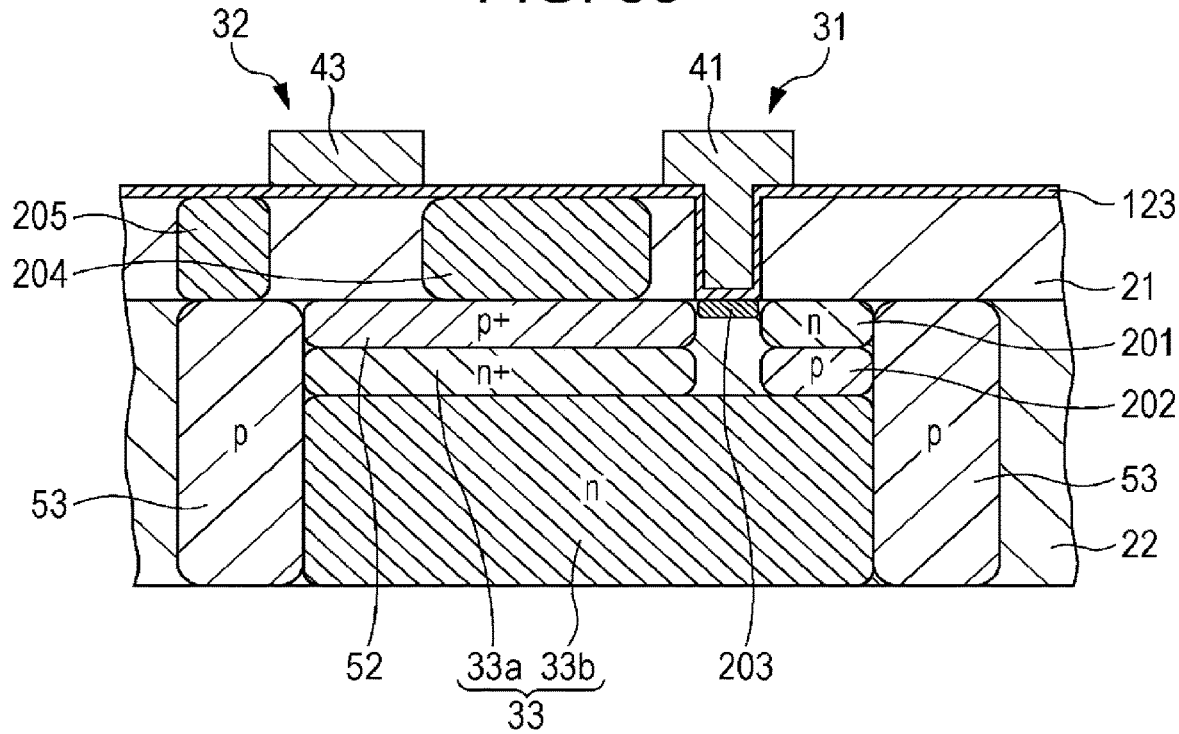
FIG. 35 is a cross-sectional view describing a twenty-ninth step.

As shown in FIG. 35, in the twenty-ninth step, separation portions 204 and 205 for separating the pixel transistors 32 are formed by injecting p-type impurities.

Figure 36:
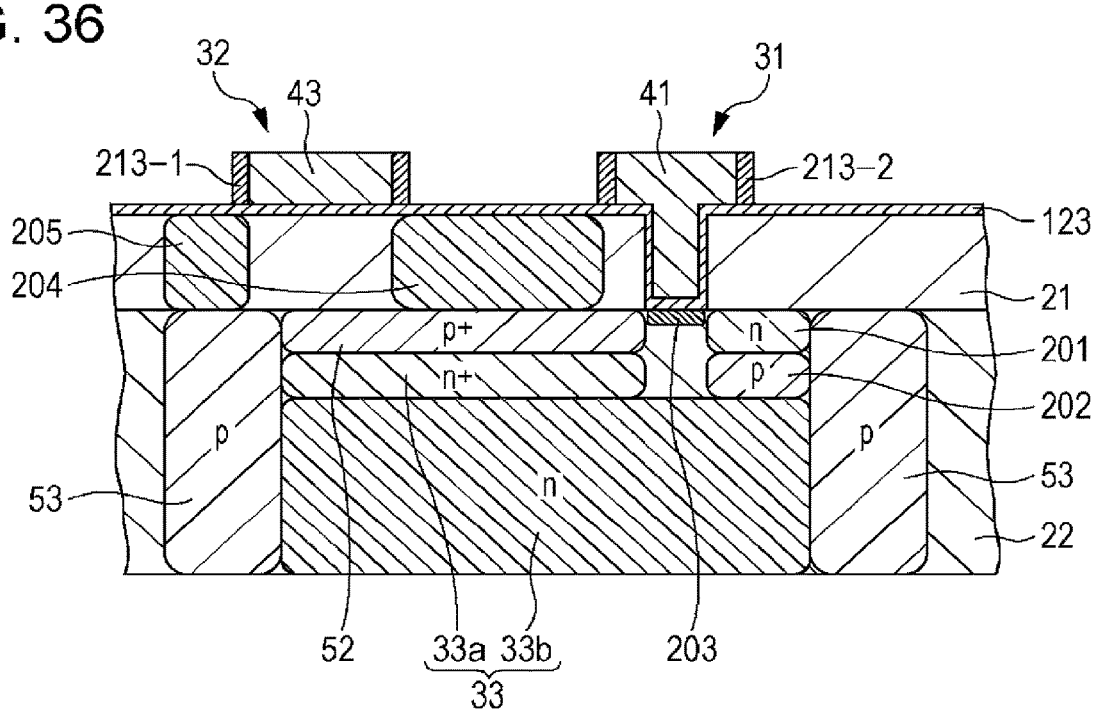
FIG. 36 is a cross-sectional view describing a thirtieth step.

As shown in FIG. 36, in the thirtieth step, a sidewall 213-1 is formed on the side face of the gate electrode 43, and a sidewall 213-2 is formed on the side face of the gate electrode 41. Further, in this step, activation annealing for activating the impurities injected in the silicon substrate 22 and the P-type epitaxial layer 21 is performed.

Figure 37:
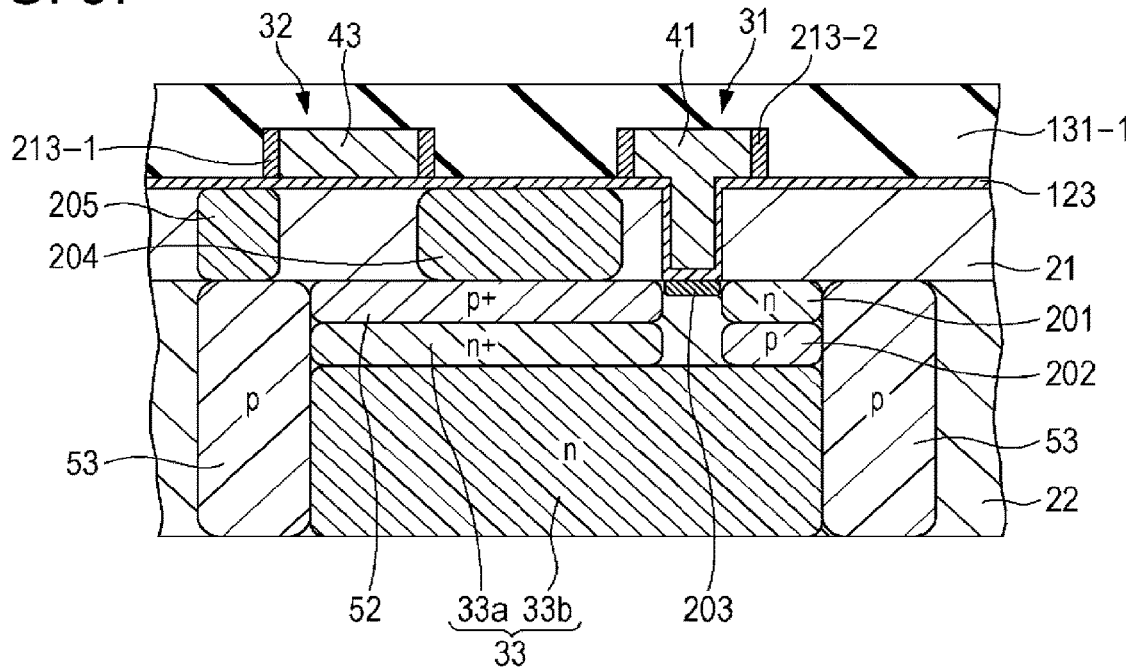
FIG. 37 is a cross-sectional view describing a thirty-first step.

As shown in FIG. 37, in the thirty-first step, an interlayer film 131-11 configuring the wiring layer 131 is formed.

Figure 38:
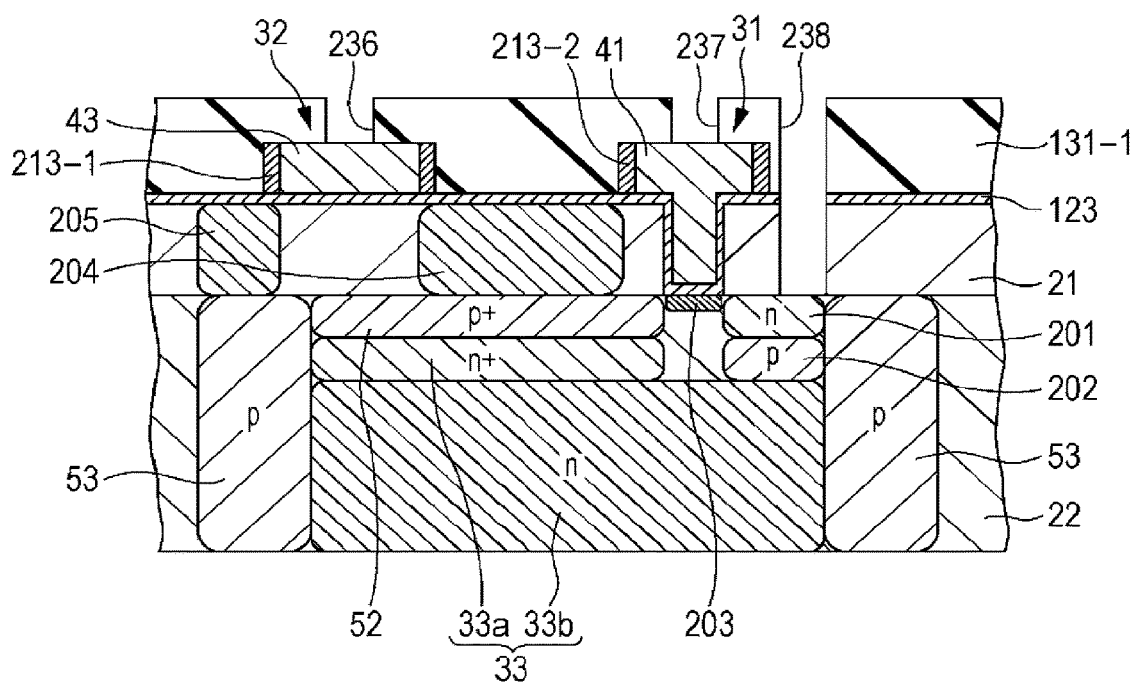
FIG. 38 is a cross-sectional view describing a thirty-second step.

As shown in FIG. 38, in the thirty-second step, an opening portion 236 for forming a contact portion 133-3, an opening portion 237 for forming a contact portion 133-4 and an opening portion 238 for forming a contact portion 211 are formed. At this time, the opening portion 238 is formed by the interlayer film 131-1 and the P-type epitaxial layer 21 being worked at the same time until the N-type region 201 functioning as an FD portion is exposed.

Figure 39:
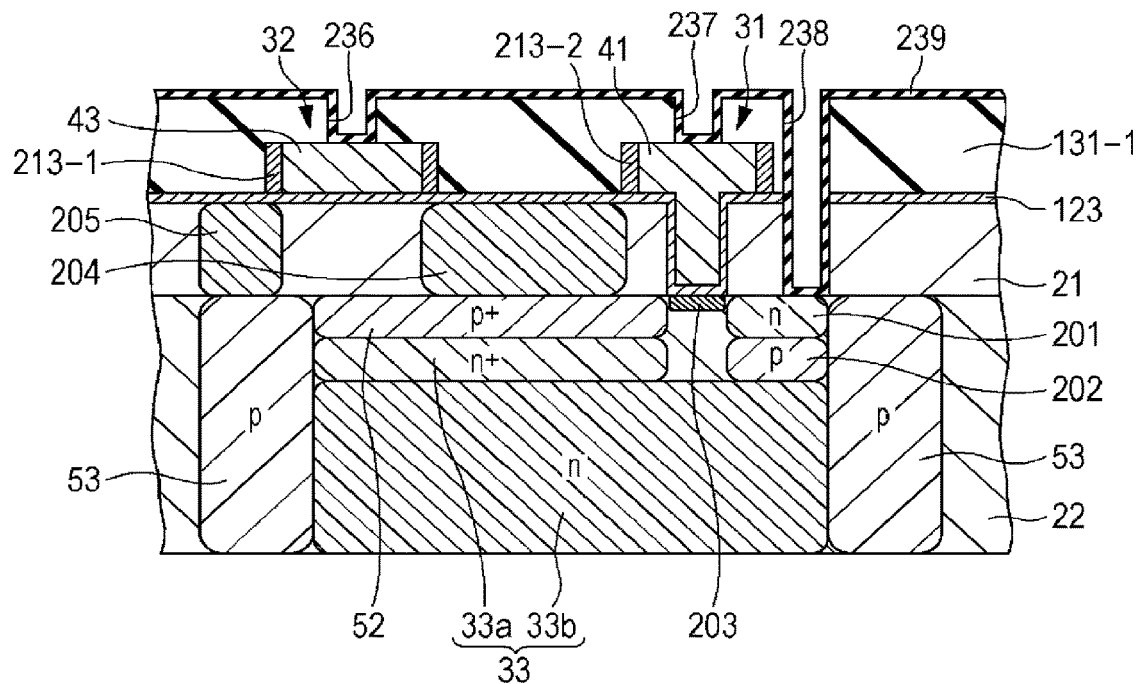
FIG. 39 is a cross-sectional view describing a thirty-third step.

As shown in FIG. 39, in the thirty-third step, an insulating film 239 is formed on the surface of the interlayer film 131-1 and the inside surface of the opening portions 236 to 238.

Figure 40:
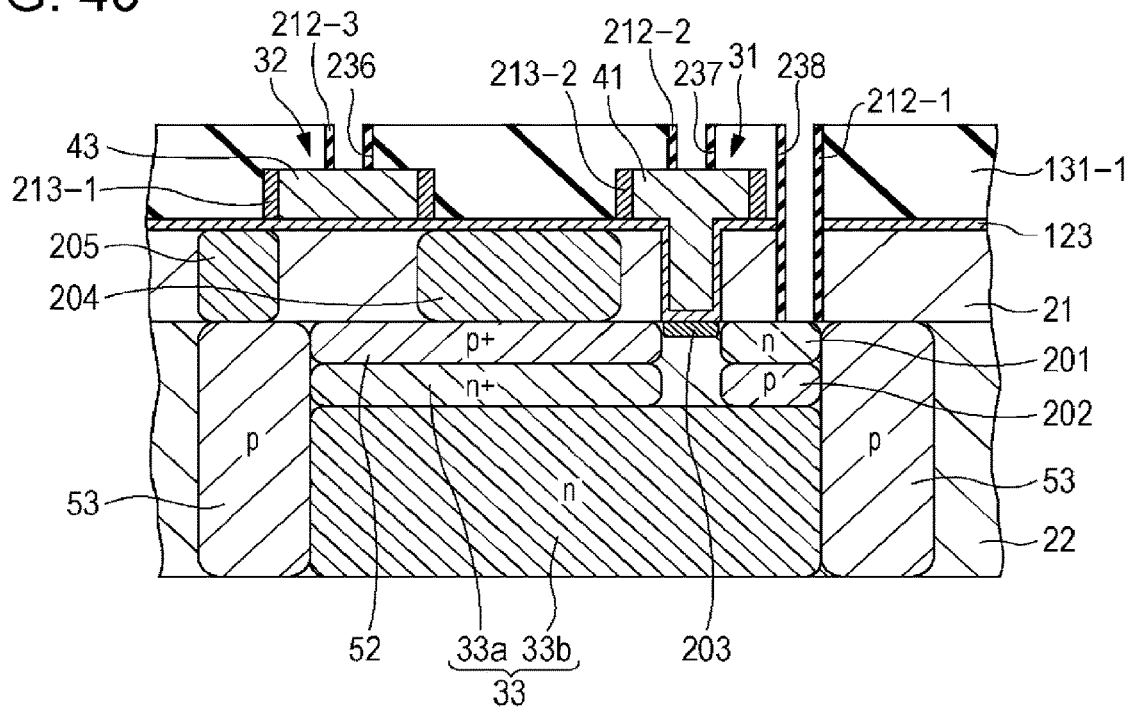
FIG. 40 is a cross-sectional view describing a thirty-fourth step.

As shown in FIG. 40, in the thirty-fourth step, the insulating film 239 formed on the bottom face of the opening portions 236 to 238 is removed by etchback in so doing, an insulating film 212-3 is formed on the side face of the opening portion 236, an insulating film 212-2 is formed on the side face of the opening portion 237, and an insulating film 212-1 is formed on the side face of the opening portion 238. For example, by forming the insulating film 212-1, it is possible to prevent the contact portion 211 from shorting with the P-type epitaxial layer 21.

Figure 41:
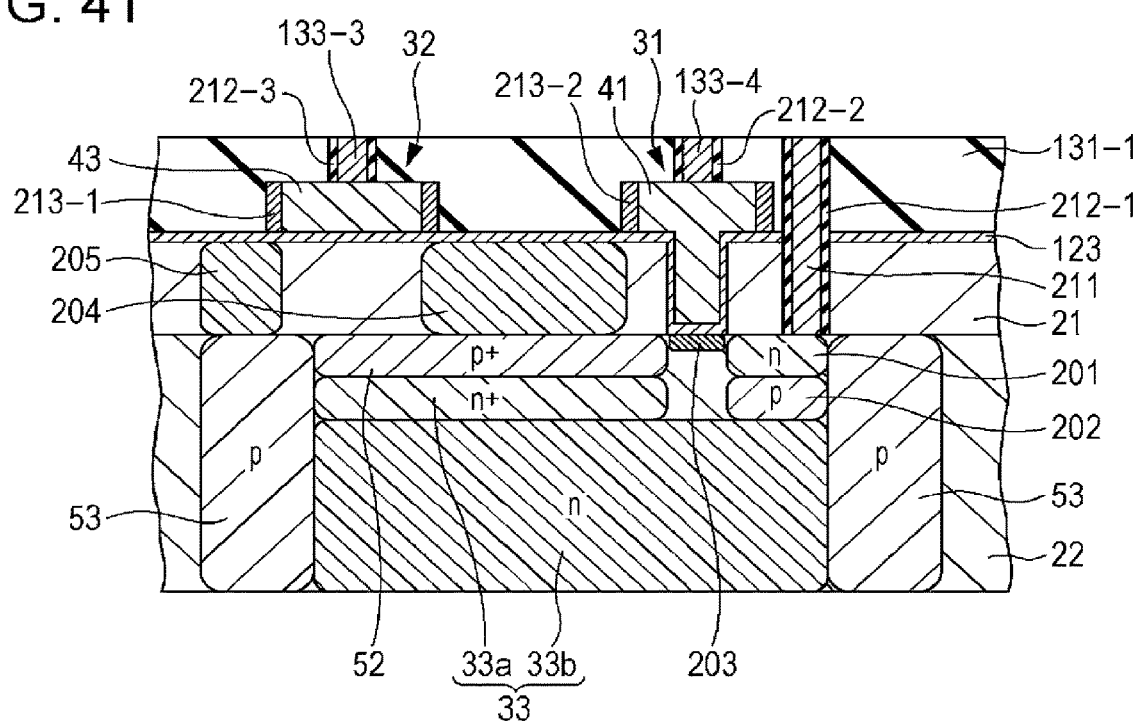
FIG. 41 is a cross-sectional view describing a thirty-fifth step.

As shown in FIG. 41, in the thirty-fifth step, for example, a metal, such as tungsten (W), titanium nitride (TiN) or titanium (Ti), is embedded in the opening portions 236 to 238. Then, the contact portion 133-3, the contact portion 133-4 and the contact portion 211 are formed by polishing using Chemical Mechanical Polishing (CMP).

Figure 42:
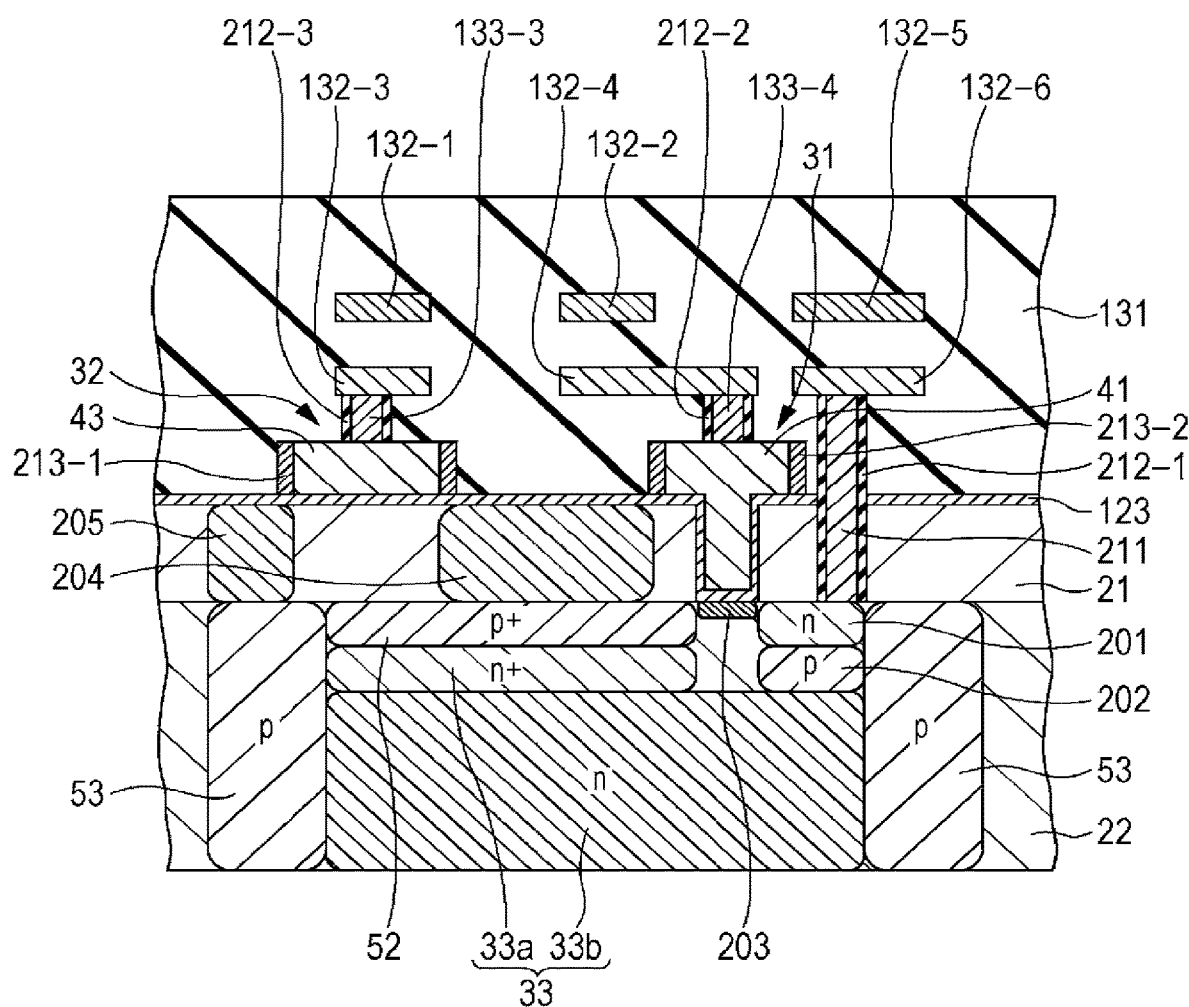
FIG. 42 is a cross-sectional view describing a thirty-sixth step.

As shown in FIG. 42, in the thirty-sixth step, a wiring 132-3, a wiring 132-4 and a wiring 132-6 are funned so as to connect to the contact portion 133-3, the contact portion 133-4 and the contact portion 211. Then, a wiring layer 131 formed from a multi-layer wiring layer is formed by laminating an interlayer film, forming a wiring 132-1, a wiring 132-2 and a wiring 132-5, and further laminating an interlayer film.

Figure 43:
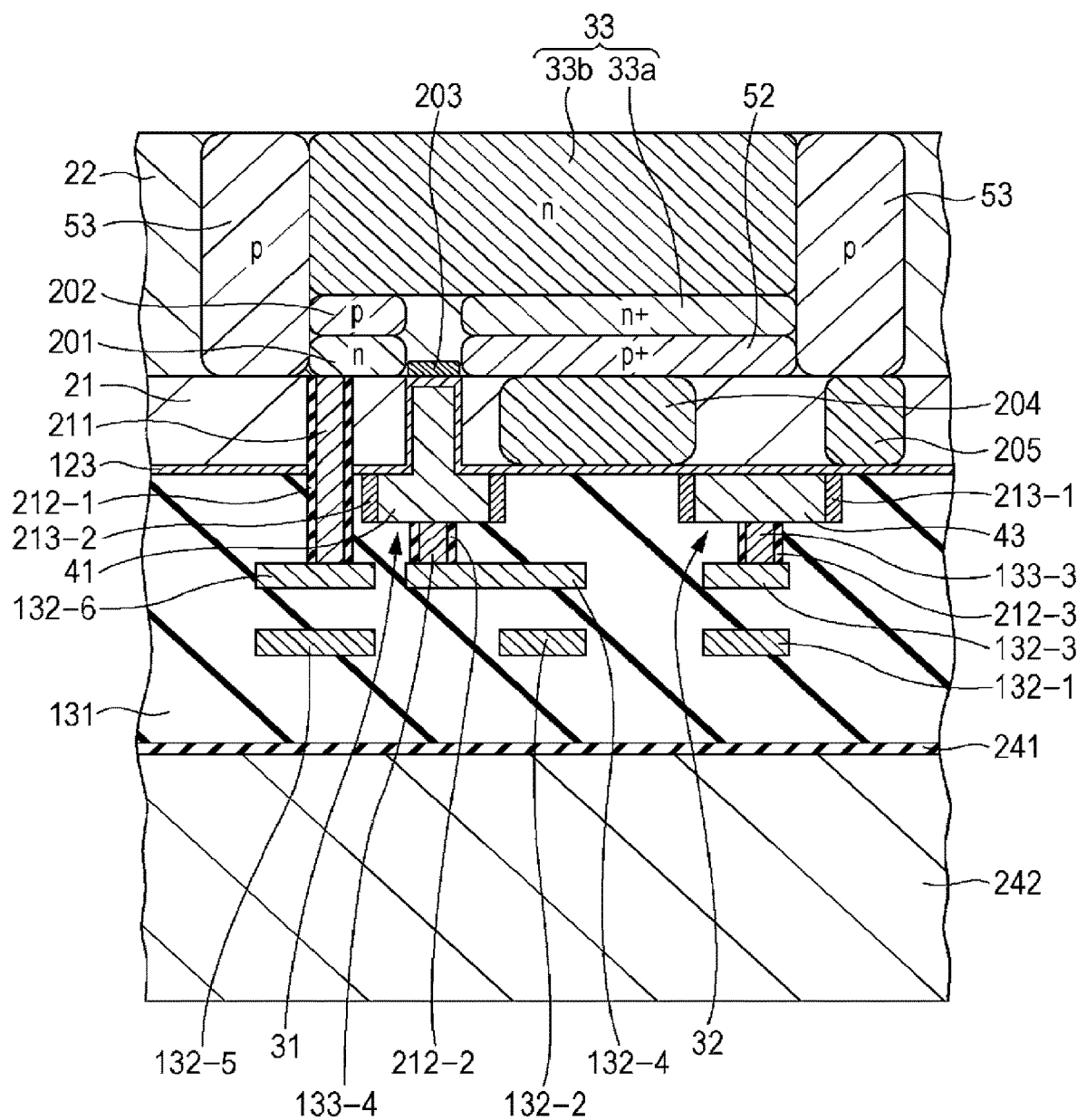
FIG. 43 is a cross-sectional view describing a thirty-seventh step.

As shown in FIG. 43, in the thirty-seventh step, for example, after a support substrate 242 is bonded to the wiring layer 131 via an insulating film 241 for bonding formed from silicon dioxide (SiO2) and reversed, stripping to the BOX layer 222 (FIG. 23) is performed with respect to the rear face side.

Figure 44:
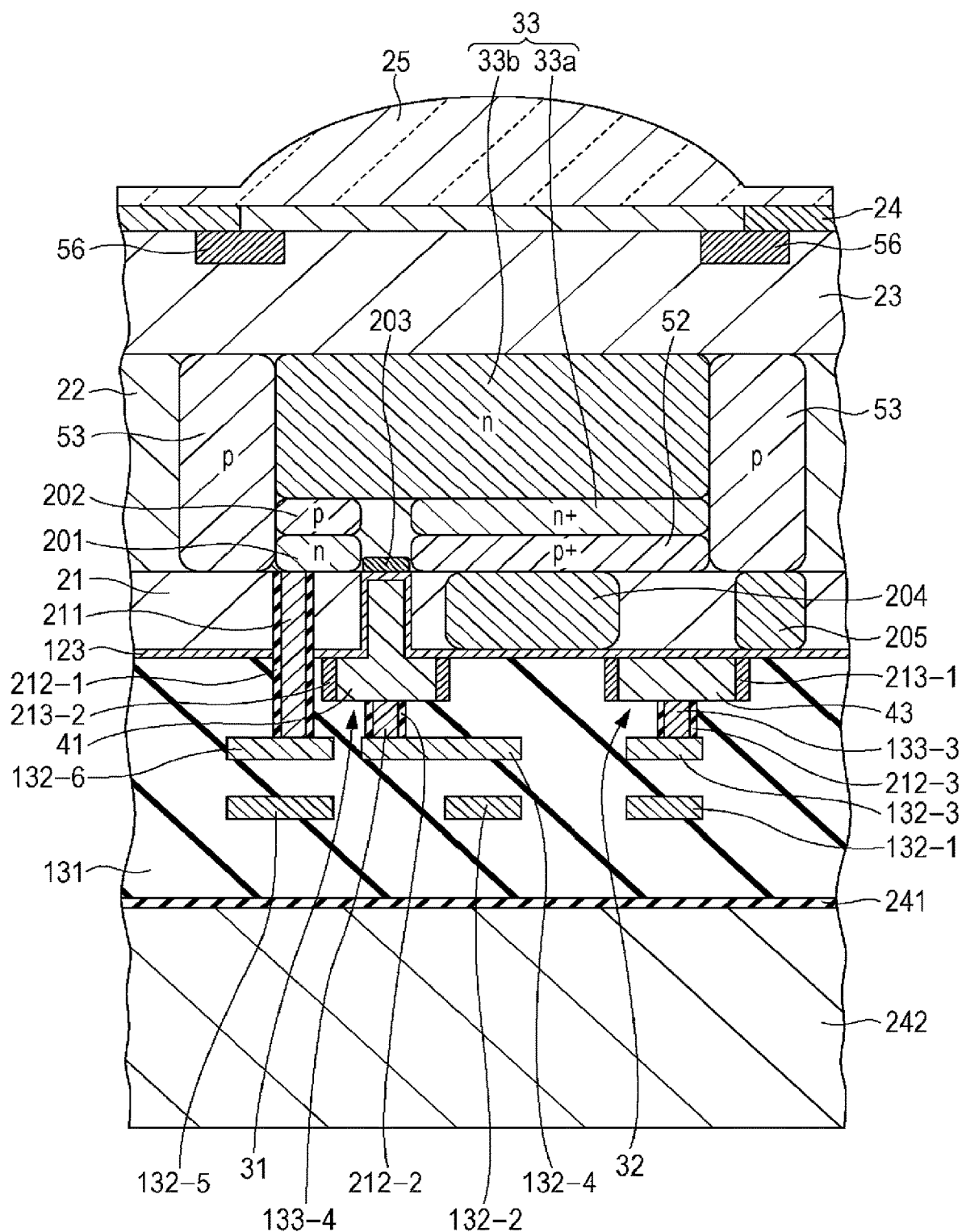
FIG. 44 is a cross-sectional view describing a thirty-eighth step.

As shown in FIG. 44, in the thirty-eighth step, an on-chip lens 25 is formed on the color filter layer 24 after an anti-reflection film 23 is formed on the silicon substrate 22, a light blocking metal 56 is formed, and the color filter layer 24 is laminated.

It is possible to manufacture a solid-state imaging device 1 having the pixel 11G by a method of manufacturing with the above-described steps.

Figure 45:
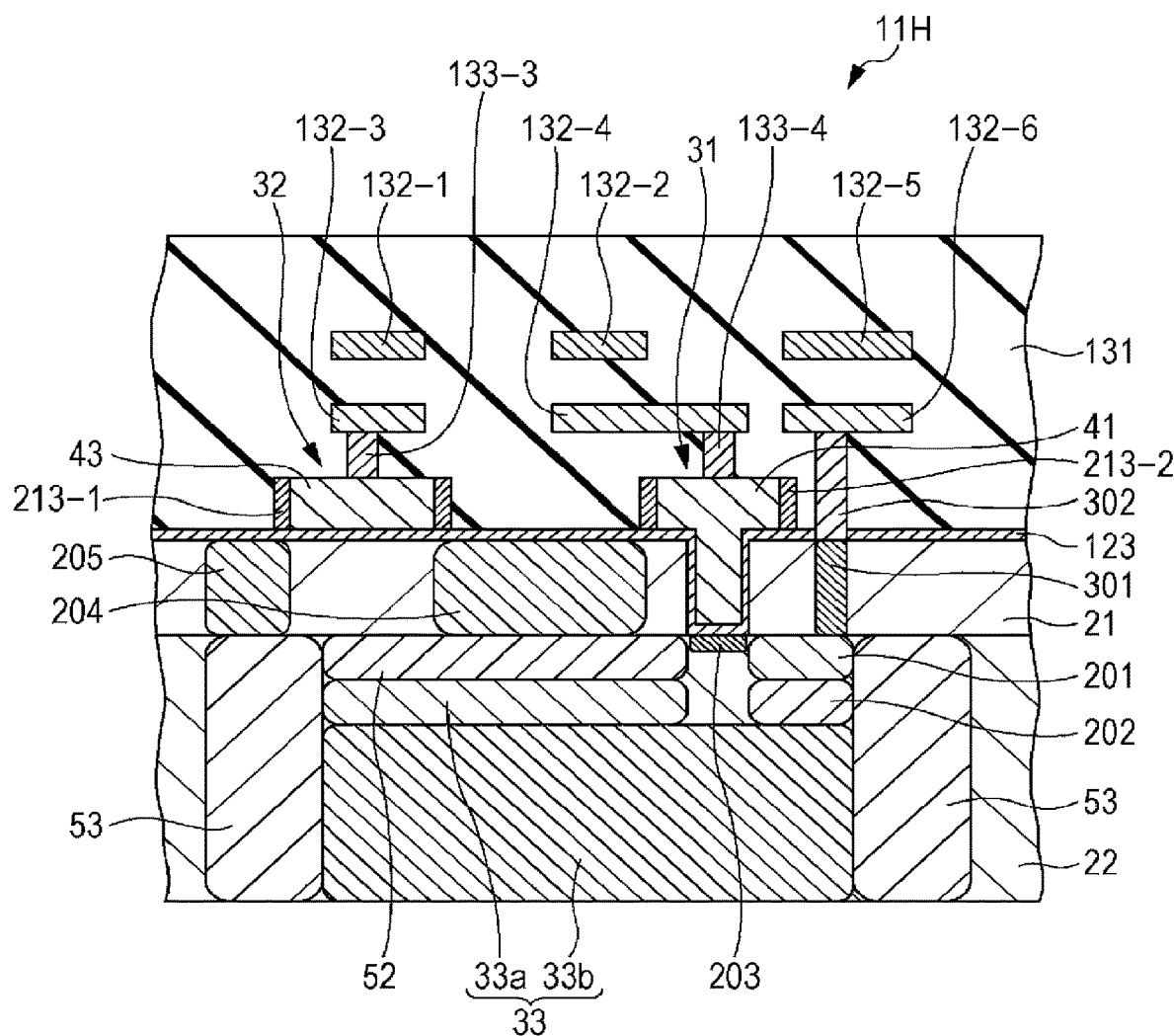
FIG. 45 is a cross-sectional view showing a configuration example of a ninth embodiment of a pixel.

Next, a cross-sectional view showing a configuration example of the pixel 11H which is a modification example (ninth embodiment) of the pixel 11G in FIG. 23 is shown in FIG. 45. Moreover, in the pixel 11H in FIG. 45, configurations shared with the pixel 11O in FIG. 23 are given the same reference numbers, and detailed description thereof will not be made.

The pixel 11H has a configuration differing from the pixel 11O in FIG. 23 on the point of the N-type region 301 formed on the P-type epitaxial layer 21 and the contact portion 302 formed on the wiring layer 131 being used in order to raise a charge from the N-type region 201 functioning as an FD portion. That is, the N-type region 301 is formed so as to extend in the depth direction of the P-type epitaxial layer 21 so as to connect to the N-type region 201 by penetrating the P-type epitaxial layer 21, and the contact portion 302 is formed so as to connect the N-type region 301 and the wiring 132-6.

The pixel 11H configured in this way is able to improve the amount of saturation charge and the sensitivity characteristics of the photodiode 33, similarly to the pixel 11G in FIG. 23.

Next, an example of a method of manufacturing the solid-state imaging device 1 having the pixel 11H will be described with reference to FIG. 46 to FIG. 49.

For example, in the manufacturing step of the pixel 11H, processing is performed from the twenty-first step (FIG. 25) to the thirtieth step (FIG. 36) described above in the same manner as the pixel 11G, and the processing below is performed before the activation annealing in the thirtieth step is performed.

Figure 46:
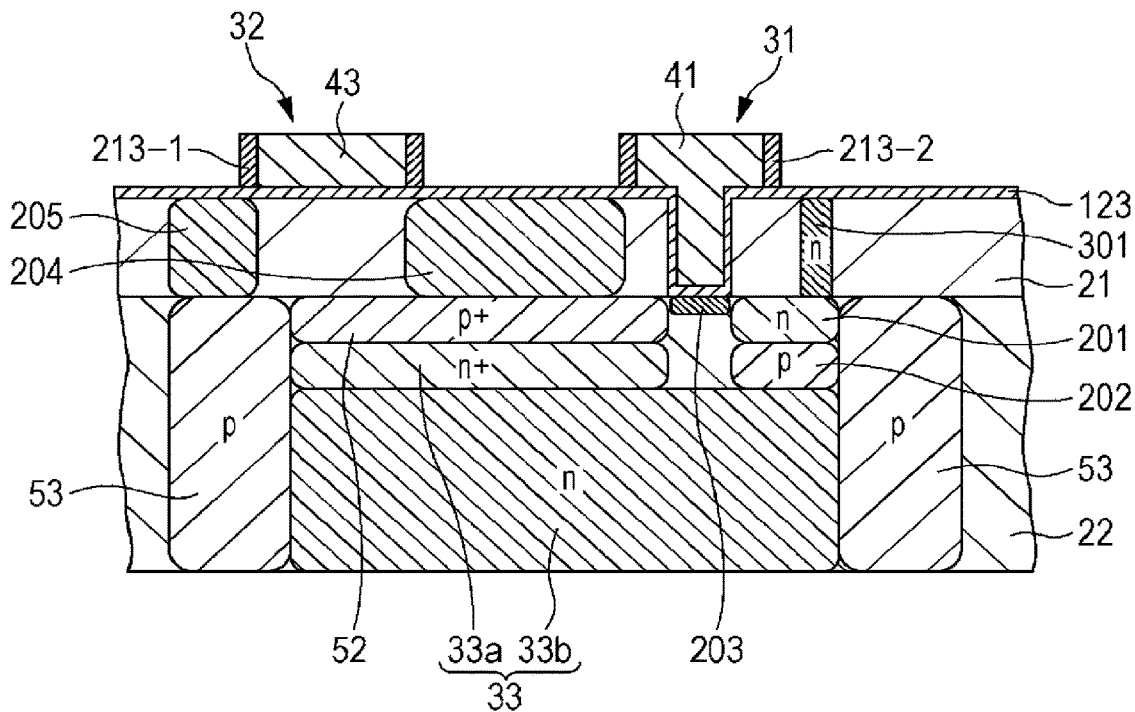
FIG. 46 is a cross-sectional view describing a forty-first step.

As shown in FIG. 46, in the forty-first step, the N-type region 301 is formed up to the surface of the P-type epitaxial layer 21 by injecting n-type impurities to the P-type epitaxial layer 21 in multiple stages, so as to connect to the N-type region 201 so as to extend in the depth direction of the P-type epitaxial layer 21.

Figure 47:
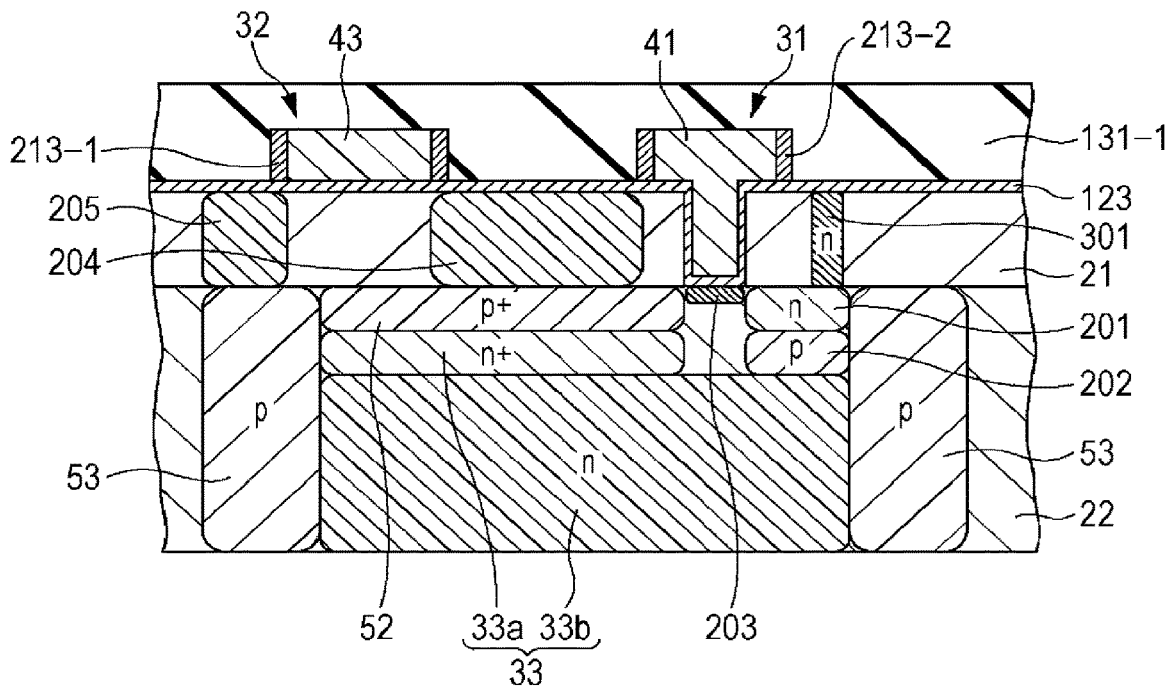
FIG. 47 is a cross-sectional view describing a forty-second step.

As shown in FIG. 47, in the forty-second step, an interlayer 131-1 configuring the wiring layer 131 is formed.

Figure 48:
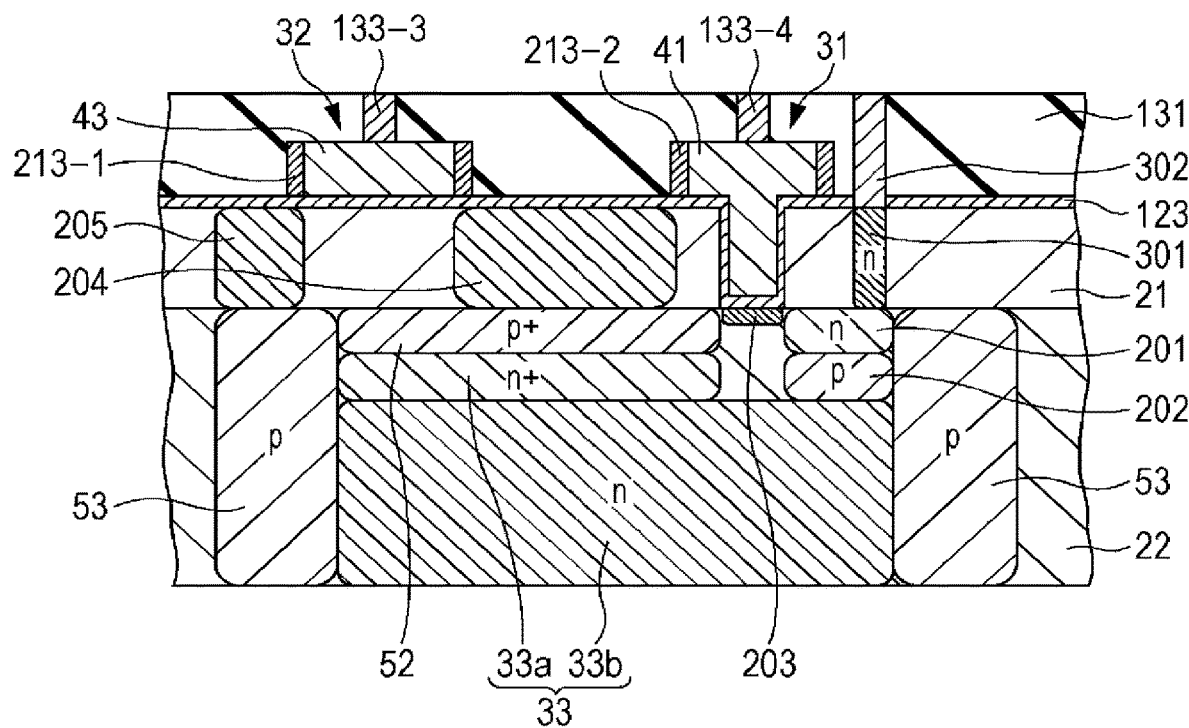
FIG. 48 is a cross-sectional view describing a party-third step.

As shown in FIG. 48, in the forty-third step, an opening portion is formed in the same manner as the thirty-second step described above, and the contact portion 133-3, the contact portion 133-4 and the contact portion 302 are formed in the same manner as the thirty-fifth step described above. At this time, because the opening portion for forming the contact portion 302 is formed such that the P-type epitaxial layer 21 is not excavated, it is possible to form the side face of the contact portion 302 so as not to contact the P-type epitaxial layer 21, and the step forming the insulating film on the opening portion becomes unnecessary.

Figure 49:
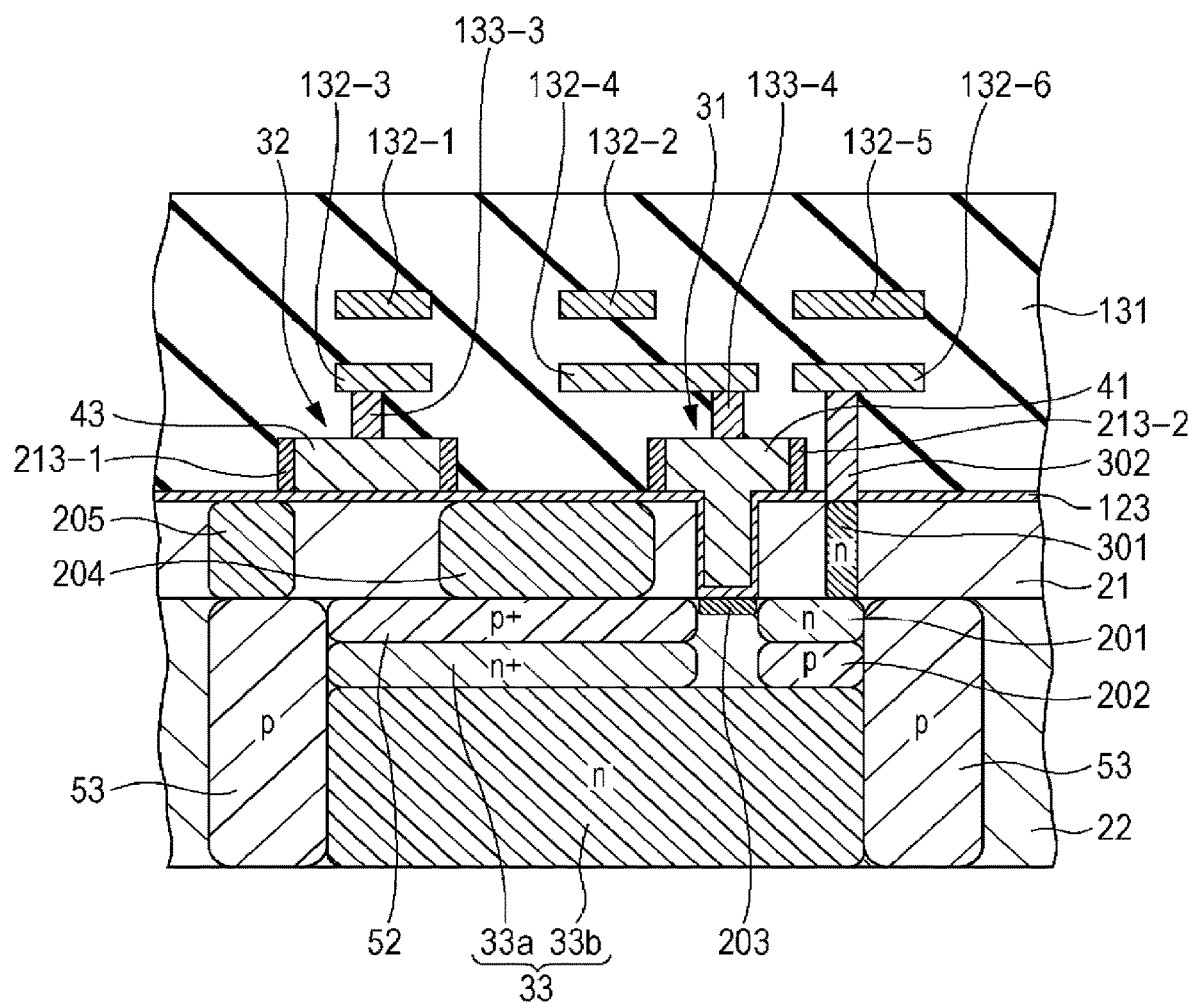
FIG. 49 is a cross-sectional view describing a forty-fourth step.

As shown in FIG. 49, in the forty-fourth step, a wiring layer 131 formed of a multi-layer wiring layer is formed in the same manner to the thirty-sixth step. Subsequently, a step is performed in which an anti-reflection film 23, a light blocking metal 56, a color filter layer 24 and an on-chip lens 25 are formed.

It is possible to manufacture a solid-state imaging device 1 having the pixel 11H by a method of manufacturing with the above-described steps.

Figure 50:
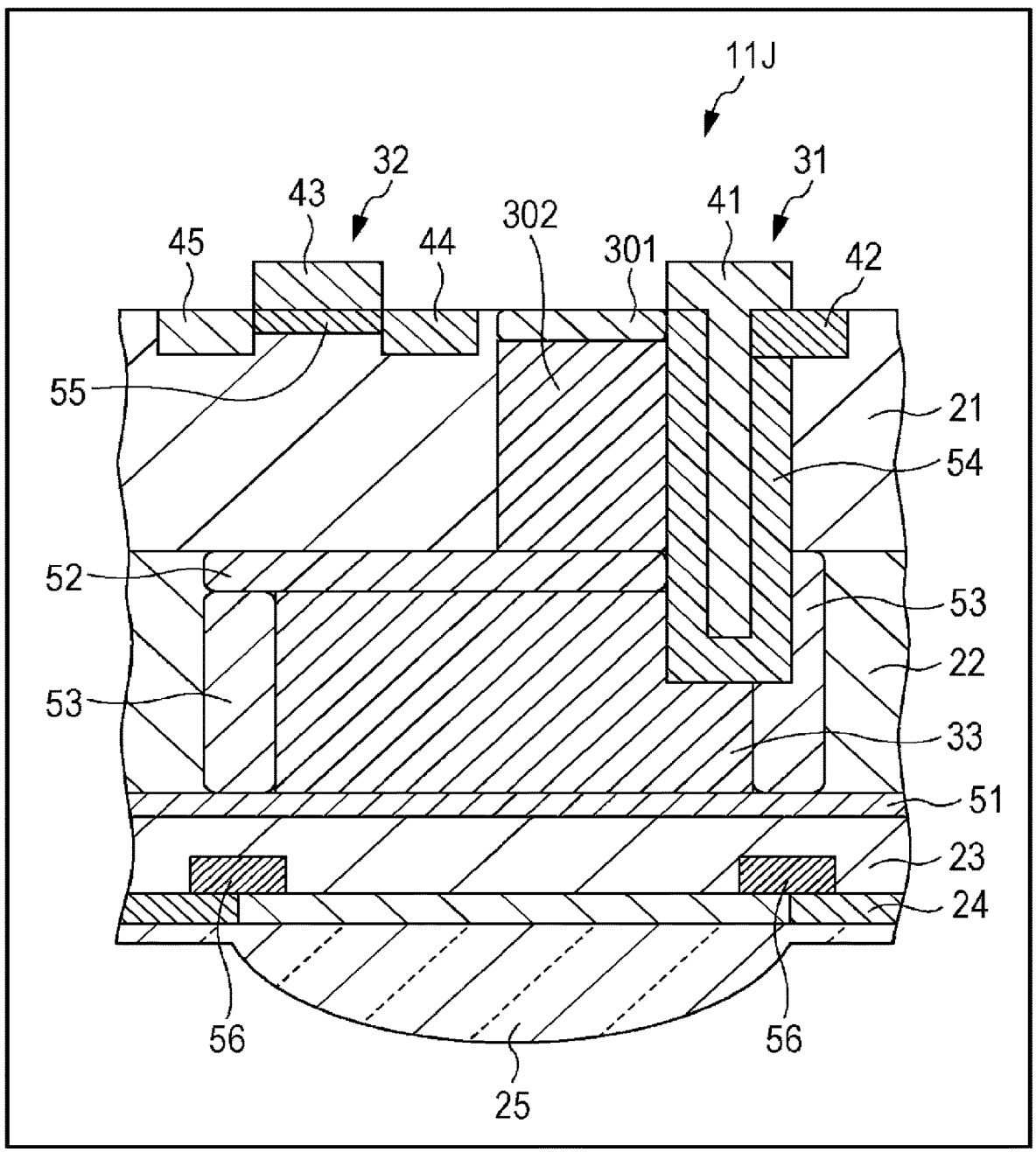
FIG. 50 is a cross-sectional view showing a configuration example of a tenth embodiment of a pixel.

Next, a cross-sectional view showing a configuration example of a tenth embodiment of a pixel 11 is shown in FIG. 50.

For example, as shown in FIG. 50, the pixel 11J has a configuration shared with the pixel 11 in FIG. 4 on the point of a photodiode 33 being formed on a silicon substrate 22 and the pixel transistor 32 being formed on the P-type epitaxial layer 21. However, the pixel 11J has a configuration differing from the pixel 11 in FIG. 4 on the point of a photodiode 302 and a surface pinning layer 301 being formed on the P-type epitaxial layer 21.

That is, in the pixel 11J the photodiode 302 performing photoelectric conversion is formed on the P-type epitaxial layer 21 after the photodiode 33 is formed on the silicon substrate 22 and the P-type epitaxial layer 21 is formed on the silicon substrate 22. In addition, the photodiode 302 is formed so as to neighbor the gate electrode 41 of the transfer transistor 31 via the channel region 54, and the charge generated by the photodiode 302 is transferred via the transfer transistor 31, similarly to the charge of the photodiode 33.

In this way, in the pixel 11J, by providing a photodiode 302 on the P-type epitaxial layer 21 in addition to the photodiode 33 of the silicon substrate 22, it is possible to perform photoelectric conversion by the photodiode 33 and the photodiode 302, and accumulate a charge. In so doing, it is possible to increase the amount of saturation charge for the pixel 11J as a whole, and to improve the sensitivity characteristics.

Figure 51:
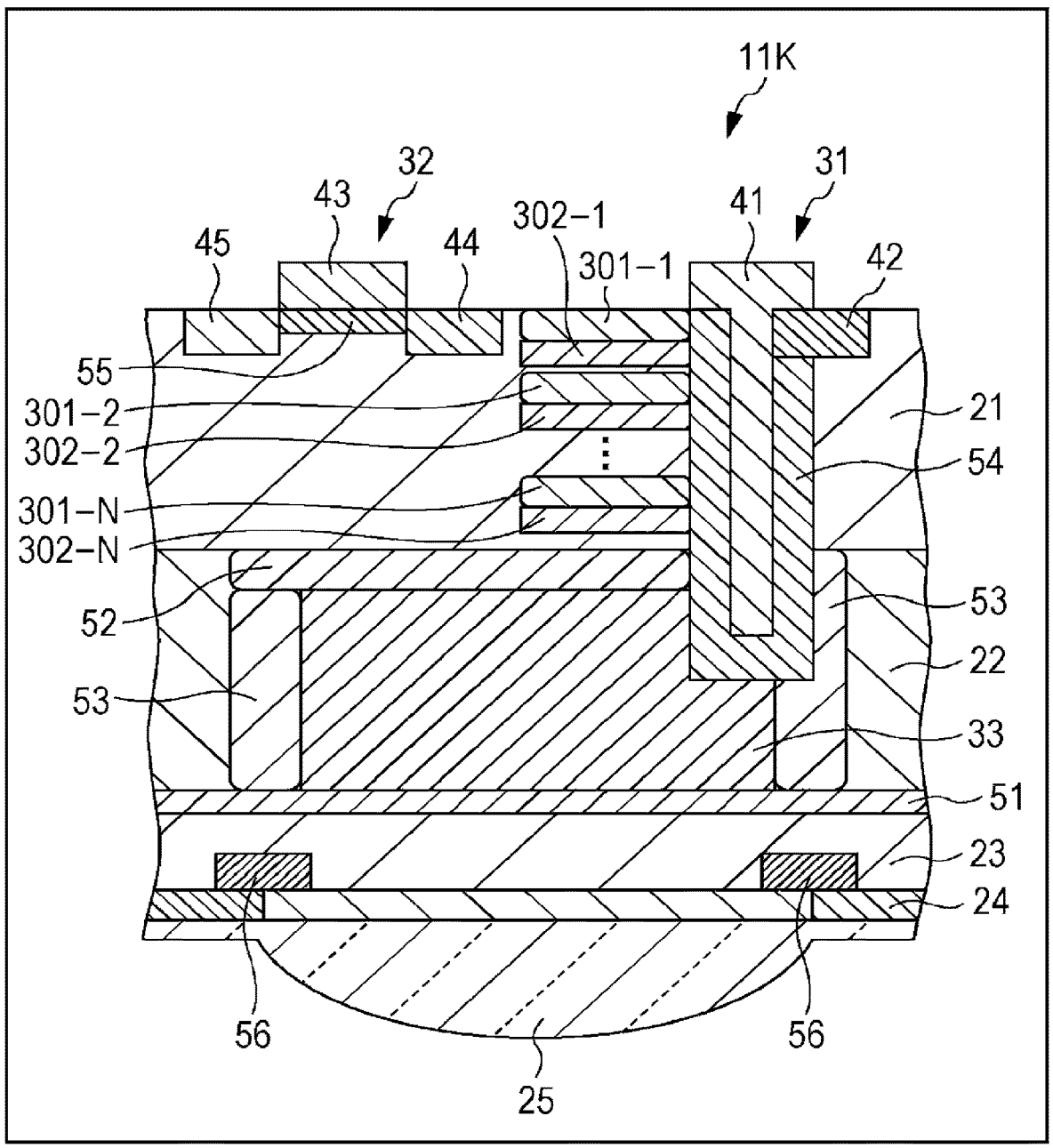
FIG. 51 is a cross-sectional view showing a configuration example of an eleventh embodiment of a pixel.

Next, a cross-sectional view showing a configuration example of the pixel 11K which is a configuration example (eleventh embodiment) of the pixel 11J in FIG. 50 is shown in FIG. 51.

For example, in contrast to a single photodiode 302 being formed on the P-type epitaxial layer 21 in the pixel 11J in FIG. 50, a plurality of photodiodes 302 is formed so as to be laminated in the depth direction (vertical direction in the diagram) of the P-type epitaxial layer 21 in the pixel 11K. That is, as shown in FIG. 51, in the pixel 11K, photodiodes 302-1 to 302-N and surface pinning layers 301-1 to 301-N laminated on N layers are provided on the P-type epitaxial layer 21.

In this way, for example, the pixel 11K is able to increase the photodiode capacitance (high voltage interface) over that in the pixel 11J, and is able to achieve an increase in the amount of saturation charge, by changing the photodiodes 302-1 to 302-N to multiple stages.

Figure 52:
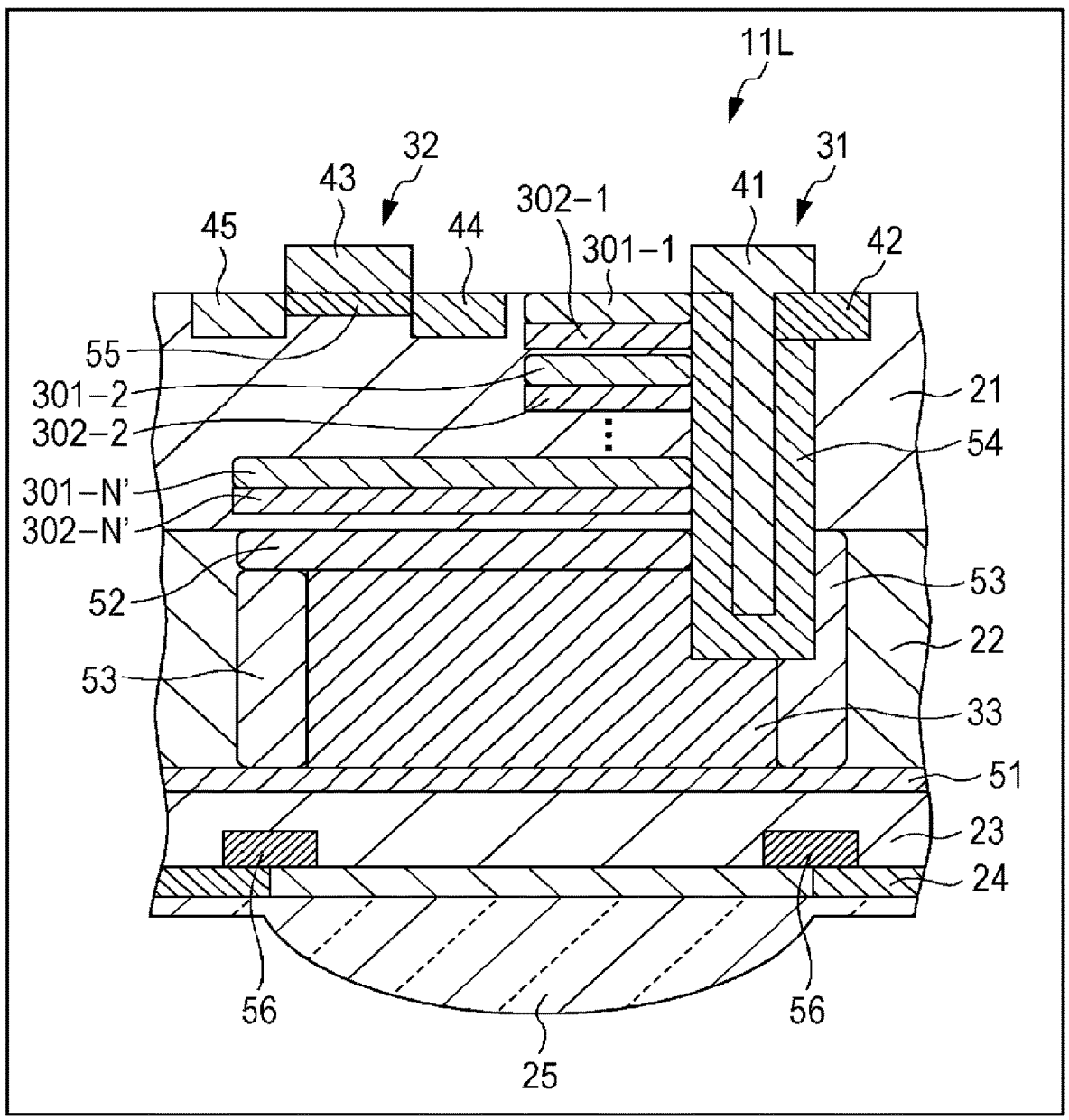
FIG. 52 is a cross-sectional view showing a configuration example of a twelfth embodiment of a pixel.
Figure 53:
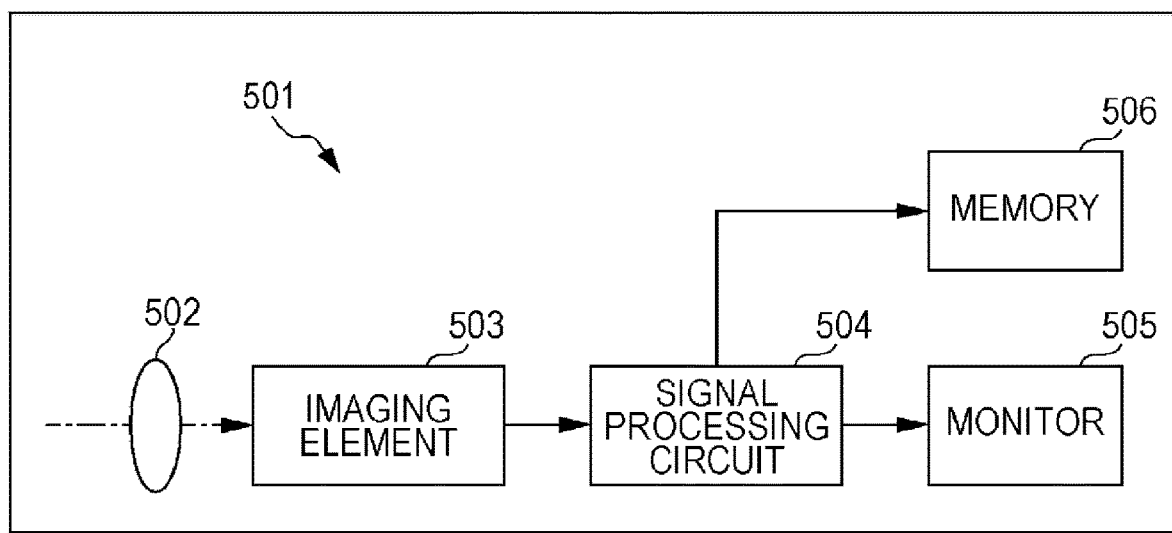
FIG. 53 is a block diagram showing a configuration example of an imaging device mounted in an electronic apparatus.

Next, a cross-sectional view showing a configuration example of the pixel 11K which is a modification example (twelfth embodiment) of the pixel 11L in FIG. 51 is shown in FIG. 52.

For example, in contrast to a plurality of photodiodes 302 with substantially identical areas being formed on the P-type epitaxial layer 21 by being laminated in the pixel. 11K in FIG. 51, as shown in FIG. 52, a portion of the plural layers of photodiodes 302 is formed on the P-type epitaxial layer 21 so as to have different areas in the pixel 11L. In other words, for the pixel 11L, the area of the photodiode 302-N' and surface pinning layer 301-N' of the Nth layer arranged in the vicinity of the silicon substrate 22 and the P-type epitaxial layer 21 is formed wider than the area of the other photodiodes 302 and the surface pinning layer 301.

That is, in the pixel 11L, the area of a portion of the photodiodes 302 arranged in the vicinity of the surface of the P-type epitaxial layer 21 among the plurality of layers of photodiode 302 is formed wider than the area of the other photodiodes 302. At this time, the area of the photodiode 302 formed to be wide is set so as to become the maximum area in a region in which the pixel 11L is formed in a range not infiltrating the region in which the pixel transistor 32 is formed in the P-type epitaxial layer 21. Moreover, in the example of FIG. 52, the one layer of photodiode 302-N' is formed to be wide; however, the present disclosure is not limited to a single layer. That is, it is possible to form the area of a predetermined number of layers of the photodiode 302 in the vicinity of the surface of the P-type epitaxial layer 21 to be wider than the area of the other photodiodes 302. In so doing, it is possible to reduce invalid regions in the P-type epitaxial layer 21, and possible to further achieve an increase in the amount of saturation charge.

Moreover, in the present embodiment, a configuration of a solid-state imaging device 1 in which a P-type epitaxial layer 21 is formed with respect to an n-type silicon substrate 22; however, the opposite configuration, that is, a configuration in which air N-type epitaxial layer is formed with respect to an s-type silicon substrate may be employed.

In addition, the solid-state imaging device 1 as described above, for example, may be applied to various electronic apparatuses, such as the image capture system of a digital still camera or a digital video camera, a mobile telephone including an image capture function, and other devices including an image capturing function.

FIG. 50 is a block diagram showing a configuration example of an imaging device mounted in an electronic apparatus.

As shown in FIG. 50, the image capture device 501 is configured including an optical system 502, an image capture element 503, a signal processing circuit 504, a monitor 505 and a memory 506, and is able to capture still images and moving images.

The optical system 502 is configured to have one or a plurality of lenses, and image light (incident light) from a subject is guided to the image capture element 503, thereby an image is formed on a light receiving face (sensor portion) of the image capture element 503.

The image capture element 503 is applied to the solid-state imaging device 1 having the pixel 11 of each of the above-described configuration examples. In the image capture element 503, electrons are accumulated for a predetermined period according to the image formed on the light receiving face via the optical system 502. Then, a signal according to the electrons accumulated in the image capture element 503 is provided to the signal processing circuit 504.

The signal processing circuit 504 executes various signal processes with respect to the pixel signal output from the image capture element 503. The image (image data) obtained by the signal processing circuit 504 executing signal processing is displayed by being supplied to the monitor 505 or is stored (recorded) by being supplied to the memory 506.

in an image capture device 501 configured in this way, it is possible to improve the amount of saturation charge and the sensitivity characteristics and possible to obtain an image with better image quality by applying the configuration of a solid-state imaging device 1 having the pixel 11 of the various configuration examples described above.

Moreover, the present technology may also adopt the following configurations.

(1) A solid-state imaging device including: a photodiode provided for each pixel, and generating a charge according to an amount of received light by performing photo-electric conversion; a transfer transistor transporting the charge generated by the photodiode; a pixel transistor including a predetermined number of transistors necessary for driving the pixel, other than the transfer transistor; a photodiode region in which the photodiode is formed, and a transistor region which is formed to be separated in the depth direction with respect to the photodiode region, and in which the pixel transistor is formed; in which the transistor region is formed so as to be laminated with respect to the photodiode region, after the photodiode is formed in the photodiode region.

(2) The solid-state imaging device according to (1), in which the transistor region is an epitaxial layer formed by performing epitaxial growth with respect to a surface of a silicon substrate which is the photodiode region, and the pixel transistor is formed on the surface of the epitaxial layer.

(3) The solid-state imaging device according to any one of (1) or (2), in which the transfer transistor is configured including a gate electrode embedded so as to penetrate from the front face side of the transistor region to the photodiode.

(4) The solid-state imaging device according to any one of (1) to (3), in which the transfer transistor is formed on the bottom face of an excavated portion formed by the transistor region being excavated from the front face side of the transistor region until the photodiode region is exposed.

(5) The solid-state imaging device according to any one of (1) to (4), further including a diffusion layer formed up to the vicinity of the surface of the transistor region, and contacting the photodiode of the photodiode region; in which the transfer transistor is formed on the surface of the transistor region so as to transport a charge generated by the photodiode via the diffusion layer.

(6) The solid-state imaging device according to any one of (1) to (5), further including an element separation portion for separating the pixels from neighboring pixels in the transistor region.

(7) The solid-state imaging device according to any one of (1) to (6), further including a first element separation portion for separating the pixels from neighboring pixels in the transistor region, and a second element separation portion for separating the pixels from neighboring pixels in the transistor region with a structure connecting to the first element separation portion.

(8) The solid-state imaging device according to any one of (1) to (7), further including an impurity region with a high impurity concentration arranged between the photodiode region and the transistor region, and formed by performing epitaxial growth.

(9) The solid-state imaging device according to any one of (1) to (8), further including an impurity region for separating the photodiode and the pixel transistors in the transistor region.

(10) The solid-state imaging device according to any one of (1) to (9), in which a floating diffusion portion where charge generated by the photodiode is transferred is formed in the photodiode region, and the transfer transistor is configured to include a gate electrode embedded in the transistor region.

(11) The Aid-state imaging device according to any one of 1) to (10), further including a contact portion formed by a conductor embedded in the transistor region so as to connect to the floating diffusion portion by penetrating the transistor region.

(12) The solid-state imaging device according to any one of (1) to (11), further including an impurity region formed so as to connect to the floating diffusion portion by penetrating the transistor region, and so as to extend in the depth direction of the transistor region.

(13) The solid-state imaging device according to any one of (1) to (12), in which a second photodiode generating a charge according to the amount of received light by performing photoelectric conversion is formed in the transistor region.

(14) The solid-state imaging device according to (13), in which a plurality of second photodiodes is formed so as to be laminated in the depth direction of the transistor region.

(15) The solid-state imaging device according to (14), in which among the plurality of second photodiodes, a portion of the second photodiodes arranged in the vicinity of the interface of the transistor region and the photodiode region is formed with a wider area than that of the other second photodiodes.

<1> A solid-state imaging device, including: a silicon substrate; at least a first photodiode, wherein the first photodiode is formed in the silicon substrate; an epitaxial layer, wherein a first surface of the epitaxial layer is adjacent a surface of the silicon substrate; a transfer transistor, wherein a gate electrode of the transfer transistor extends from the at least a first photodiode to a second surface of the epitaxial layer opposite the first surface.

<2> The solid-state imaging device of <1>, further including: a floating diffusion, wherein the floating diffusion is formed in the epitaxial layer and is in electrical contact with the gate electrode of the transfer transistor.

<3> The solid-state imaging device of <1> or <2>, further including: a plurality of pixel transistors, wherein the plurality of pixel transistors are formed on the epitaxial layer.

<4> The solid-state imaging device of <3>, wherein the plurality of pixel transistors overlay at least a portion of the silicon substrate in which the at least a first photodiode is formed.

<5> The solid-state imaging device of any one of <1> to <4>, further including: a second photo diode, wherein the second photodiode is formed in the epitaxial layer.

<6> The solid-state imaging device of <5>, wherein the second photodiode is in electrical contact with the gate electrode of the transfer transistor.

<7> The solid-state imaging device of any one of <1> to <6>, further including: a plurality of photodiodes formed in the epitaxial layer.

<8> The solid-state imaging device of <7>, wherein the first photodiode and the photodiodes formed in the epitaxial layer are in electrical contact with the gate electrode of the transfer transistor.

<9> The solid-state imaging device of <8>, further including: a plurality of pinning layers, wherein the plurality of photodiodes formed in the epitaxial layer are laminated in a depth direction with the plurality of pinning layers.

<10> The solid-state imaging device of <9>, wherein an area of at least one of the plurality of epitaxial layers formed in the epitaxial layer has an area in a plane parallel to the first surface of the epitaxial layer that is different than at least one of the other of the plurality of photodiodes formed in the epitaxial layer.

<11> The solid state imaging device of <10>, wherein the photodiodes formed in the epitaxial layer overlay at least a portion of the photodiode formed in the silicon substrate.

<12> The solid state imaging device of <11>, further including: a floating diffusion, wherein at least a portion of the floating diffusion overlays at least a portion of the first photodiode.

<13> The solid state imaging device of <12>, further including: a plurality of pixel transistors, wherein the plurality of pixel transistors are formed on the epitaxial layer and overlay at least a portion of the first photodiode.

<14> A solid-state imaging device, including: a plurality of pixels, wherein each pixel in the plurality of pixels is formed in a semiconductor substrate, and wherein the pixels are symmetrical with respect to a center point; an epitaxial layer on the semiconductor substrate; a floating diffusion, wherein the floating diffusion is formed in the epitaxial layer; a plurality of transfer gate electrodes, wherein each of the pixels is electrically connected to the floating diffusion by one of the transfer gate electrodes.

<15> The solid-state imaging device of <14>, wherein the plurality of pixels are arranged symmetrically about the floating diffusion.

<16> The solid-state imaging device of <15>, further including: a plurality of pixel transistors, wherein the pixel transistors are formed in the epitaxial layer.

<17> The solid-state imaging device of <15> or <16>, wherein the plurality of transfer gate electrodes are arranged symmetrically about the floating diffusion.

<18> A method of producing a solid-state imaging device, including: forming a photodiode in a silicon substrate; forming an epitaxial layer on the silicon substrate; forming an excavated portion by excavating from a surface of the epitaxial layer to the silicon substrate, wherein the excavated portion reaches a P-well surrounding N-type regions of the photodiode; forming a gate electrode by forming a gate oxide film on an inside surface of the excavated portion.

<19> An electronic apparatus, including: an optical system; an image capture element including a solid-state imaging device, wherein the solid-state imaging device receives light from the optical system, the solid-state imaging device including an on chip lens; an antireflection film; a silicon substrate, wherein the antireflection film is connected to a first surface of the silicon substrate, and wherein the on chip lens is separated from the first surface of the silicon substrate by at least the antireflection film; at least a first photodiode, wherein the first photodiode is formed in the silicon substrate; an epitaxial layer, wherein a first surface of the epitaxial layer is adjacent a surface of the silicon substrate; a transfer transistor, wherein a gate electrode of the transfer transistor extends from the at least a first photodiode to a second surface of the epitaxial layer opposite the first surface; a signal processing circuit, wherein the signal processing circuit receives a signal from the image capture element.

<20> An electronic apparatus, including: an optical system; an image capture element including a solid-state imaging device, wherein the solid-state imaging device receives light from the optical system, the solid-state imaging device including: a plurality of pixels, wherein each of the plurality of pixels is formed in a semiconductor substrate, wherein the pixels are symmetrical with respect to a center point; an epitaxial layer on the semiconductor substrate; a floating diffusion, wherein the floating diffusion is formed in the epitaxial layer; a plurality of transfer gate electrodes, wherein each of the pixels is electrically connected to the floating diffusion by one of the transfer gate electrodes; a signal processing circuit, wherein the signal processing circuit receives a signal from the image capture element.

Moreover, the present embodiments are not limited to the above-described embodiments, and various modifications are possible in a range not departing from the gist of the present disclosure.

REFERENCE SIGNS LIST 1 solid-state imaging device
2 pixel transistor region
3 photodiode region
11 pixel
12 shared pixel
21 P-type epitaxial layer
22 silicon substrate
23 anti-reflection film
24 color filter layer
25 on-chip lens
31 transfer transistor
32 pixel transistor
33 photodiode
41 gate electrode
42 N-type region
43 gate electrode
44, 45 N-type region

What is claimed:

1. An imaging device, comprising:
   a first semiconductor layer having a first surface and a second surface opposite to the first surface, the first surface being a light incident side of the first semiconductor layer;
   a photoelectric conversion region including a p-n junction disposed in the first semiconductor layer;
   a first transistor including a first doped region, a second doped region, and a gate structure having a gate electrode, the first doped region and the second doped region of the first transistor being disposed at the second surface of the first semiconductor layer on opposite sides of the gate structure of the first transistor, wherein a channel region of the first transistor exists at the second surface of the first semiconductor layer between the first doped region and the second doped region of the first transistor;
   a second semiconductor layer on the first semiconductor layer and having a third surface and a fourth surface opposite to the third surface, the third surface of the second semiconductor layer facing the second surface of the first semiconductor layer; and
   a second transistor including a source, a drain, and a gate structure having a gate electrode, the source and drain of the second transistor being disposed at the fourth surface of the second semiconductor layer on opposite sides of the gate structure of the second transistor, wherein a channel region of the second transistor exists at the fourth surface of the second semiconductor layer between the source and the drain of the second transistor,
   wherein the gate structure of the first transistor includes a first face and a second face opposite the first face, the first face of the gate structure of the first transistor being coplanar with the third surface of the second semiconductor layer.

2. The imaging device according to claim 1, wherein the first transistor is a transfer transistor, and wherein the gate structure of the second transistor includes a first face and a second face opposite the first face, the second face of the gate structure of the second transistor being on the fourth surface of the second semiconductor layer.

3. The imaging device according to claim 1, wherein the second transistor is an amplification transistor.

4. The imaging device according to claim 1, wherein the gate electrode of the first transistor is disposed on the second surface of the first semiconductor layer.

5. The imaging device according to claim 1, wherein the gate electrode of the second transistor is disposed on the fourth surface of the second semiconductor layer.

6. The imaging device according to claim 1, wherein the second semiconductor layer has a p-type conductivity.

7. The imaging device according to claim 1, further comprising first and second semiconductor regions with a p-type conductivity disposed on respective sides of the photoelectric conversion region in a cross-sectional view.

8. The imaging device according to claim 1, further comprising an anti-reflection film disposed below the first surface of the first semiconductor layer.

9. The imaging device according to claim 1, wherein the gate electrode of the first transistor is disposed on the second surface of the first semiconductor layer, and
   wherein the gate electrode of the second transistor is disposed on the fourth surface of the second semiconductor layer.

10. The imaging device of claim 2, wherein the second face of the gate structure of the first transistor is disposed closer to the first surface of the first semiconductor layer than the first face of the gate structure of the second electrode.

11. An electronic apparatus, comprising:
    an optical system;
    a signal processing circuit; and
    an imaging device, comprising:
        a first semiconductor layer having a first surface and a second surface opposite to the first surface, the first surface being a light incident side of the first semiconductor layer;
        a photoelectric conversion region including a p-n junction disposed in the first semiconductor layer;
        a first transistor including a first doped region, a second doped region, and a gate structure having a gate electrode, the first doped region and the second doped region of the first transistor being disposed at the second surface of the first semiconductor layer on opposite sides of the gate structure of the first transistor, wherein a channel region of the first transistor exists at the second surface of the first semiconductor layer between the first doped region and the second doped region of the first transistor;
        a second semiconductor layer on the first semiconductor layer and having a third surface and a fourth surface opposite to the third surface, the third surface of the second semiconductor layer facing the second surface of the first semiconductor layer; and
        a second transistor including a source, a drain, and a gate structure having a gate electrode, the source and the drain of the second transistor being disposed at the fourth surface of the second semiconductor layer on opposite sides of the gate structure of the second transistor, wherein a channel region of the second transistor exists at the fourth surface of the second semiconductor layer between the source and the drain of the second transistor,
    wherein the gate structure of the first transistor includes a first face and a second face opposite the first face, the first face of the gate structure of the first transistor being coplanar with the third surface of the second semiconductor layer.

* * * * *